US011545204B1

(12) United States Patent
Dokania et al.

(10) Patent No.: US 11,545,204 B1
(45) Date of Patent: Jan. 3, 2023

(54) NON-LINEAR POLAR MATERIAL BASED MEMORY BIT-CELL WITH MULTI-LEVEL STORAGE BY APPLYING DIFFERENT VOLTAGE LEVELS

(71) Applicant: Kepler Computing Inc., San Francisco, CA (US)

(72) Inventors: Rajeev Kumar Dokania, Beaverton, OR (US); Noriyuki Sato, Hillsboro, OR (US); Tanay Gosavi, Portland, OR (US); Pratyush Pandey, Kensington, CA (US); Debo Olaosebikan, San Francisco, CA (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 10 days.

(21) Appl. No.: 17/367,083

(22) Filed: Jul. 2, 2021

Related U.S. Application Data

(63) Continuation of application No. 17/339,850, filed on Jun. 4, 2021.

(51) Int. Cl.
*G11C 11/22* (2006.01)
*G11C 11/417* (2006.01)

(52) U.S. Cl.
CPC ........ *G11C 11/221* (2013.01); *G11C 11/2255* (2013.01); *G11C 11/2257* (2013.01); *G11C 11/2293* (2013.01); *G11C 11/417* (2013.01)

(58) Field of Classification Search
CPC .............. G11C 11/221; G11C 11/2255; G11C 11/2257; G11C 11/2293
See application file for complete search history.

(56) References Cited

U.S. PATENT DOCUMENTS

| 4,809,225 A | 2/1989 | Dimmler et al. |
| 4,853,893 A | 8/1989 | Eaton, Jr. et al. |

(Continued)

FOREIGN PATENT DOCUMENTS

| EP | 0798736 A2 | 10/1997 |
| JP | H10255484 A | 9/1998 |

(Continued)

OTHER PUBLICATIONS

1st Taiwan Office Action notified Mar. 3, 2022 for Taiwan Patent Application No. 110129115.

(Continued)

*Primary Examiner* — Han Yang
(74) *Attorney, Agent, or Firm* — Mughal IP P.C.

(57) ABSTRACT

A high-density low voltage ferroelectric (or paraelectric) memory bit-cell that includes a planar ferroelectric or paraelectric capacitor. The memory bit-cell comprises 1T1C configuration, where a plate-line is parallel to a word-line, or the plate-line is parallel to a bit-line. The memory bit-cell can be 1TnC, where 'n' is a number. In a 1TnC bit-cell, the capacitors are vertically stacked allowing for multiple values to be stored in a single bit-cell. The memory bit-cell can be multi-element FE gain bit-cell. In a multi-element FE gain bit-cell, data sensing is done with signal amplified by a gain transistor in the bit-cell. As such, higher storage density is realized using multi-element FE gain bit-cells. In some examples, the 1T1C, 1TnC, and multi-element FE gain bit-cells are multi-level bit-cells. To realize multi-level bit-cells, the capacitor is placed in a partially switched polarization state by applying different voltage levels or different time pulse widths at the same voltage level.

20 Claims, 38 Drawing Sheets

(56) References Cited

U.S. PATENT DOCUMENTS

| | | |
|---|---|---|
| 5,086,412 A | 2/1992 | Jaffe et al. |
| 5,218,566 A | 6/1993 | Papaliolios |
| 5,270,967 A | 12/1993 | Moazzami et al. |
| 5,381,364 A | 1/1995 | Chern et al. |
| 5,383,150 A | 1/1995 | Nakamura et al. |
| 5,539,279 A | 7/1996 | Takeuchi et al. |
| 5,541,872 A | 7/1996 | Lowrey et al. |
| 5,638,318 A | 6/1997 | Seyyedy |
| 5,640,030 A | 6/1997 | Kenney |
| 5,760,432 A | 6/1998 | Abe et al. |
| 5,917,746 A | 6/1999 | Seyyedy |
| 5,926,413 A | 7/1999 | Yamada et al. |
| 5,969,380 A | 10/1999 | Seyyedy |
| 6,002,608 A | 12/1999 | Tanabe |
| 6,028,784 A | 2/2000 | Mori et al. |
| 6,031,754 A | 2/2000 | Derbenwick et al. |
| 6,043,526 A | 3/2000 | Ochiai |
| 6,147,895 A | 11/2000 | Kamp |
| 6,346,741 B1 | 2/2002 | Buskirk et al. |
| 6,358,810 B1 | 3/2002 | Dornfest et al. |
| 6,388,281 B1 | 5/2002 | Jung et al. |
| 6,483,737 B2 | 11/2002 | Takeuchi et al. |
| 6,500,678 B1 | 12/2002 | Aggarwal et al. |
| 6,515,957 B1 | 2/2003 | Newns et al. |
| 6,538,914 B1 | 3/2003 | Chung |
| 6,548,343 B1 | 4/2003 | Summerfelt et al. |
| 6,587,367 B1 | 7/2003 | Nishimura et al. |
| 6,590,245 B2 | 7/2003 | Ashikaga |
| 6,610,549 B1 | 8/2003 | Aggarwal et al. |
| 6,643,163 B2 | 11/2003 | Takashima |
| 6,646,906 B2 | 11/2003 | Sailing |
| 6,656,301 B2 | 12/2003 | Kirby |
| 6,656,748 B2 | 12/2003 | Hall et al. |
| 6,713,342 B2 | 3/2004 | Celii et al. |
| 6,717,838 B2 | 4/2004 | Hosoi |
| 6,720,600 B2 | 4/2004 | Okita |
| 6,728,128 B2 | 4/2004 | Nishimura et al. |
| 6,734,477 B2 | 5/2004 | Moise et al. |
| 6,795,331 B2 | 9/2004 | Noro |
| 6,798,686 B2 | 9/2004 | Takashima |
| 6,809,949 B2 | 10/2004 | Ho |
| 6,819,584 B2 | 11/2004 | Noh |
| 6,856,534 B2 | 2/2005 | Rodriguez et al. |
| 6,906,944 B2 | 6/2005 | Takeuchi et al. |
| 6,924,997 B2 | 8/2005 | Chen et al. |
| 7,029,925 B2 | 4/2006 | Celii et al. |
| 7,173,844 B2 | 2/2007 | Lee et al. |
| 7,405,959 B2 | 7/2008 | Koide et al. |
| 7,426,130 B2 | 9/2008 | Jeon |
| 7,514,734 B2 | 4/2009 | Aggarwal et al. |
| 7,642,099 B2 | 1/2010 | Fukada et al. |
| 7,791,922 B2 | 9/2010 | Doumae et al. |
| 7,812,385 B2 | 10/2010 | Noda |
| 8,129,200 B2 | 3/2012 | Kang |
| 8,177,995 B2 | 5/2012 | Kobayashi et al. |
| 8,300,446 B2 | 10/2012 | Qidwai |
| 8,441,833 B2 | 5/2013 | Summerfelt et al. |
| 8,508,974 B2 | 8/2013 | Clinton et al. |
| 8,665,628 B2 | 3/2014 | Kawashima |
| 8,717,800 B2 | 5/2014 | Clinton et al. |
| 8,865,628 B2 | 10/2014 | Manabe et al. |
| 9,472,560 B2 | 10/2016 | Ramaswamy et al. |
| 9,786,348 B1 | 10/2017 | Kawamura et al. |
| 9,812,204 B1 | 11/2017 | Yan et al. |
| 9,818,468 B2 | 11/2017 | Müller |
| 9,830,969 B2 | 11/2017 | Slesazeck et al. |
| 10,043,567 B2 | 8/2018 | Slesazeck et al. |
| 10,354,712 B2 | 7/2019 | Derner et al. |
| 10,600,808 B2 | 3/2020 | Schröder |
| 10,872,905 B2 | 12/2020 | Muller |
| 10,963,776 B2 | 3/2021 | Mulaosmanovic et al. |
| 11,423,967 B1 | 8/2022 | Dokania et al. |
| 2002/0079520 A1 | 6/2002 | Nishihara et al. |
| 2002/0125517 A1 | 9/2002 | Nakamura |
| 2002/0153550 A1 | 10/2002 | An et al. |
| 2003/0119211 A1 | 6/2003 | Summerfelt et al. |
| 2003/0129847 A1 | 7/2003 | Celii et al. |
| 2003/0141528 A1 | 7/2003 | Ito |
| 2004/0027873 A1 | 2/2004 | Nishihara |
| 2004/0104754 A1 | 6/2004 | Bruchhaus et al. |
| 2004/0129961 A1 | 7/2004 | Araujo et al. |
| 2004/0233696 A1* | 11/2004 | Kang ............... G11C 11/22 365/145 |
| 2004/0245547 A1 | 12/2004 | Stipe |
| 2005/0012126 A1 | 1/2005 | Udayakumar et al. |
| 2005/0214954 A1 | 9/2005 | Maruyama et al. |
| 2005/0230725 A1 | 10/2005 | Aggarwal et al. |
| 2005/0244988 A1 | 11/2005 | Wang et al. |
| 2006/0001070 A1 | 1/2006 | Park et al. |
| 2006/0006447 A1 | 1/2006 | Kim et al. |
| 2006/0073613 A1 | 4/2006 | Aggarwal et al. |
| 2006/0073614 A1 | 4/2006 | Hara |
| 2006/0134808 A1 | 6/2006 | Summerfelt et al. |
| 2006/0258113 A1 | 11/2006 | Sandhu et al. |
| 2007/0298521 A1 | 12/2007 | Obeng et al. |
| 2008/0073680 A1 | 3/2008 | Wang |
| 2008/0081380 A1 | 4/2008 | Celii et al. |
| 2008/0101107 A1 | 5/2008 | Shiga et al. |
| 2008/0107885 A1 | 5/2008 | Alpay et al. |
| 2008/0191252 A1 | 8/2008 | Nakamura et al. |
| 2009/0003042 A1 | 1/2009 | Lee et al. |
| 2012/0127776 A1 | 5/2012 | Kawashima |
| 2012/0134196 A1 | 5/2012 | Evans, Jr. et al. |
| 2012/0307545 A1 | 12/2012 | McAdams et al. |
| 2012/0313218 A1 | 12/2012 | Fujimori et al. |
| 2013/0147295 A1 | 6/2013 | Shimizu |
| 2014/0208041 A1 | 7/2014 | Hyde et al. |
| 2015/0069481 A1 | 3/2015 | Sun et al. |
| 2015/0294702 A1 | 10/2015 | Lee et al. |
| 2017/0345831 A1 | 11/2017 | Chavan et al. |
| 2018/0082981 A1 | 3/2018 | Gowda |
| 2018/0226418 A1 | 8/2018 | Morandi et al. |
| 2018/0286987 A1 | 10/2018 | Lee et al. |
| 2018/0323309 A1 | 11/2018 | Ando et al. |
| 2019/0051642 A1 | 2/2019 | Hyde et al. |
| 2019/0051815 A1 | 2/2019 | Kakinuma et al. |
| 2019/0115353 A1 | 4/2019 | O'Brien et al. |
| 2019/0138893 A1 | 5/2019 | Sharma et al. |
| 2020/0004583 A1 | 1/2020 | Kelly et al. |
| 2020/0051607 A1 | 2/2020 | Pan et al. |
| 2020/0273867 A1 | 8/2020 | Manipatruni et al. |
| 2020/0357453 A1 | 11/2020 | Slesazeck et al. |
| 2021/0090662 A1 | 3/2021 | Mennenga et al. |
| 2021/0111179 A1 | 4/2021 | Shivaraman et al. |
| 2021/0398580 A1 | 12/2021 | Yuh |

FOREIGN PATENT DOCUMENTS

| | | |
|---|---|---|
| JP | 2003123465 A | 4/2003 |
| JP | 2005057103 A | 3/2005 |
| JP | 2006164321 A | 6/2006 |
| JP | 3959341 B2 | 8/2007 |
| TW | 200718237 A | 5/2007 |
| TW | 200919705 A | 5/2009 |
| TW | 200935151 A | 8/2009 |
| TW | 201227879 A | 7/2012 |
| TW | 201725736 A | 7/2017 |
| WO | 20130147295 | 10/2013 |
| WO | 2013147295 A4 | 7/2014 |
| WO | 2015167887 A1 | 11/2015 |
| WO | 2021112247 A1 | 6/2021 |

OTHER PUBLICATIONS

Non-Final Office Action notified Jan. 18, 2022 for U.S. Appl. No. 16/287,953.

Non-Final Office Action notified Jan. 19, 2022 for U.S. Appl. No. 16/288,006.

Non-Final Office Action notified Mar. 7, 2022 for U.S. Appl. No. 17/339,850.

Non-Final Office Action notified Mar. 30, 2022 for U.S. Appl. No. 17/346,083.

(56) References Cited

OTHER PUBLICATIONS

Non-Final Office Action notified Mar. 31, 2022 for U.S. Appl. No. 17/346,087.
1st Office Action notified Dec. 11, 2020 for Taiwan Patent Application No. 109106095.
Chandler, T. "An adaptive reference generation scheme for 1T1C FeRAMs", 2003 Symposium on VLSI Circuits. Digest of Technical Papers (IEEE Cat. No.03CH37408), Kyoto, Japan, 2003, pp. 173-174.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/018879.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., "Highly manufacturable 1T1C 4 Mb FRAM with novel sensing scheme," International Electron Devices Meeting 1999. Technical Digest (Cat. No.99CH36318), Washington, DC, USA, 1999, pp. 279-282. International Electron Devices Meeting 1999. Technical Digest (Cat. No.99CH36318), Washington, DC, USA, 1999, pp. 279-282.
Non-Final Office Action notified Aug. 5, 2020 for U.S. Appl. No. 16/287,953.
Non-Final Office Action notified Aug. 5, 2020 for U.S. Appl. No. 16/288,004.
Non-Final Office Action notified Aug. 5, 2020 for U.S. Appl. No. 16/288,006.
Non-Final Office Action notified Jun. 26, 2020 for U.S. Appl. No. 16/287,876.
Notice of Allowance notified Jan. 12, 2021 for U.S. Appl. No. 16/287,876.
Notice of Allowance notified Jul. 27, 2020 for U.S. Appl. No. 16/287,927.
Notice of Grant notified May 18, 2021 for Taiwan Patent Application No. 109106095.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps. 187701. 6 pages.
Tanaka, S. et al., "FRAM cell design with high immunity to fatigue and imprint for 0.5/spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
International Preliminary Report on Patentability notified Sep. 10, 2021 for PCT Patent Application No. PCT/US2020/066963.
International Search Report and Written Opinion notified Jun. 19, 2020 for PCT Patent Application No. PCT/US2020/066963.
Non-Final Office Action notified Dec. 20, 2021 for U.S. Appl. No. 16/288,004.
Final Office Action dated Apr. 25, 2022 for U.S. Appl. No. 16/287,953.
Final Office Action dated Jun. 13, 2022 for U.S. Appl. No. 17/339,850.
Final Office Action dated May 11, 2022 for U.S. Appl. No. 16/288,004.
Final Office Action dated May 11, 2022 for U.S. Appl. No. 16/288,006.
Non Final Office Action dated Jun. 13, 2022 for U.S. Appl. No. 17/346,083.
Non-Final Office Action dated Jun. 15, 2022 for U.S. Appl. No. 17/367,101.
Notice of Allowance dated Apr. 20, 2022 for U.S. Appl. No. 17/359,311.
Notice of Allowance dated Jun. 9, 2022 for U.S. Appl. No. 16/288,006.
Notice of Allowance dated Jun. 10, 2022 for U.S. Appl. No. 16/288,004.
Notice of Allowance dated Jun. 13, 2022 for U.S. Appl. No. 16/287,953.
Notice of Allowance dated Jun. 23, 2022 for U.S. Appl. No. 17/367,172.
Notice of Allowance dated Jun. 23, 2022 for U.S. Appl. No. 17/367,210.
Second Office Action dated Jul. 26, 2022 for Taiwan Patent Application No. 110129115.
Advisory Action dated Jul. 25, 2022 for U.S. Appl. No. 17/339,850.
Final Office Action dated Aug. 15, 2022 for U.S. Appl. No. 17/346,083.
Non-Final Office Action dated Aug. 16, 2022 for U.S. Appl. No. 17/367,217.
Notice of Allowance dated Aug. 17, 2022 for U.S. Appl. No. 17/346,087.
Notice of Allowance dated Aug. 22, 2022 for U.S. Appl. No. 7/390,791.
Restriction Requirement dated Aug. 5, 2022 for U.S. Appl. No. 17/359,325.
Final Office Action dated Sep. 12, 2022 for U.S. Appl. No. 17/367,217.
Non-Final Office Action dated Sep. 7, 2022 for U.S. Appl. No. 17/530,360.
Notice of Allowance dated Aug. 8, 2022 for U.S. Appl. No. 17/529,258.
Notice of Allowance dated Sep. 13, 2022 for U.S. Appl. No. 17/530,364.
Notice of Allowance dated Sep. 14, 2022 for U.S. Appl. No. 17/530,360.
Notice of Allowance dated Sep. 21, 2022 for U.S. Appl. No. 17/530,366.
Notice of Allowance dated Sep. 23, 2022 for U.S. Appl. No. 17/339,850.
Notice of Allowance dated Sep. 26, 2022 for U.S. Appl. No. 17/367,217.
Notice of Allowance dated Sep. 27, 2022 for U.S. Appl. No. 17/346,083.

* cited by examiner

Planar Ferroelectric Capacitor

NON-LINEAR POLAR MATERIAL BASED MEMORY BIT-CELL WITH MULTI-LEVEL STORAGE BY APPLYING DIFFERENT VOLTAGE LEVELS

CLAIM OF PRIORITY

This application is a continuation of, and claims the benefit of priority to U.S. patent application Ser. No. 17/339,850, filed on Jun. 4, 2021, titled "HIGH-DENSITY Low VOLTAGE FERROELECTRIC MEMORY BIT-CELL," and which is incorporated by reference in entirety.

BACKGROUND

The standard memory used in processors is static random-access memory (SRAM) or dynamic random-access memory (DRAM), and their derivatives. These memories are volatile memories. For example, when power to the memories is turned off, the memories lose their stored data. Non-volatile memories are now also commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND, or NOR flash memories. These memories may not be suitable for low power and compact computing devices because these memories suffer from high write energy, low density, and high-power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
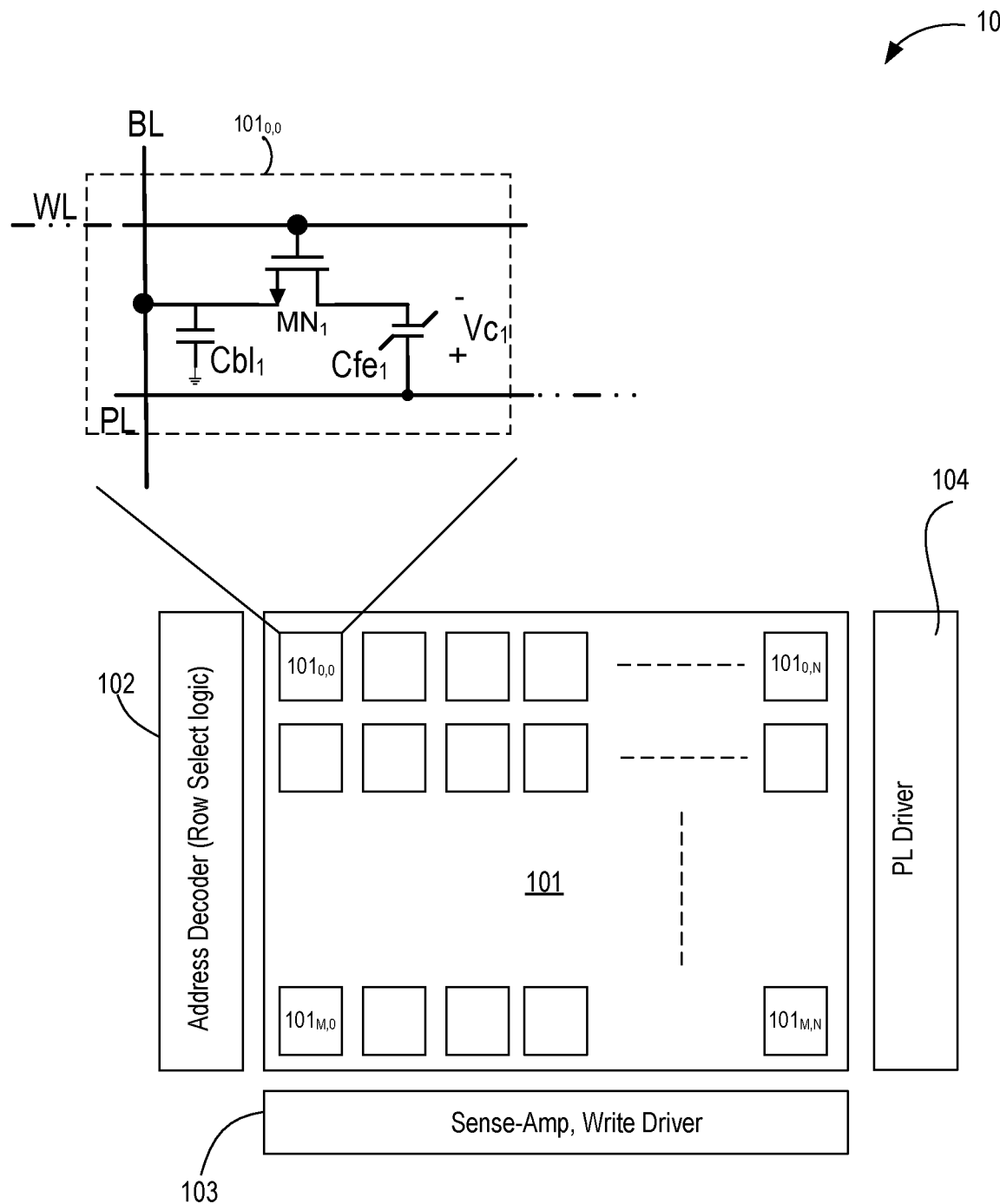
FIG. 1A illustrates an apparatus comprising memory and corresponding logic, wherein the memory comprises ferroelectric (FE) memory bit-cells, in accordance with some embodiments.

Various embodiments describe a high-density low voltage ferroelectric (or paraelectric) memory bit-cell. In some embodiments, the memory bit-cell includes a planar ferroelectric or paraelectric capacitor. In some embodiments, the memory bit-cell includes a pillar ferroelectric or paraelectric capacitor. In some embodiments, the memory bit-cell comprises one transistor and one capacitor (1T1C), where a plate-line is parallel to a word-line. In some embodiments, the plate-line is parallel to a bit-line. In some embodiments, the memory bit-cell comprises 1TnC, where 'n' is a number. In a 1TnC bit-cell, the capacitors are vertically stacked allowing for multiple values to be stored in a single bit-cell. In some embodiments, the memory bit-cell is multi-element FE gain bit-cell. In one such embodiment, data sensing is done with signal amplified by a gain transistor in the bit-cell. Multi-element FE gain bit-cell allows for larger array implementation due to decoupling of sense charge required from the sense-line capacitance. Owing to larger transistor layer footprint within the multi-element FE gain bit-cell, trade-offs associated with sizing the non-planar capacitor height Vs film-thickness can be utilized as well. As such, higher storage density is realized using multi-element FE gain bit-cells. In some embodiments, the capacitors that share the same node for connectivity can implement folding and stacking together, realizing different trade-offs on density and process control requirements. In some embodiments, the 1T1C, 1TnC, and multi-element FE gain bit-cells are multi-level bit-cells. To realize multi-level bit-cells, the ferroelectric (or paraelectric) capacitor is placed in a partially switched polarization state. Partial polarization state can be achieved by applying either different voltage levels to the capacitor, or different time pulse widths at the same voltage level. By using stacked capacitor in combination of multi-level programming of the bit-cells, higher storage density per bit-cell can be achieved, in accordance with various embodiments. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates apparatus 100 comprising memory and corresponding logic, wherein the memory comprises ferroelectric (FE) memory bit-cells, in accordance with some embodiments. Apparatus 100 comprises M×N memory array 101 of bit-cells, logic circuitry 102 for address decoding, sense amplifier and write drivers 103, and plate-line (PL) driver 104. Logic 102 comprises address decoders for selecting a row of bit-cells and/or a particular bit-cell from M×N array 101, where M and N are integers of same or different values. Logic 103 comprises sense-amplifiers for reading the values from the selected bit-cell, while write drivers are used to write a particular value to a selected bit-cell. Here, a schematic of FE bit-cell $101_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $101_{0,0}$ comprises a word-line (WL), a plate-line (PL), a bit-line (BL), and bit-cell $101_{0,0\_A}$ and $101_{0,0\_B}$. In some embodiments, bit-cell $101_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CBl_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 1B:
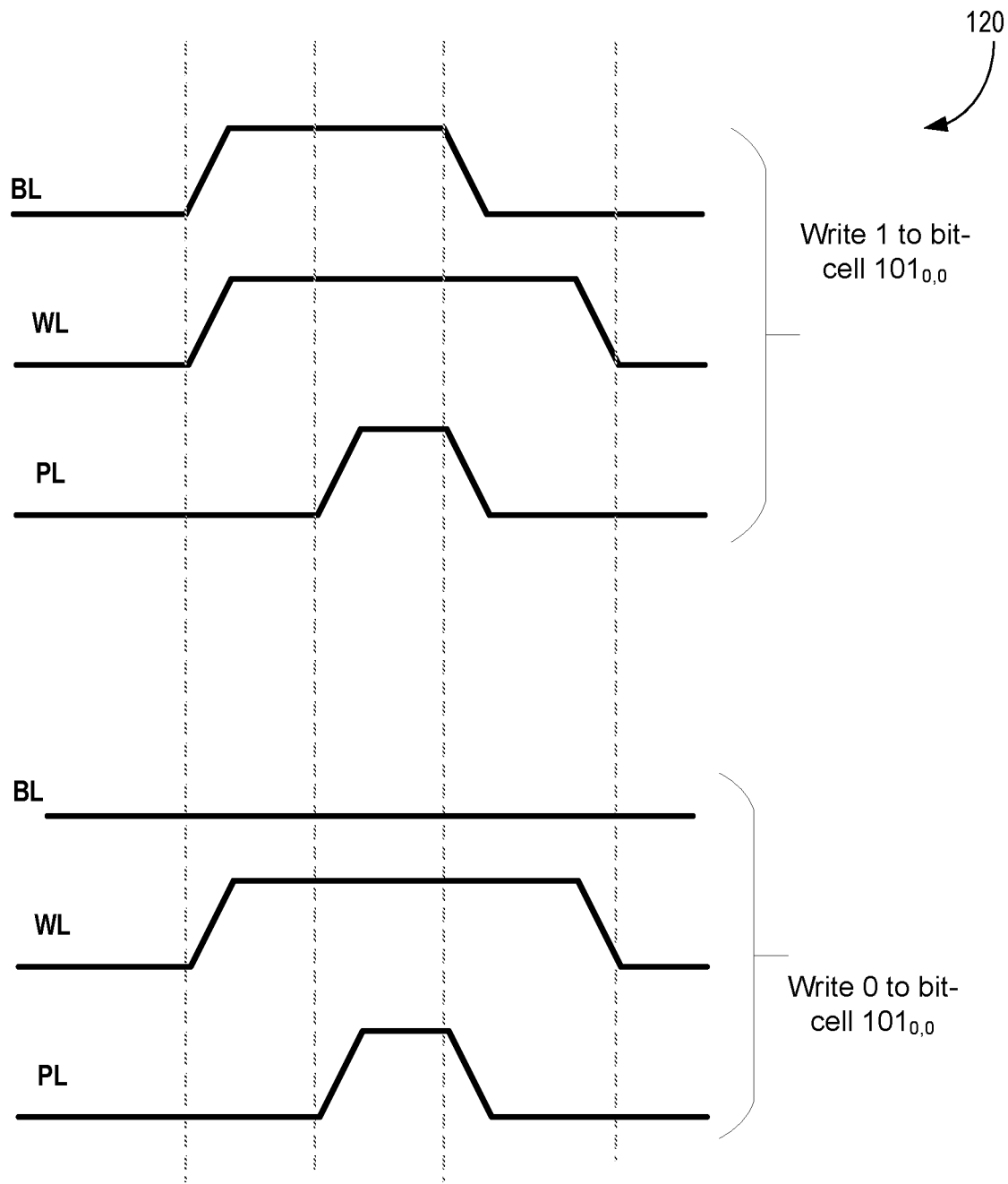
FIG. 1B illustrates a timing diagram for writing a logic 1 and logic 0 to the FE memory bit-cell, in accordance with some embodiments.

FIG. 1B illustrates timing diagram 120 for writing a logic 1 and logic 0 to the FE memory bit-cell, in accordance with some embodiments. To write data to bit-cell $101_{0,0}$, BL and PL generate a signal sequence. In some embodiments, the signal scheme for sensing the data follows a write operation (can be to a 1 or 0 pre-determined by configuration), which helps create a signature on the bit-line for "opposite" or "same" state relative to the write operation. This signature is sensed by a sense-amplifier, that compares the signature relative to either a reference value, or in case of differential implementation the sign of voltage difference between differential bit-lines. The reads are destructive reads similar to DRAM, and the information depending on system protocol may or may not be required to be written back to the memory cell with a write-back phase. While the various embodiments are illustrated using n-type transistors, the bit-cell can also be implemented using p-type transistors.

Figure 2A:
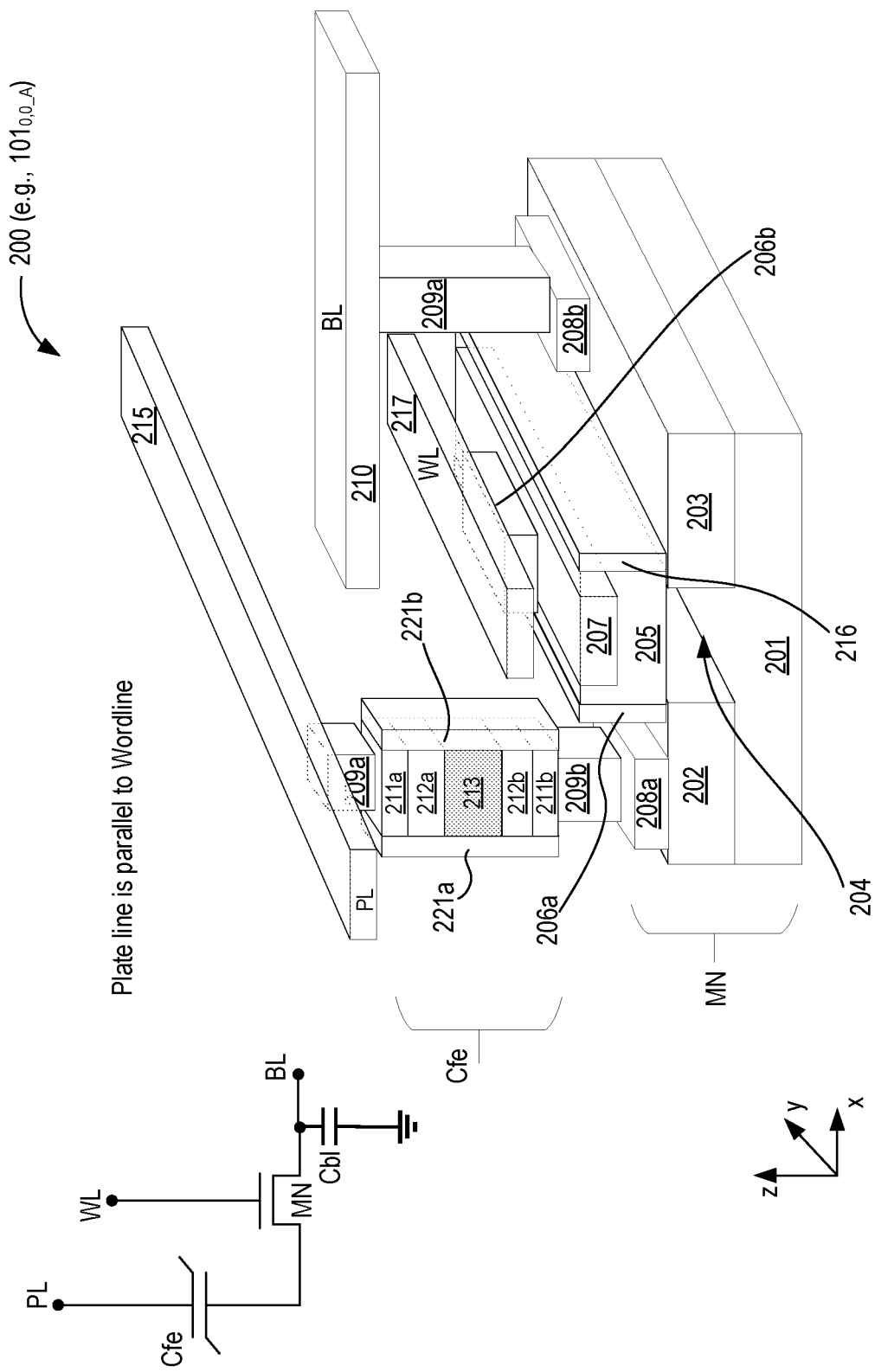
FIG. 2A illustrates a three-dimensional (3D) view of an FE memory bit-cell comprising a planar transistor and a planar FE capacitor, in accordance with some embodiments.

FIG. 2A illustrates a three-dimensional (3D) view 200 of an FE memory bit-cell comprising a planar transistor and a planar FE capacitor, in accordance with some embodiments. The memory bit-cell includes a planar transistor MN having substrate 201, source 202, drain 203, channel region 204, gate comprising gate dielectric 205, gate spacers 206a and 206b; gate metal 207, source contact 208a, and drain contact 208b.

Substrate 201 includes a suitable semiconductor material such as: single crystal silicon, polycrystalline silicon and silicon on insulator (SOI). In one embodiment, substrate 201 includes other semiconductor materials such as: Si, Ge, SiGe, or a suitable group III-V or group III-N compound. The substrate 201 may also include semiconductor materials, metals, dopants, and other materials commonly found in semiconductor substrates.

In some embodiments, source region 202 and drain region 203 are formed within substrate 201 adjacent to the gate stack of the transistor. The source region 202 and drain region 203 are generally formed using either an etching/deposition process or an implantation/diffusion process.

In the etching and deposition process, substrate 201 may first be etched to form recesses at the locations of the source 202 and drain 203 regions. An epitaxial deposition process may then be carried out to fill the recesses with material that is used to fabricate the source region 202 and drain region 203. In the implantation/diffusion process, dopants such as boron, aluminum, antimony, phosphorous, or arsenic may be ion-implanted into the substrate to form the source region 202 and drain region 203. An annealing process that activates the dopants and causes them to diffuse further into substrate 201 typically follows the ion-implantation process.

In some embodiments, one or more layers of metal and/or metal alloys are used to form the source region 202 and drain region 203. In some embodiments, source region 202 and drain region 203 are formed using one or more alternate semiconductor materials such as germanium or a suitable group III-V compound. In some embodiments, source region 202 and drain region 203 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 204 may have the same material as substrate 201, in accordance with some embodiments. In some embodiments, channel region 204 includes one of: Si, SiGe, Ge, and GaAs.

The gate dielectric layer 205 may include one layer or a stack of layers. The one or more layers may include high-k dielectric material, silicon oxide, and/or silicon dioxide ($SiO_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 205 to improve its quality.

In some embodiments, a pair of spacer layers (sidewall spacers) 206a/b are formed on opposing sides of the gate stack that bracket the gate stack. The pair of spacer layers 206a/b are formed from a material such as: silicon oxynitride, silicon nitride, silicon nitride doped with carbon, or silicon carbide. Processes for forming sidewall spacers are well-known in the art and generally include deposition and etching process operations. In some embodiments, a plurality of spacer pairs may be used. For example, two pairs, three pairs, or four pairs of sidewall spacers may be formed on opposing sides of the gate stack.

Gate metal layer 207 may comprise at least one P-type work-function metal or N-type work-function metal, depending on whether the transistor is to be a p-type or an n-type transistor. Gate metal layer 207 may comprise a stack of two or more metal layers, where one or more metal layers are work-function metal layers and at least one metal layer is a conductive fill layer.

For an n-type transistor, metals that may be used for the gate metal layer 207 include: aluminum carbide, tantalum carbide, zirconium carbide, and hafnium carbide. In some embodiments, metal for gate metal layer 207 for n-type transistor include: aluminum, hafnium, zirconium, titanium, tantalum, and their alloys. An n-type metal layer will enable the formation of an n-type gate metal layer 207 with a work function that is between about 3.9 eV and about 4.2 eV. In some embodiments, metal of layer 207 includes one of: TiN, TiSiN, TaN, Cu, Al, Au, W, TiSiN, or Co. In some embodiments, metal of layer 107 includes one or more of: Ti, N, Si, Ta, Cu, Al, Au, W, or Co.

For a p-type transistor, metals that are used for gate metal layer 207 include, but are not limited to, ruthenium, palladium, platinum, cobalt, nickel, and conductive metal oxides. An example of conductive oxide includes ruthenium oxide. A p-type metal layer will enable the formation of a p-type gate metal layer 207 with a work function that is between about 4.9 eV and about 5.2 eV.

The drain contact 208b is coupled to via 209a/b, which is coupled to metal layer 110. Metal layer 210 is the bit-line, which extends along the x-axis. The source contact 208a is coupled to via 209b. Any suitable material can be used for drain and source contacts 208a/b and via 209a/b. For example, one or more of Ti, N, Si, Ta, Cu, Al, Au, W, or Co can be used for drain and source contacts 208a/n and via 209a/b. Via 209b is coupled to FE capacitor Cfe that comprises refractive inter-metallic 211a/b as a barrier material; conductive oxides 212a/b, and FE material 213.

Refractive inter-metallic 211a/b maintains the FE properties of the FE capacitor Cfe. In the absence of refractive inter-metallic 211a/b, the ferroelectric material or the paraelectric material 213 of the capacitor may lose its potency. In some embodiments, refractive inter-metallic 211a/b comprises Ti and Al (e.g., TiAl compound). In some embodiments, refractive inter-metallic 211a/b comprises one or more of Ta, W, and/or Co.

For example, refractive inter-metallic 211a/b includes a lattice of Ta, W, and Co. In some embodiments, refractive inter-metallic 211a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. Barrier layer 211a is coupled to plate-line or power-line (PL) 215. In some embodiments, sidewall barrier seal 221a/b (insulating material) is placed around layers 211a, 212a, 213, 212b, and 211b along while the top and bottom surfaces of 211a and 211b are exposed for coupling to metal layers, vias, or a metallic pedestal.

In various embodiments, PL 215 extends along the x-direction and parallel to the BL 210. By having the BL and the PL parallel to one another further improves the density of the memory because the memory array footprint is reduced, allowing column multiplexing (muxing), and sharing of sense-amplifier, and PL line driver size reduction, compared to the case when BL and PL are orthogonal to each other. The gate metal 207 is coupled to a gate contact 216, which is coupled to a metal line 217. Metal line 217 is used as the word-line (WL). In some embodiments, WL 217 extends orthogonal to BL 110 and PL 115. In some embodiments, WL 217 is also parallel to BL 210 and PL 215. Any suitable metal can be used for BL 210, PL 215, and WL 217. For example, Al, Cu, Co, Au, or Ag can be used for BL 210, PL 215, and WL 217.

In various embodiments, FE material 213 can be any suitable low voltage FE material that allows the FE material to switch its state by a low voltage (e.g., 100 mV). Threshold in FE material 213 has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of FE layer 213. A perfectly epitaxial, single crystalline 1th layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, FE material 213 comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides).

In some embodiments, FE material 213 is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 213. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rate earth substitution into the Bi site can tune the spontaneous distortion. In some embodiments, FE material 213 is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, FE material 213 comprises a stack of layers including low voltage FE material between (or sandwiched between) conductive oxides. In various embodiments, when FE material 213 is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for FE material 213, conductive oxides 212a/b can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides 212a/b.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, FE material 213 comprises one or more of: Hafnium (Hf), Zirconium (Zr), Aluminum (Al), Silicon (Si), their oxides or their alloyed oxides. In some embodiments, FE material 172 includes one or more of: Al(1-x)Sc(x)N, Ga(1-x)Sc(x)N, Al(1-x)Y(x)N or Al(1-x-y) Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material 213 includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, FE material 213 includes Bismuth ferrite (BFO), BFO with a doping material where in the doping material is one of Lanthanum, or any element from the lanthanide series of the periodic table. In some embodiments, FE material 213 includes lead zirconium titanate (PZT), or PZT with a doping material, wherein the doping material is one of La, Nb. In some embodiments, FE material 213 includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium- Bismuth Zinc Niobium Tantalum (BT-BZNT), Barium Titanium-Barium Strontium Titanium (BT-BST).

In some embodiments, FE material 213 includes Hafnium oxides of the form, Hf1-x Ex Oy where E can be Al, Ca, Ce, Dy, er, Gd, Ge, La, Sc, Si, Sr, Sn, or Y. In some embodiments, FE material 105 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, FE material 213 comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, FE material 213 comprises organic material. For example, Polyvinylidene fluoride or polyvinylidene difluoride (PVDF).

In some embodiments, FE material 213 comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal 1th includes one of: YMnO3 or LuFeO3. In various embodiments, when FE material 213 comprises hexagonal ferroelectrics, the conductive oxides are of A2O3 (e.g., In2O3, Fe2O3) and ABO3 type, where 'A' is a rare earth element and B is Mn.

In some embodiments, FE material 213 comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material 213 for storing the charge state, the embodiments are also applicable for paraelectric material. For example, the capacitor of various embodiments can be formed using paraelectric material instead of ferroelectric material.

While various embodiments here are described with reference to ferroelectric material for storing the charge state, the embodiments are also applicable for paraelectric material. For example, material 213 of various embodiments can be formed using paraelectric material instead of ferroelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Figure 2B:
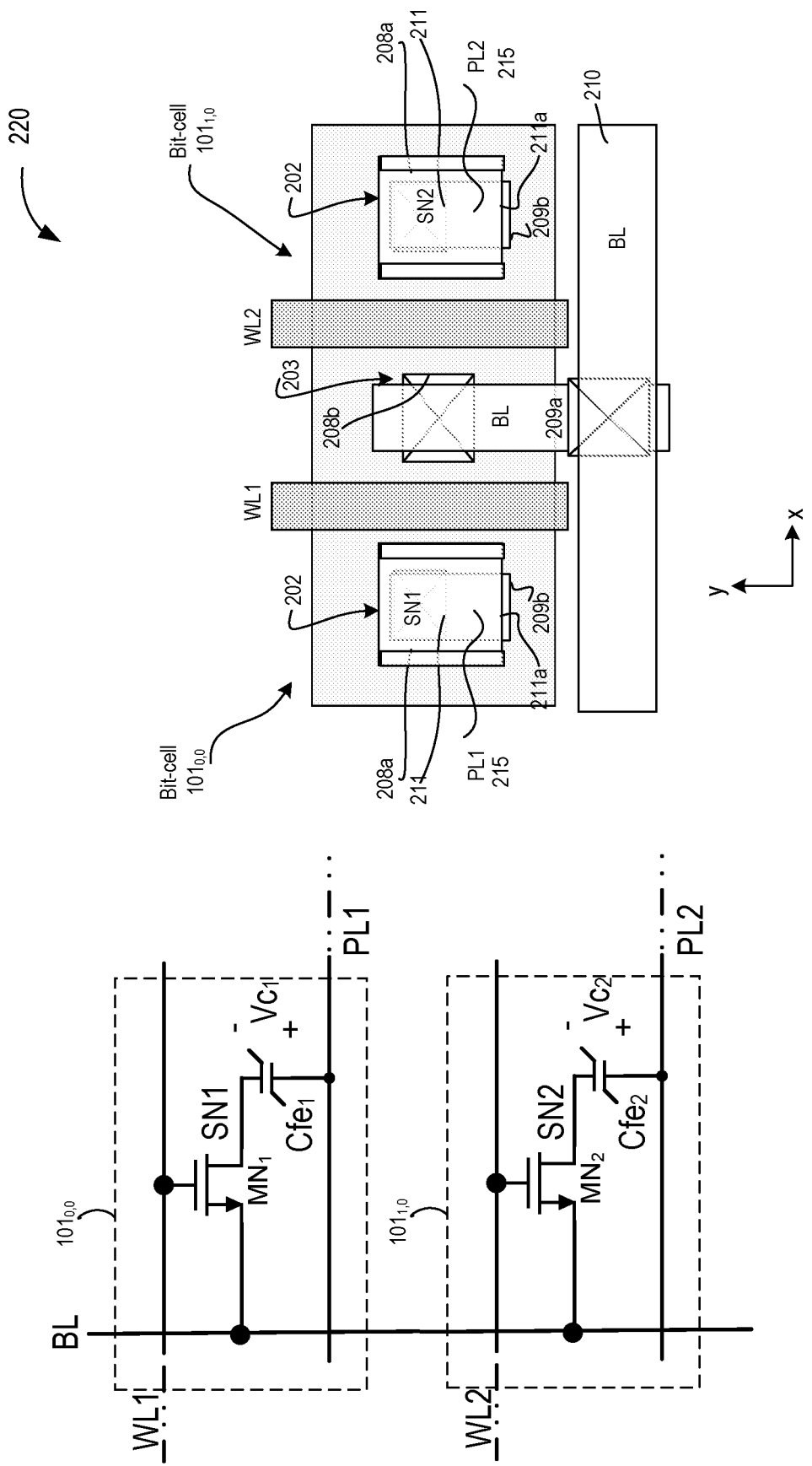
FIG. 2B illustrates a cross-sectional view of the FE memory bit-cell of FIG. 2A, in accordance with some embodiments.

FIG. 2B illustrates a cross-sectional view 220 of two FE memory bit-cells of FIG. 2A, in accordance with some embodiments. Here, first memory bit-cell is $101_{0,0}$ and second memory bit-cell is $101_{1,0}$, each bit-cell is controlled by its respective word-line. First memory bit-cell is $101_{0,0}$ is controlled by WL1 while second memory bit-cell is $101_{1,0}$ is controlled by WL2. The two bit-cells share diffusion region and also share BL. In some embodiments sharing of this diffusion region may not be necessary, however, for denser and improved performance sharing diffusion on BL line is preferred in accordance with some embodiments. Bit-cells along a given row or column receives its respective shared PL along the row or column, where the row or column-based sharing is dependent on PL being parallel to WL or PL being parallel to BL. For example, first memory bit-cell is $101_{0,0}$ has a first FE (pr paraelectric) capacitor coupled to PL1, while second memory bit-cell is $101_{1,0}$ has a second FE (or paraelectric capacitor) coupled to PL2. In this example, BL is orthogonal to PL and WL, while PL and WL are parallel. A similar layout can be made where the PL is parallel to the BL. In some embodiments, when PL is parallel to BL, bit-cells that share the same BL, also share the same PL connection. In some embodiments, while in the case where PL is parallel to the WL, bit-cells that share the same WL connection, also share the same PL connections.

Here, pitch refers to the x and y dimensions of the bit-cell. Because of the small pitch, many bit-cells can be packed in an array fashion leading to a high-density memory array. While the capacitive structure of various embodiments is shown as a rectangular structure, it can have other shapes too. For example, the capacitive structure of various embodiments can have a cylindrical shape with dimensions similar to the one described with reference to the rectangular capacitive structure.

Figure 2C:
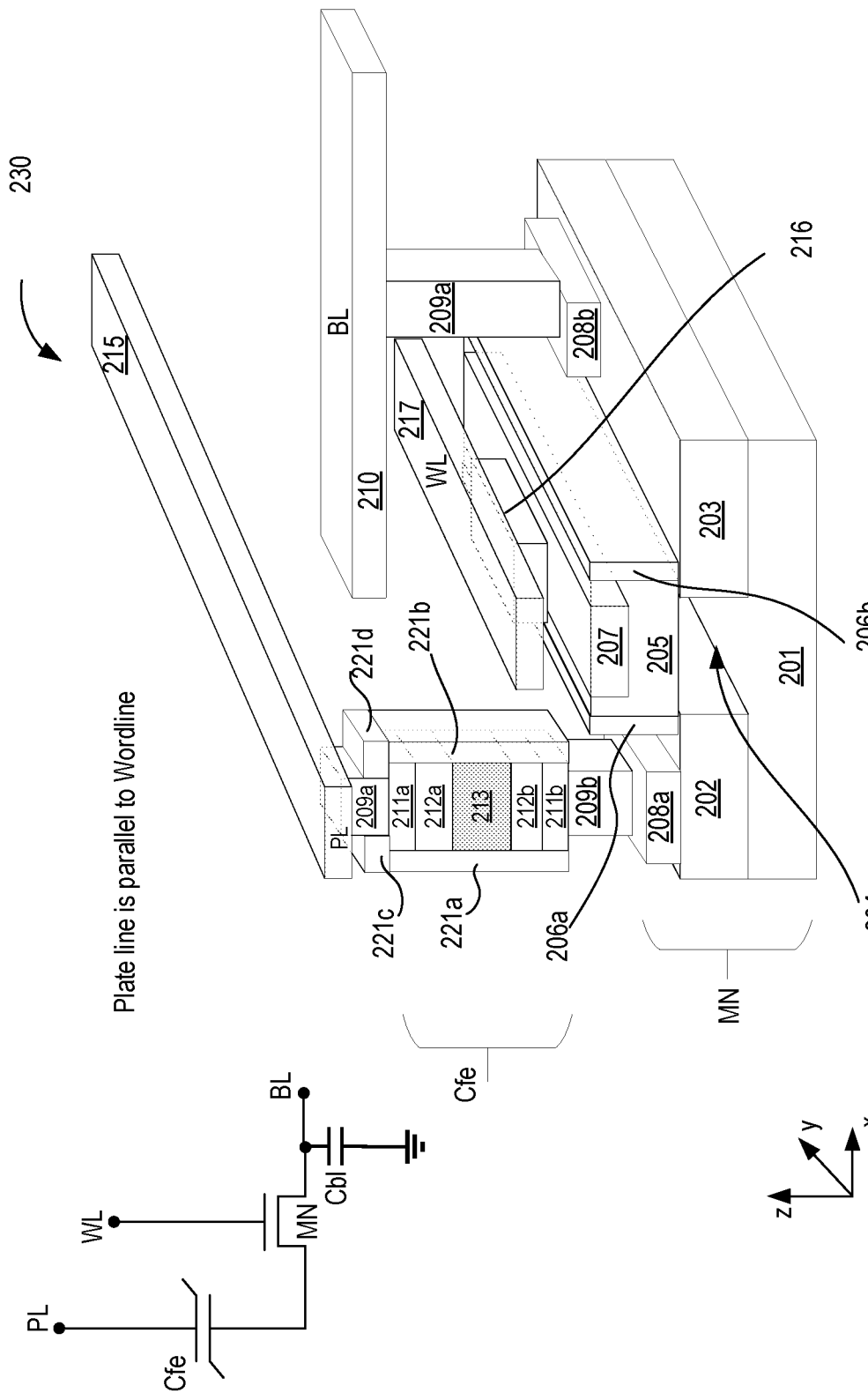
FIG. 2C illustrates a 3D view of an FE memory bit-cell comprising a planar transistor and a planar FE capacitor with wrapped encapsulation, in accordance with some embodiments.

FIG. 2C illustrates a 3D view of an FE memory bit-cell 230 comprising a planar transistor and a planar FE capacitor, with wrapped encapsulation, in accordance with some embodiments. FIG. 2C is similar to FIG. 2A but for the structure of the planar FE capacitor. In some embodiments, the sidewall barrier seal or encapsulant fully wraps the planar pillar capacitor except for an opening for via 209a. For example, in some embodiments, sidewall barrier seals 221a, 221b, 221c, and 221d (insulating material) is placed around layers 211a, 212a, 213, 212b, and 211b along while part of top electrode 221a is exposed for coupling to metal layer(s), via(s), or a metallic pedestal. The materials for sidewall barrier seal 221 includes one of: Ti—Al—O, Al2O3, or MgO. In some embodiments, the material for sidewall barrier seal 221 includes one or more of: Ti, Al, O, or Mg.

Figure 2D:
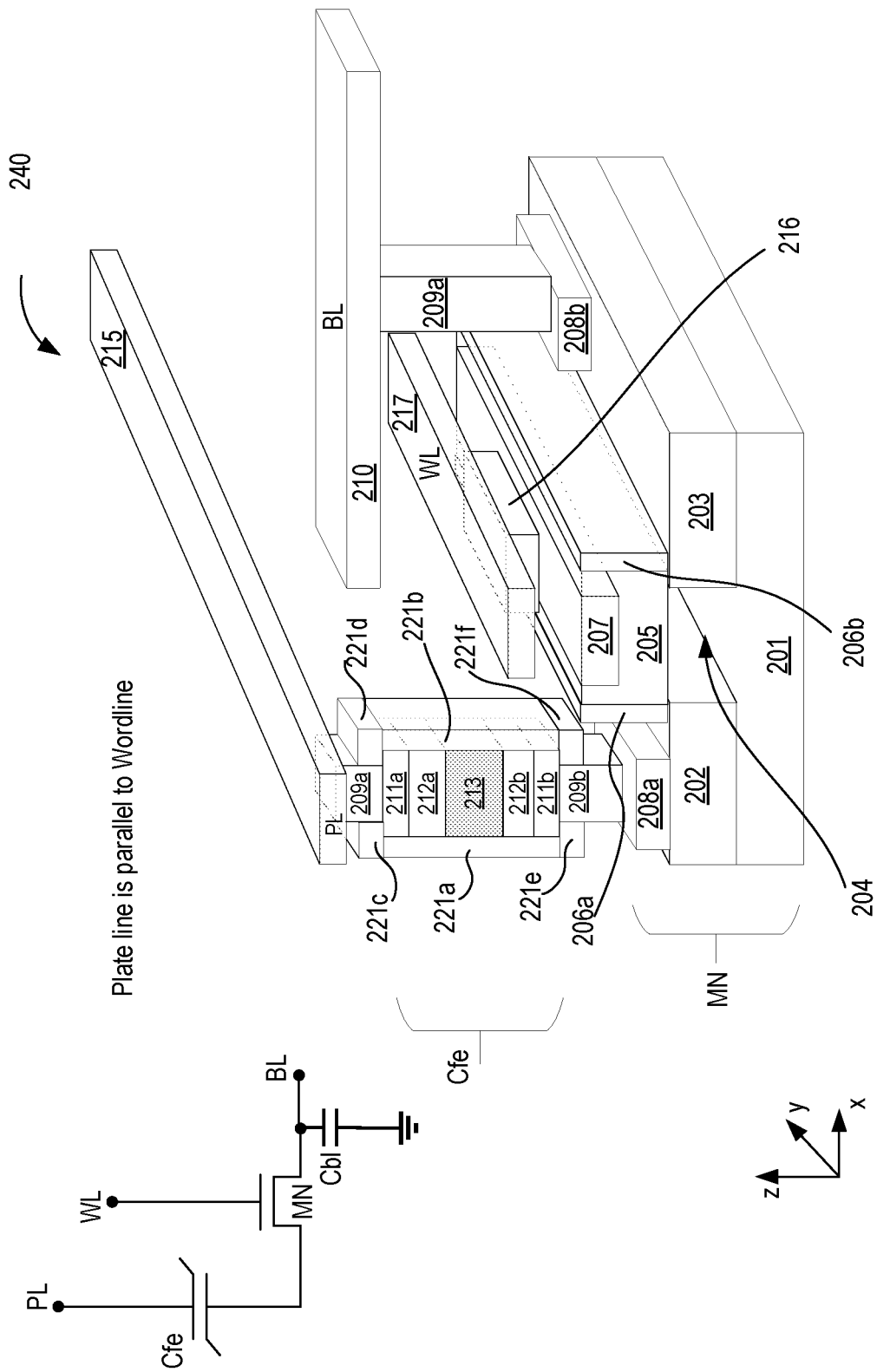
FIG. 2D illustrates a 3D view of an FE memory bit-cell comprising a planar transistor and a planar FE capacitor with wrapped encapsulation, in accordance with some embodiments.

FIG. 2D illustrates a 3D view of an FE memory bit-cell 240 comprising a planar transistor and a planar FE capacitor, with wrapped encapsulation, in accordance with some embodiments. FIG. 2D is similar to FIG. 2C but for the structure of the planar FE capacitor. In some embodiments, the sidewall barrier seal or encapsulant fully wraps the planar pillar capacitor except for an opening for via 209a. For example, in some embodiments, sidewall barrier seals 221a, 221b, 221c, 221d, 221e, and 221f (insulating material) is placed around layers 211a, 212a, 213, 212b, and 211b along while part of top electrode 221a and part of bottom electrode 221b are exposed for coupling to metal layer(s), via(s), or a metallic pedestal.

Figure 3A:
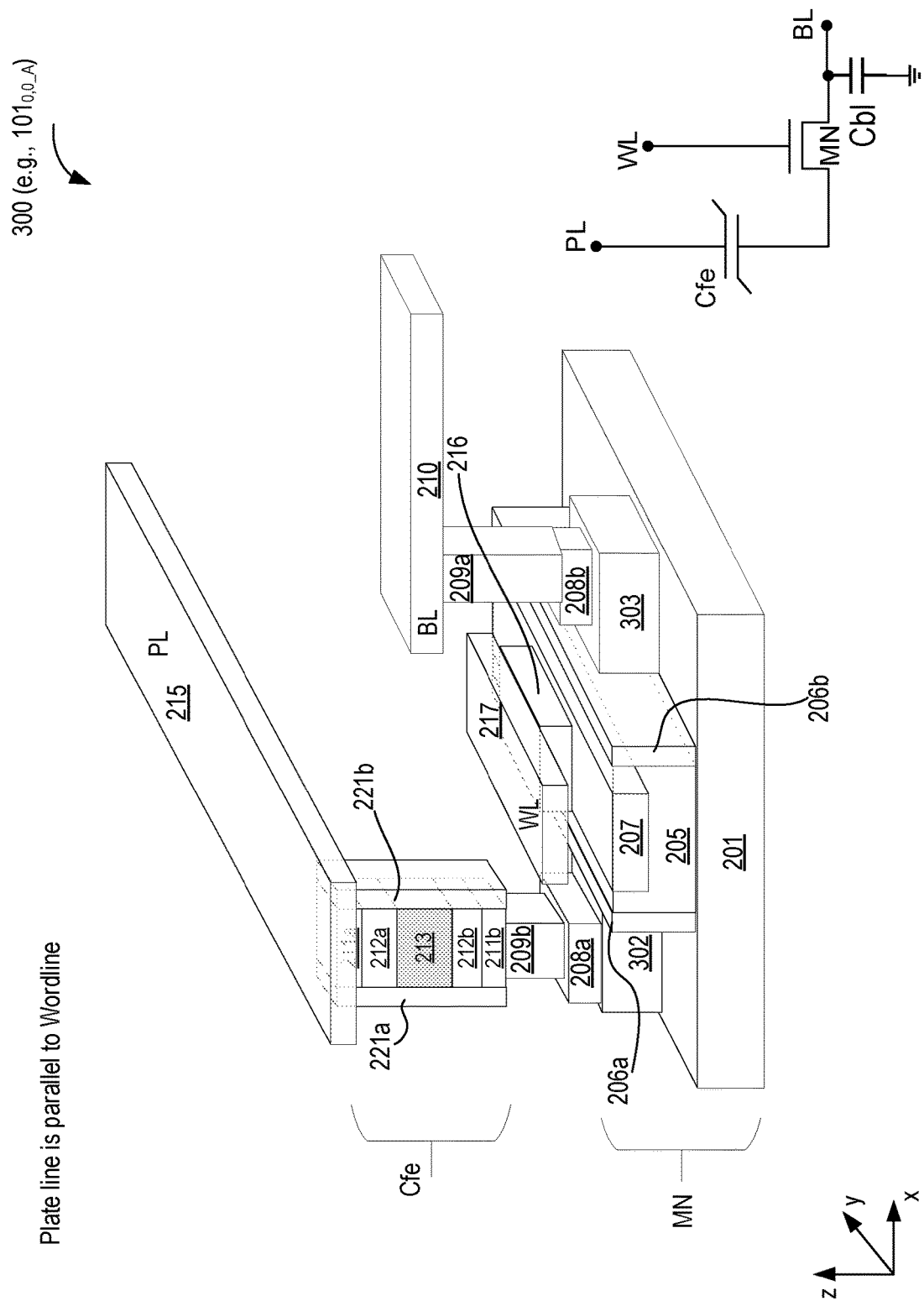
FIG. 3A illustrates a 3D view of an FE memory bit-cell comprising a non-planar transistor and a planar FE capacitor, in accordance with some embodiments.

FIG. 3A illustrates a 3D view of a FE memory bit-cell 300 comprising a non-planar transistor and a planar FE capacitor, in accordance with some embodiments. The memory bit-cell of FIG. 3A is similar to the memory bit-cell FIG. 2A but for a non-planar transistor. FinFET is an example of a non-planar transistor. FinFET comprises a fin that includes source 302 and drain 303 regions. A channel resides between the source and regions 302 and 303. The transistor MN can have multiple fins parallel to one another that are coupled to the same gate stack. The fins pass through the gate stack forming source and drain regions 302 and 303.

Figure 3B:
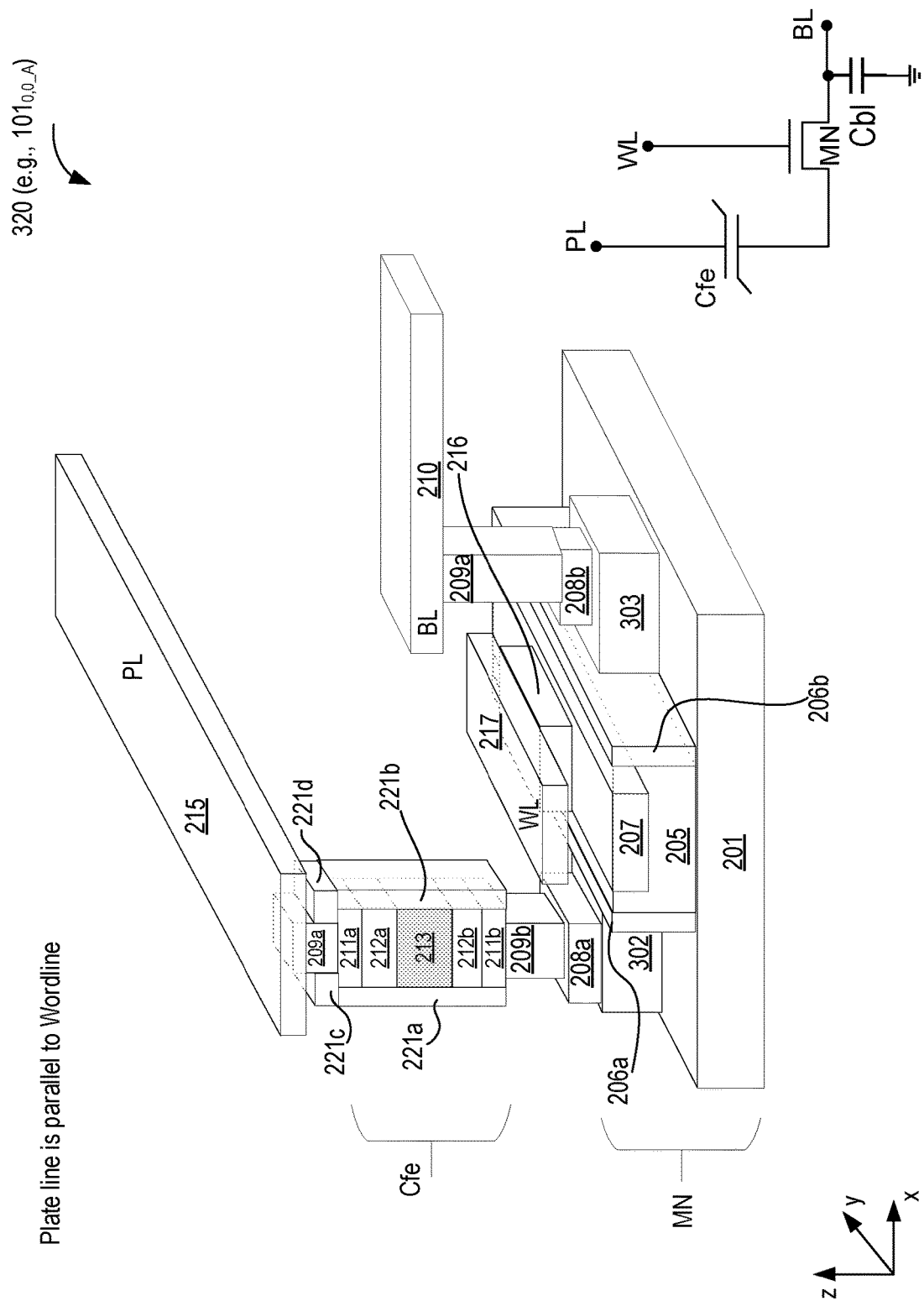
FIG. 3B illustrates a 3D view of an FE memory bit-cell comprising a non-planar transistor and a planar FE capacitor, with wrapped encapsulation, in accordance with some embodiments.

FIG. 3B illustrates a 3D view of an FE memory bit-cell 320 comprising a non-planar transistor and a planar FE capacitor, with wrapped encapsulation, in accordance with some embodiments. FIG. 3B is similar to FIG. 3A but for the structure of the planar FE capacitor. In some embodiments, the sidewall barrier seal or encapsulant fully wraps the planar pillar capacitor except for an opening for via 209a. For example, in some embodiments, sidewall barrier seals 221a, 221b, 221c, and 221d (insulating material) is placed around layers 211a, 212a, 213, 212b, and 211b along while part of top surface 221a and/or bottom surface of 211b are exposed for coupling to metal layers, vias, or a metallic pedestal. The materials for sidewall barrier seal 221 includes one of: Ti—Al—O, Al2O3, or MgO. In some embodiments, the material for sidewall barrier seal 221 includes one or more of: Ti, Al, O, or Mg.

Figure 3C:
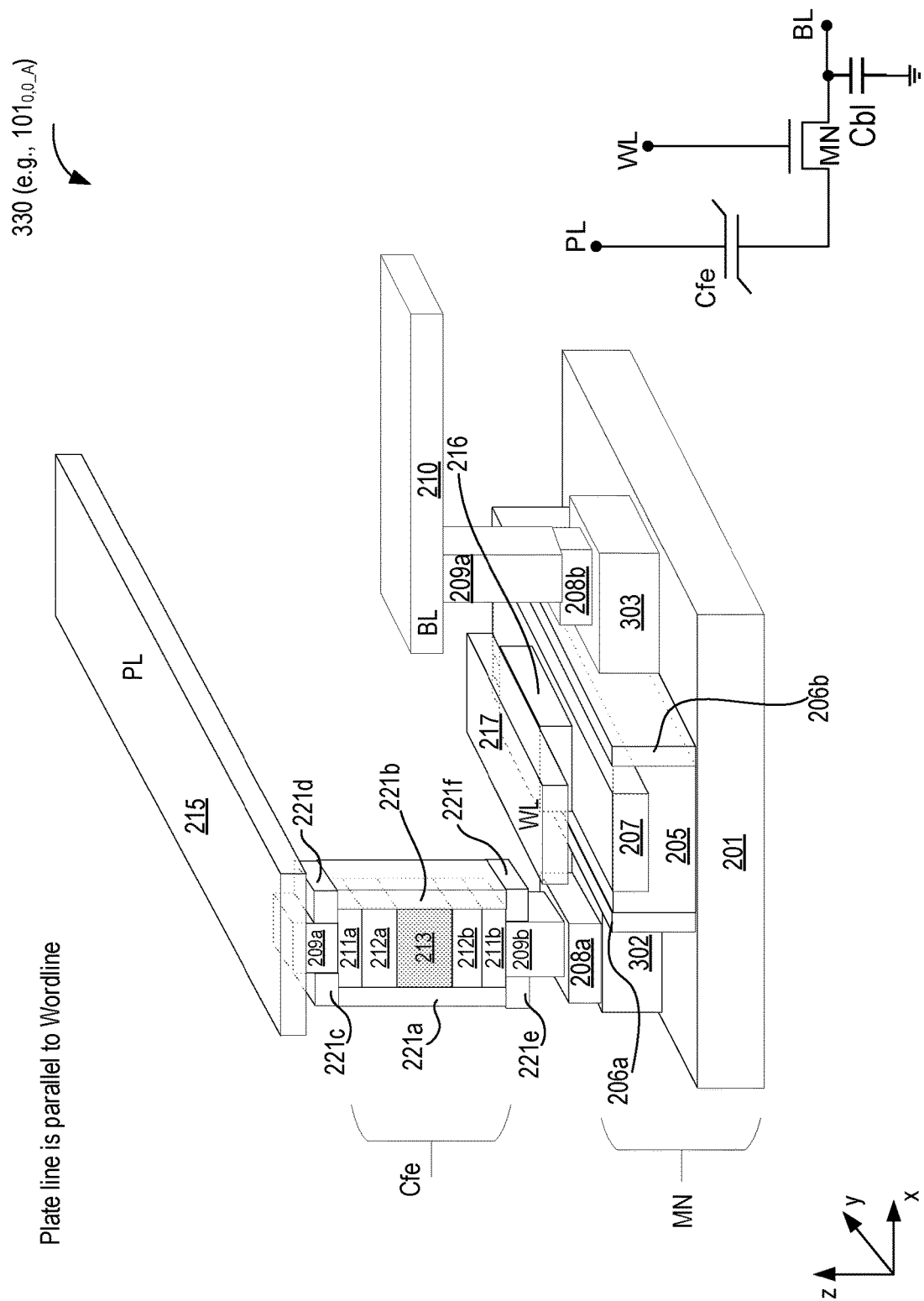
FIG. 3C illustrates a 3D view of an FE memory bit-cell comprising a non-planar transistor and a planar FE capacitor, with wrapped encapsulation, in accordance with some embodiments.

FIG. 3C illustrates a 3D view of an FE memory bit-cell 320 comprising a non-planar transistor and a planar FE capacitor, with wrapped encapsulation, in accordance with some embodiments. FIG. 3B is similar to FIG. 3A but for the structure of the planar FE capacitor. In some embodiments, the sidewall barrier seal or encapsulant fully wraps the planar pillar capacitor except for an opening for via 209a. For example, in some embodiments, sidewall barrier seals 221a, 221b, 221c, 221d, 221e, and 221f (insulating material) is placed around layers 211a, 212a, 213, 212b, and 211b along while part of top electrode 221a and part of bottom electrode 221b are exposed for coupling to metal layer(s), via(s), or a metallic pedestal.

Figure 4:
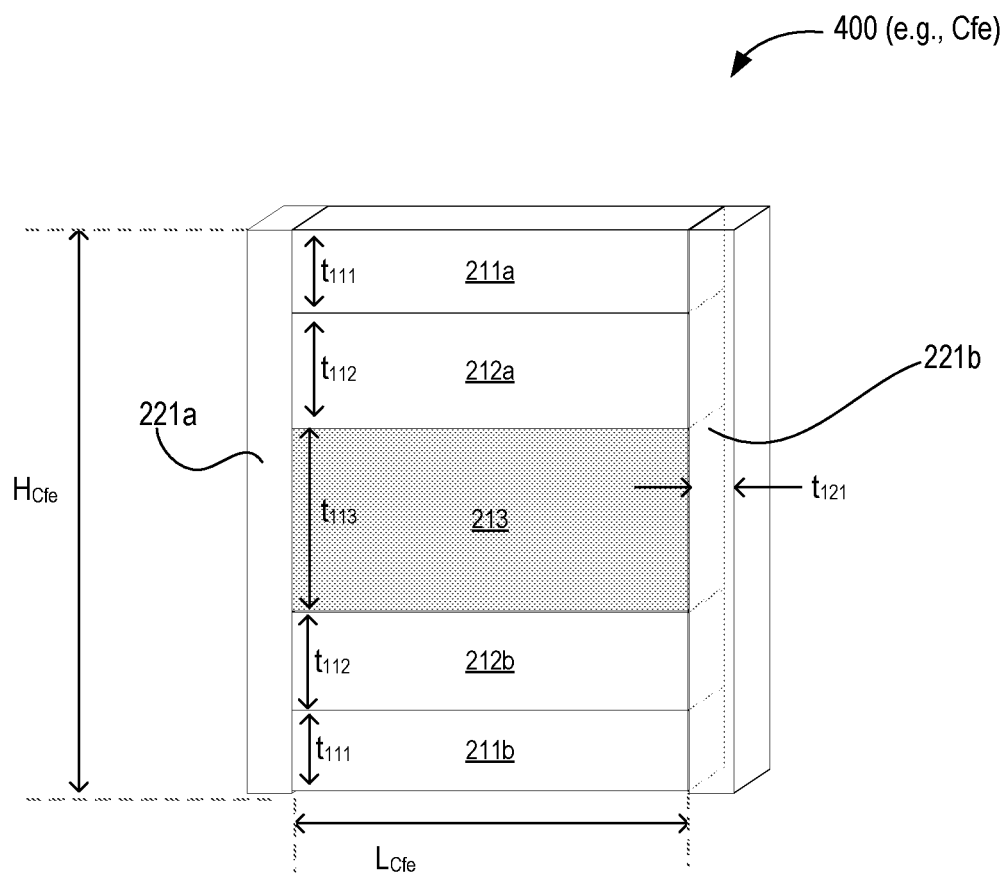
FIG. 4 illustrates a planar FE capacitor, in accordance with some embodiments.

FIG. 4 illustrates planar FE capacitor 400, in accordance with some embodiments. Materials for various layers are discussed with reference to FIG. 2A. In some embodiments, thickness till of refractive inter-metallic layer 211a/b is in a range of 1 nm to 20 nm. In some embodiments, thickness $t_{112}$ of the conductive oxide layers 212a/b is in a range of 1 nm to 20 nm. In some embodiments, thickness $t_{113}$ of the FE material (e.g., perovskite, hexagonal ferroelectric, or improper ferroelectric) 213a/b is in a range of 1 nm to 20 nm. In some embodiments, the lateral thickness $t_{121}$ of the sidewall barrier seal 221a/b (insulating material) is in a range of 0.1 nm to 40 nm. In some embodiments, the lateral thickness $L_{Cfe}$ of the capacitive structure (without sidewall barrier) is in a range of 5 nm 200 nm. In some embodiments, the height $H_{Cfe}$ of the capacitive structure is in a range of 10 nm 200 nm. In some embodiments, the FE capacitive structure is without refractive inter-metallic layers 211a/b. In that case, conductive oxides layers 212a/b are in direct contact with the contacts, vias, or metals (e.g., PL, source/drain region contact of transistor MN). In some embodiments, sidewall barrier seal 221a/b is not present. In one such embodiment, the sidewalls of the layers 211a/b, 212a/n, and 213 are in direct contact with ILD (interlayer dielectric) such as SiO2.

Figure 5:
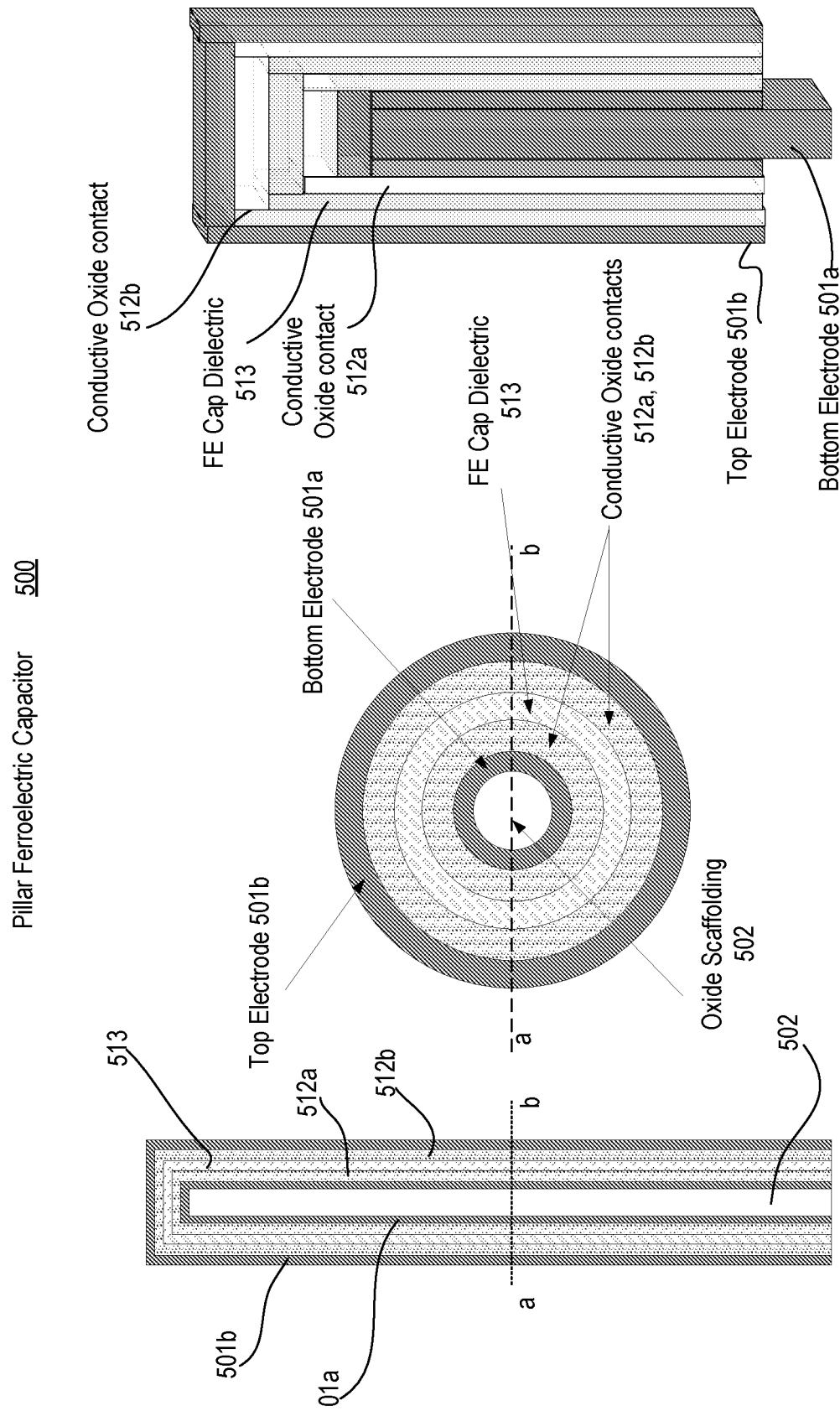
FIG. 5 illustrates a pillar FE capacitor including cross-sectional views and a 3D view, in accordance with some embodiments.

FIG. 5 illustrates FE pillar capacitor 500 including cross-sectional views and a 3D view, in accordance with some embodiments. In various embodiments, FE pillar capacitor 500 is cylindrical in shape. In some embodiments, FE pillar capacitor 500 is rectangular in shape. Taking the cylindrical shaped case for example, in some embodiments, the layers of FE pillar capacitor 500 from the center going outwards include oxide scaffolding 502, bottom electrode 501a, first conductive oxide 512a, FE material 513, second conductive oxide 512b, and top electrode 501b. A cross-sectional view along the "ab" dashed line is illustrated in the middle of FIG. 5. In some embodiments, bottom electrode 501a is conformally deposited over oxide scaffolding 502 (e.g., SiO2 or any other suitable dielectric). In some embodiments, first conductive oxide 512a is conformally deposited over bottom electrode 501a. In some embodiments, FE material 513 is conformally deposited over first conductive oxide 512a. In some embodiments, second conductive oxide 512b is con- formally deposited over FE material 513. In some embodiments, top electrode 501b is conformally deposited over second conductive oxide 512b. In some embodiments, the oxide scaffolding is etched and metal is deposited into it which becomes part of bottom electrode 501a. In some embodiments, a top section of FE pillar capacitor 500 that forms an upside-down 'U' shape is chopped off (e.g., by etching). This allows bottom electrode 501a to be accessible from the top and bottom of FE pillar capacitor 500, where bottom electrode 501a is in the center while top electrode 501b is on an outer circumference of FE pillar capacitor 500.

In various embodiments, the choice of materials for FE pillar capacitor 500 are similar to the choice of material for FE planar capacitor 400. For example, the materials for FE pillar capacitor 500 can be selected from a same group of materials listed for FE planar capacitor 400 in FIG. 2A. For example, material for bottom electrode 501a corresponds to bottom electrode 209b, material for conductive oxide 212b corresponds to first conductive oxide 512a, FE material 513 corresponds to FE material 213, material for second conductive oxide 212a corresponds to second conductive oxide 512b, and material for top electrode 209 corresponds to top electrode 501b.

In some embodiments, a first refractive inter-metallic layer (not shown) is formed between FE material 513 and first conductive oxide 512a. In some embodiments, a second refractive inter-metallic layer (not shown) is formed between FE material 513 and second conductive oxide 512b. In these cases, the first and second refractive inter-metallic layers are directly adjacent to their respective conductive oxide layers and to FE material 513. Refractive inter-metallic maintains the FE properties of the FE material 512. In the absence of refractive inter-metallic, the ferroelectric material 512 (or the paraelectric material) of pillar capacitor 500 may lose its potency. In some embodiments, refractive inter-metallic comprises Ti and Al (e.g., TiAl compound). In some embodiments, refractive inter-metallic comprises one or more of Ta, W, and/or Co. Material discussed with reference to layers 211a and 211b can be used for the first and second refractive inter-metallic layers. The thicknesses of the layers of FE pillar capacitor 500 are of the same range as similar layers discussed in FIG. 4 for FE planar capacitor 400.

Figure 6:
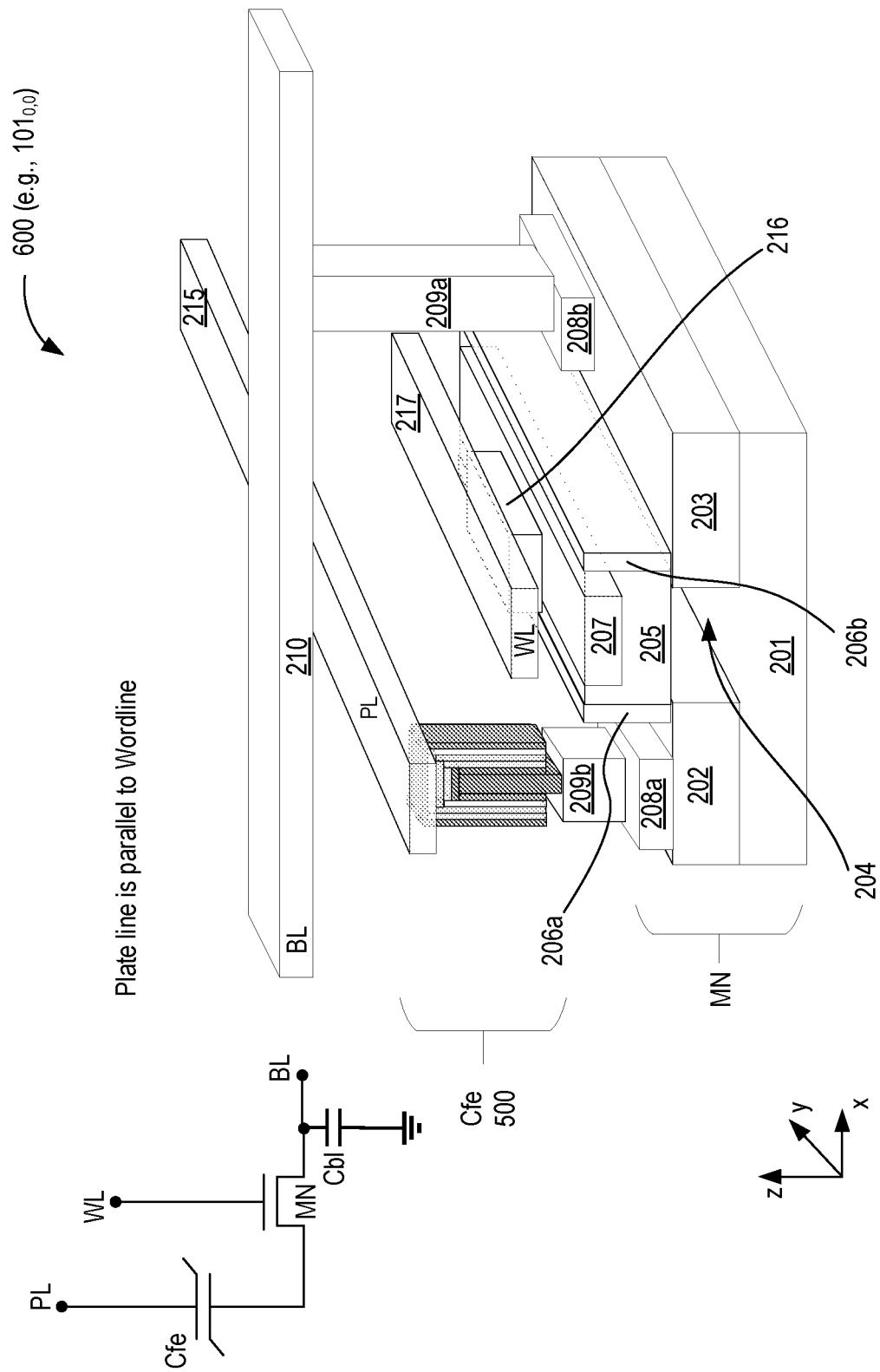
FIG. 6 illustrates a 3D view of an FE memory bit-cell comprising a planar transistor and a pillar FE capacitor, where plate-line is parallel to word-line, in accordance with some embodiments.

FIG. 6 illustrates a 3D view of FE memory bit-cell 600 comprising a planar transistor MN and pillar FE capacitor 500, where plate-line 215 is parallel to word-line 217, in accordance with some embodiments.

Figure 7:
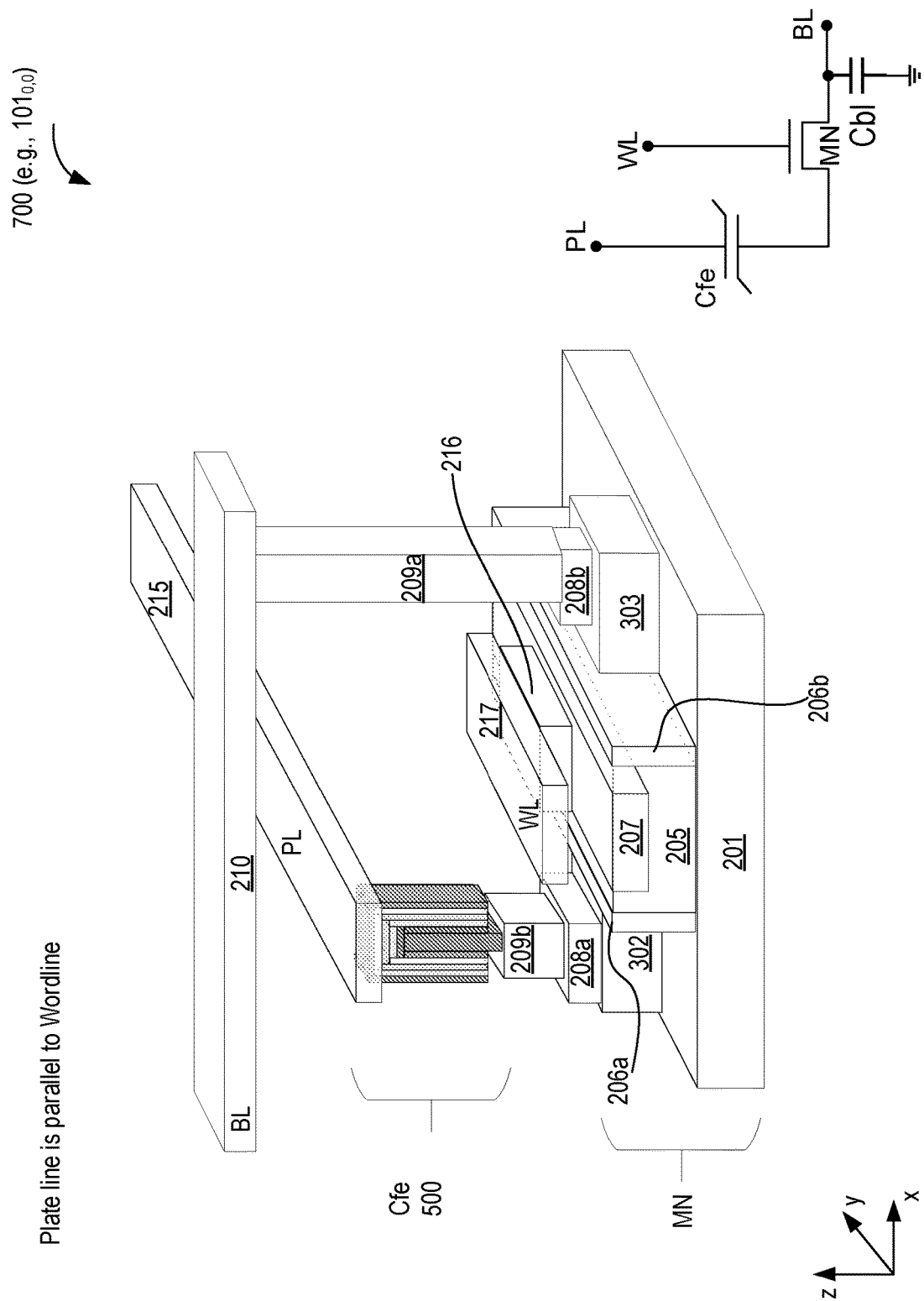
FIG. 7 illustrates a 3D view of an FE memory bit-cell comprising a non-planar transistor and a pillar FE capacitor, where plate-line is parallel to word-line, in accordance with some embodiments.

FIG. 7 illustrates a 3D view of an FE memory bit-cell 700 comprising a non-planar transistor MN and pillar FE capacitor 500, where plate-line 215 is parallel to word-line 217, in accordance with some embodiments. For both FIG. 6 and FIG. 7, the descriptions of FIG. 2A and FIG. 3, respectively, are applicable. The coupling of layers, material types, etc., are described in FIG. 2A and FIG. 3, and not repeated here.

Figure 8:
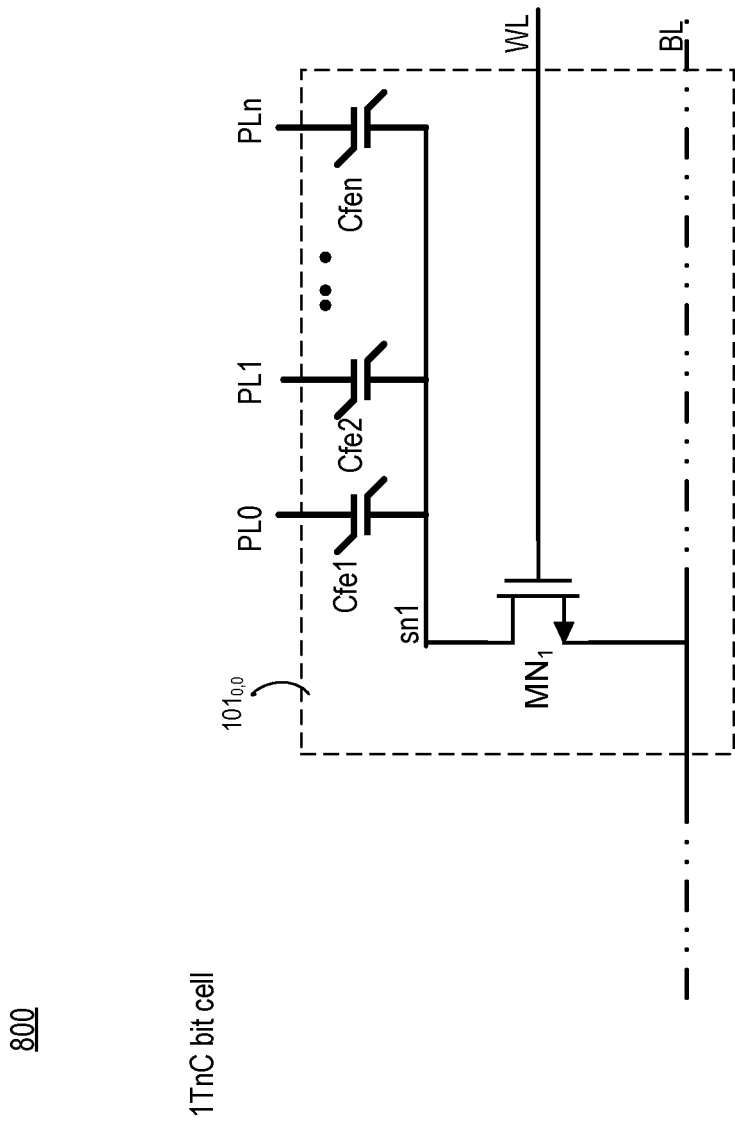
FIG. 8 illustrates a bit-cell comprising one transistor and 'n' FE capacitors (1TnC), in accordance with some embodiments.

FIG. 8 illustrates bit-cell 800 (e.g., $101_{0,0}$) comprising one transistor and 'n' FE capacitors (1TnC), in accordance with some embodiments. In some embodiments, bit-cell 800 comprises n-type transistor $MN_1$, bit-line (BL), word-line (WL), and 'n' number of ferroelectric (or paraelectric) capacitors Cfe1 through Cfen. In various embodiments, the gate terminal of n-type transistor $MN_1$ is coupled to WL. In some embodiments, the drain or source terminal of n-type transistor $MN_1$ is coupled to BL.

In various embodiments, first terminals of each of the capacitors Cfe1 through Cfen is coupled to a storage node sn1, which is coupled to a source or drain terminal of n-type transistor $MN_1$. In some embodiments, second terminals of each of the capacitors Cfe1 through Cfen is coupled to a corresponding plate-line (PL). For example, the second terminal of Cfe1 is coupled to PL0, the second terminal of Cfe2 is coupled to PL01, and so on. In some embodiments, ferroelectric (or paraelectric) capacitors Cfe1 through Cfen are planar capacitors such as those discussed with reference to FIG. 4. In some embodiments, ferroelectric (or paraelectric) capacitors Cfe1 through Cfen are pillar capacitors such as those discussed with reference to FIG. 5. In some embodiments, the ferroelectric (or paraelectric) capacitors Cfe1 through Cfen are vertically stacked allowing for tall bit-cells (e.g., higher in the z-direction) but with same x-y footprint as a 1T1C bit-cell of FIG. 1A. The concept of vertical stacking of capacitors is also referred here as folding of the capacitors in a vertical direction. By folding the capacitors, the diffusion capacitance on the BL reduces for a given array size, which improves reading speed. Further, folding the capacitors lowers the effective routing capacitance on the BL.

In this example, the x-y footprint is determined by the size of transistor MN1 and its connections to BL, WL, and storage node sn1. In some embodiments, the size can be limited by minimum capacitor area footprint that can be printed, and is required to be of a certain dimension due to sense-charge requirements. In some embodiments, PL (e.g., PL0, PL1, . . . PLn) controls which cell within the same access transistor gets programmed, and the value of programming In some embodiments, BL acts as a sense-line. The voltage on BL (e.g. sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In standby mode (e.g., low power mode), the 1TnC bit-cell is not refreshed as there is no disturb mechanism during standby.

In some embodiments, a method is provided for forming the 1TnC bit-cell. The method comprises forming a node and forming a first capacitor comprising non-linear polar material, the first capacitor having a first terminal coupled to the node and a second terminal coupled to a first plate-line. In some embodiments, the method comprises forming a second capacitor comprising the non-linear polar material, the second capacitor having a first terminal coupled to the node and a second terminal coupled to a second plate-line. In some embodiments, the method comprises forming a transistor coupled to the node and a bit-line, wherein the transistor is controllable by a word-line. In some embodiments, the method comprises vertically stacking the first capacitor and the second capacitor over one another. In some embodiments, the first capacitor and the second capacitor are pillar capacitors that are cylindrical in shape. In some embodiments, vertically stacking the first capacitor and the second capacitor over one another is performed such that the first terminals of the first capacitor and the second capacitor is a conducting electrode that passes through centers of the first capacitor and the second capacitor.

In some embodiments, forming the first capacitor or the second capacitor comprises forming a first layer comprising a first conducting material, wherein the first layer is coupled to the first terminal of the first capacitor. In some embodiments, the method comprises forming a second layer comprising a first conducting material, wherein the second material is around the first layer. In some embodiments, the method comprises forming a third layer comprising the non-linear polar material, wherein the third layer is around the second layer. In some embodiments, the method comprises forming a fourth layer comprising a second conducting material, wherein the fourth material is around the third layer. In some embodiments, the method comprises a fifth layer comprising a second conducting material, wherein the first plate-line is partially coupled to the fifth layer. In some embodiments, the first layer has a first circumference, wherein the second layer has a second circumference, wherein the third layer has a third circumference, wherein the fourth layer has a fourth circumference, and wherein the fifth layer has a fifth circumference, wherein the fourth circumference is larger than the third circumference, wherein the third circumference is larger than the second circumference, wherein the second circumference is larger than the first circumference. In some embodiments, the method comprises fabricating logic to refresh a first charge on the first capacitor, and to refresh a second charge on the second capacitor during an active mode. In some embodiments, the logic refreshes periodically. In some embodiments, the first plate-line, the second plate-line, and the word-line are parallel relative to one another. In some embodiments, the first plate-line, the second plate-line, and the bit-line are parallel relative to one another. In some embodiments, the first capacitor and the second capacitor are planar capacitors, wherein the first capacitor and the second capacitor are stacked one over another such that the first terminals of the first capacitor and the second capacitor are coupled through a via.

In some embodiments, the non-linear polar material includes one of: ferroelectric material, paraelectric material, or non-linear dielectric. In some embodiments, the non-linear polar material of the first capacitor is partially polarized to store multiple data values. In some embodiments, the method comprises applying the first plate-line with different voltages at different times to create partially polarized states in the non-linear polar material of the first capacitor. In some embodiments, the first plate-line is applied with a constant voltage via a time pulse having different widths to create partially polarized states in the non-linear polar material of the first capacitor.

In some embodiments, there is a possibility of disturbance at the storage node sn1 during read operation. In some embodiments, PL is toggled for other capacitors to the average value of the disturbance that will be seen on the sn1 node. i.e. when a read pulse of some polarity is applied at PL line of the capacitor to be read, a non-zero voltage is applied on other PLs of 1TnC bit-cell 800, that matches the expected disturbance seen on the shared node. In one such example, PL line driver is configured to support driving different voltage levels on different PLs.

Figure 9:
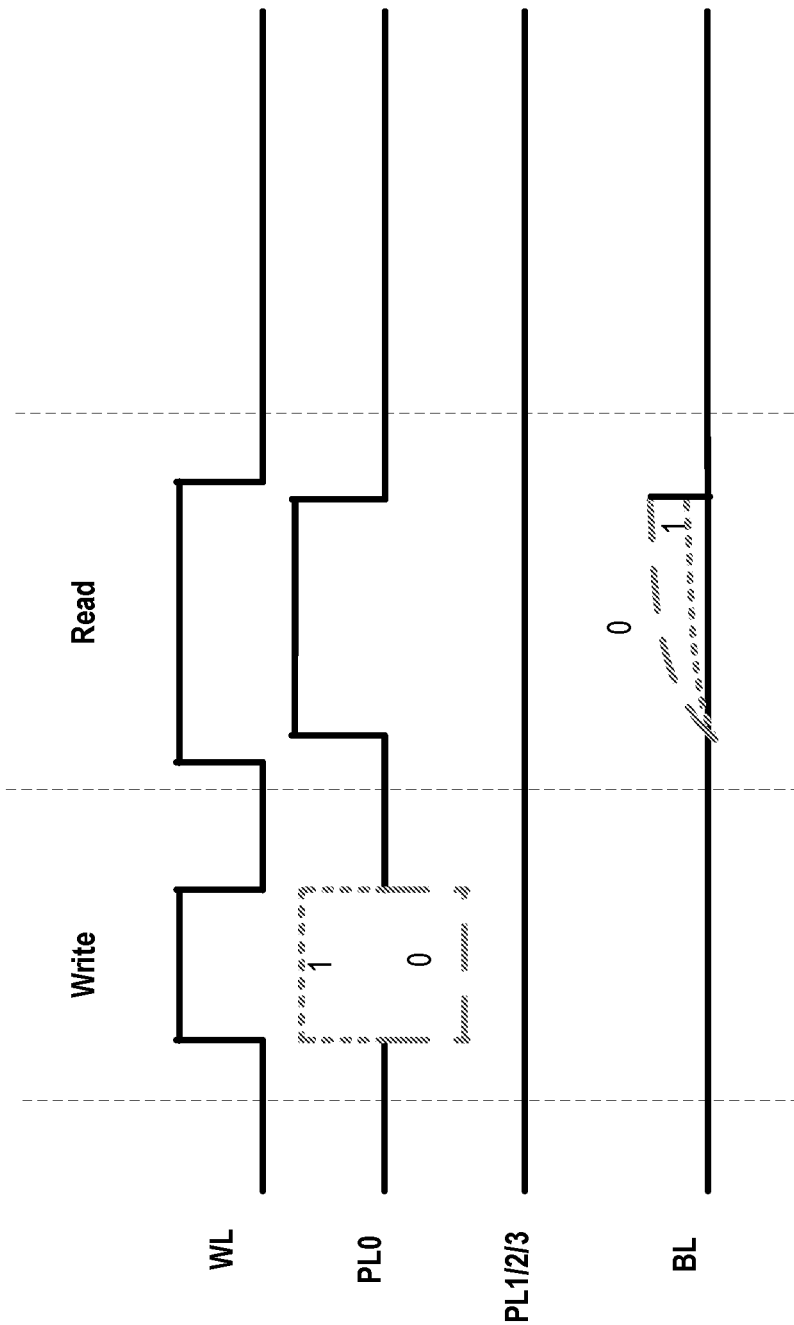
FIG. 9 illustrates a timing diagram showing read and write operations of the bit-cell of FIG. 8, in accordance with some embodiments.

FIG. 9 illustrates timing diagram 900 showing read and write operations of the bit-cell of FIG. 8, in accordance with some embodiments. In various embodiments, during write operation, WL is asserted (e.g., WL pulse is generated) which turns on transistor MN. The polarity of the bit to be stored depends on the polarity of PL0. When PL0 is a logic 1, a logic 1 is being written to FE capacitor (or paraelectric capacitor) Cfe1 coupled to PL0. When PL0 is a logic −1, a logic 0 is being written to FE capacitor (or paraelectric capacitor) Cfe1 coupled to PL0. Likewise, other PLs are biased to store bits in corresponding capacitors. In some embodiments, one capacitor is written at a time by biasing the respective PL. In some embodiments, the capacitors Cfe1 through Cfen are written to simultaneously via their respective PLs. In some embodiments, when one capacitor is being written to, the PL for that capacitor is biased (either to logic 1 or to negative supply level) while the other PLs are set to zero (e.g., ground voltage). The BL remains zero (at ground level) when data is written to the FE capacitors (or paraelectric capacitors) of the 1TnC. After write operation is over, WL pulse is de-asserted back to logic low (ground).

In various embodiments, during read operation, WL pulse is asserted followed by asserting the PL for the capacitor being read. In this example, PL0 is asserted to read contents from capacitor Cfe1. During the time PL0 is asserted, when BL rises to logic level 1, then a zero is read out from the capacitor Cfe1 coupled to PL0. During the time PL0 is asserted, when BL rises to voltage level between supply (Vdd) and ground, then a logic 1 is read out from the capacitor Cfe1 coupled to PL0. In some embodiments, a level-sensitive sense amplifier coupled to BL is used to sense the voltages on BL. In various embodiments, one capacitor is read at a time. In some embodiments, PLs for other capacitor structures within the 1TnC or multi-element FE gain bit-cell, which are not being read, can be driven to a non-zero value, to reduce the read disturbance field that will be seen across the capacitors that share the same bit-cell. As such, the capacitors share one of the node together, thereby seeing the sense-voltage induced field across them. In this case, the PL for capacitors that are not being read can be driven to alternate voltage levels to reduce the disturb effect on them.

Figure 10:
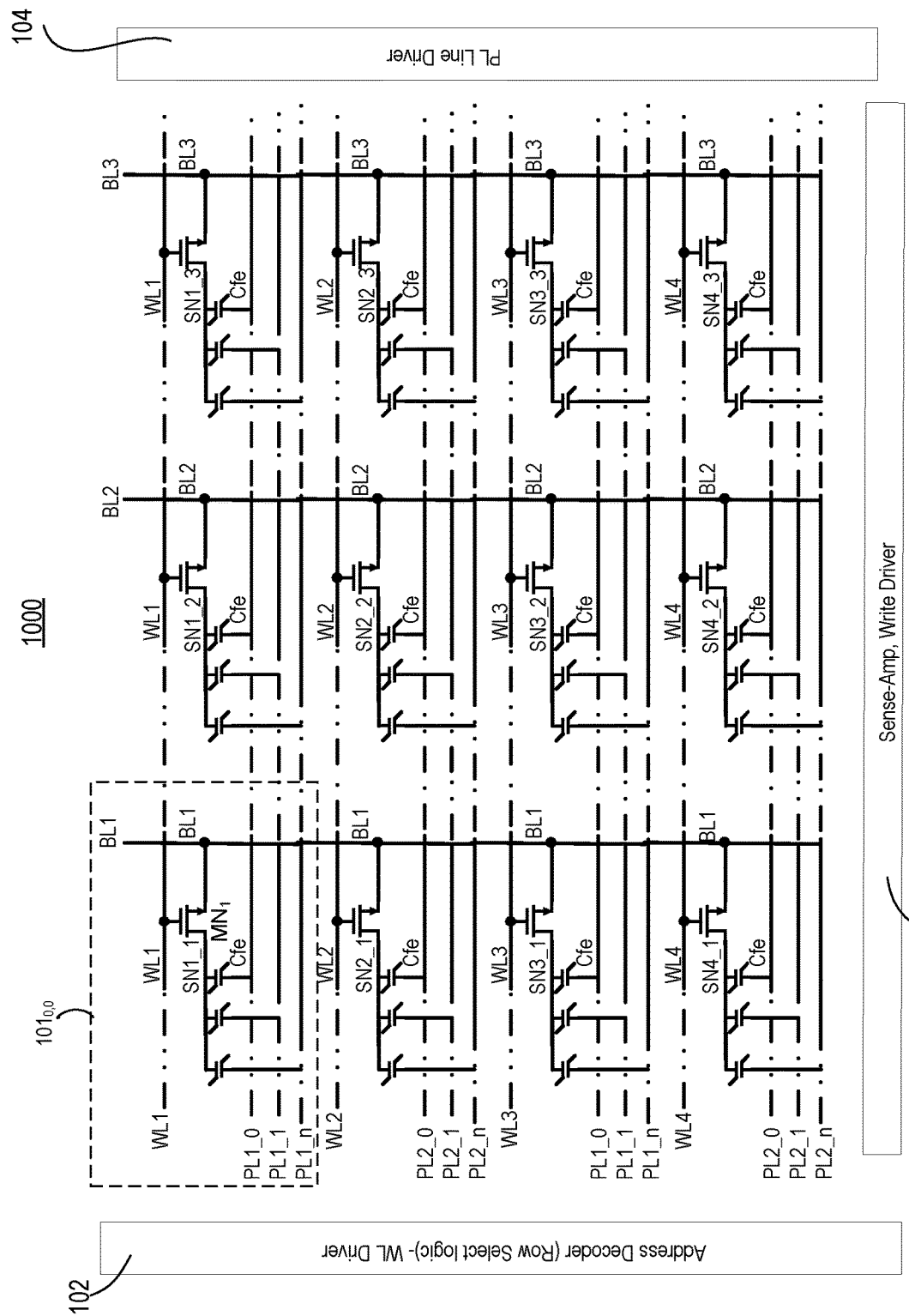
FIG. 10 illustrates a memory array with 1TnC bit-cells, in accordance with some embodiments.

FIG. 10 illustrates a memory array 1000 with 1TnC bit-cells, in accordance with some embodiments. This example is similar to memory array 101, but for a 3×3 array of 1TnC bit-cells. A column of bit-cells shares the same BL, while a row of bit-cells shares the same WL. In various embodiments, each row of bit-cells shares the PLs. In some embodiments, each bit-cell has a stack of capacitors. For a 512×512 array, there will be 512 BLs, 512 WLs, 512 transistors, 512×n PL connections, where n PL layers are stacked vertically, and 512×n capacitors, where 'n' capacitors are stacked vertically.

FIGS. 11A-H illustrate cross-sections 1100, 1120, 1130, 1140, 1150, 1160, 1170, and 1180, respectively, of 1TnC bit-cells showing formation of the 1TnC bit-cells, where the FE capacitors are planar capacitors on respective pedestals, in accordance with some embodiments. In cross-section 1100, the snapshot shows several processing steps and their results. In this example, four transistors are shown, each controlled by its respective WL on its gate terminal. The source and drain terminals of each transistor is coupled to respective contacts (CA). A pair of transistors are grouped together and separated from other pairs via isolation region. Etch stop layer is used in the fabrication of vias (via0) to connect the source and drain of the transistors to BLs on metal-1 (M1) layer. Another etch stop layer is formed over M1 layer to fabricate vias (via1) to couple to respective M1 layers. In some embodiments, metal-2 (M2) is deposited over vias (via1). M2 layer is then polished. In some embodiments, the capacitor can be moved further up in the stack, where the capacitor level processing is done between different layers. In some embodiments, BL can be escaped on a different layer than shown.

Cross-section 1120 shows deposition on an etch stop layer over the polished M2 layer. In some embodiments, oxide is deposited over the etch stop layer. Thereafter, dry or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

Cross-section 1130 shows formation of planar ferroelectric or paraelectric capacitors on the pedestals. A number of fabrication processes of deposition, lithography, and etching takes place to form the stack of layers for the planar capacitor, which is discussed with reference to FIG. 2A and FIG. 4. In some embodiments, the planar ferroelectric or paraelectric capacitors are formed in a backend of the die. Cross-section 1140 shows deposition of ILD followed by surface polish. Cross-section 1150 shows formation of PL over top electrode of each capacitor. In this case, after polishing the surface as shown in cross-section 1140, ILD is deposited. Thereafter, holes are etched through the ILD to expose the top electrodes of the capacitors. The holes are then filled with metal. Followed by filling the holes, the top surface is polished. As such, the capacitors are connected to PL and storage nodes (through the pedestals). Cross-section 1150 shows another step of ILD deposition over the polished surface. Holes for via are then etched to contact the M2 layer. The holes are filled with metal to form vias (via2). The top surface is then polished. Cross-section 1160 shows the repetition of the process of depositing metal over the vias (via2), depositing ILD, etching holes to form pedestals for the next capacitors of the stack, forming the capacitors, and then forming vias that contact the M3 layer. This process is repeated 'n' times for forming 'n' capacitors in a stack as shown in cross-section 1170

Figure 11A:
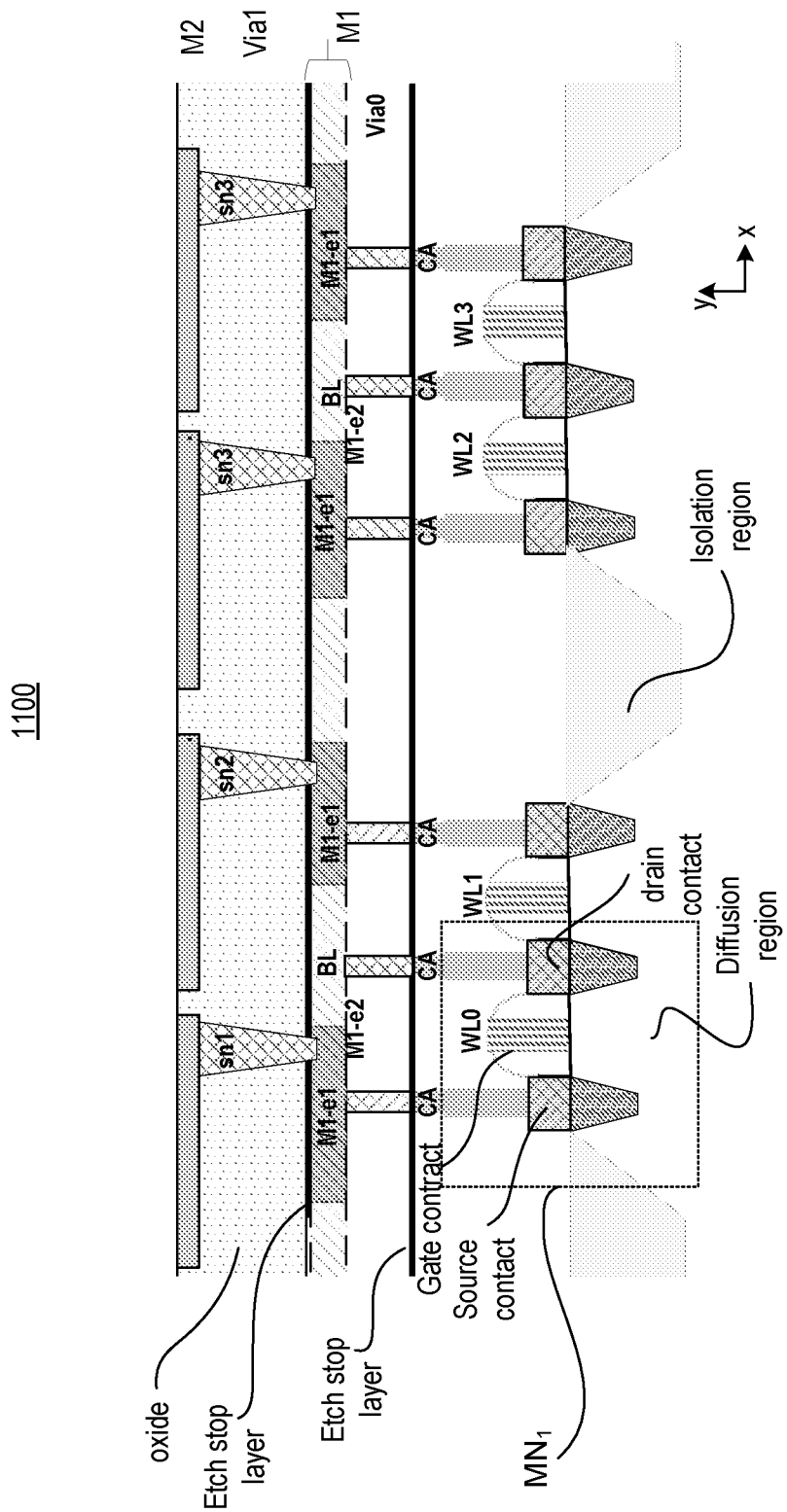
FIGS. 11A-H illustrate cross-sections of 1TnC bit-cells showing formation of the 1TnC bit-cells, where the FE capacitors are planar capacitors on respective pedestals, in accordance with some embodiments.
Figure 11B:
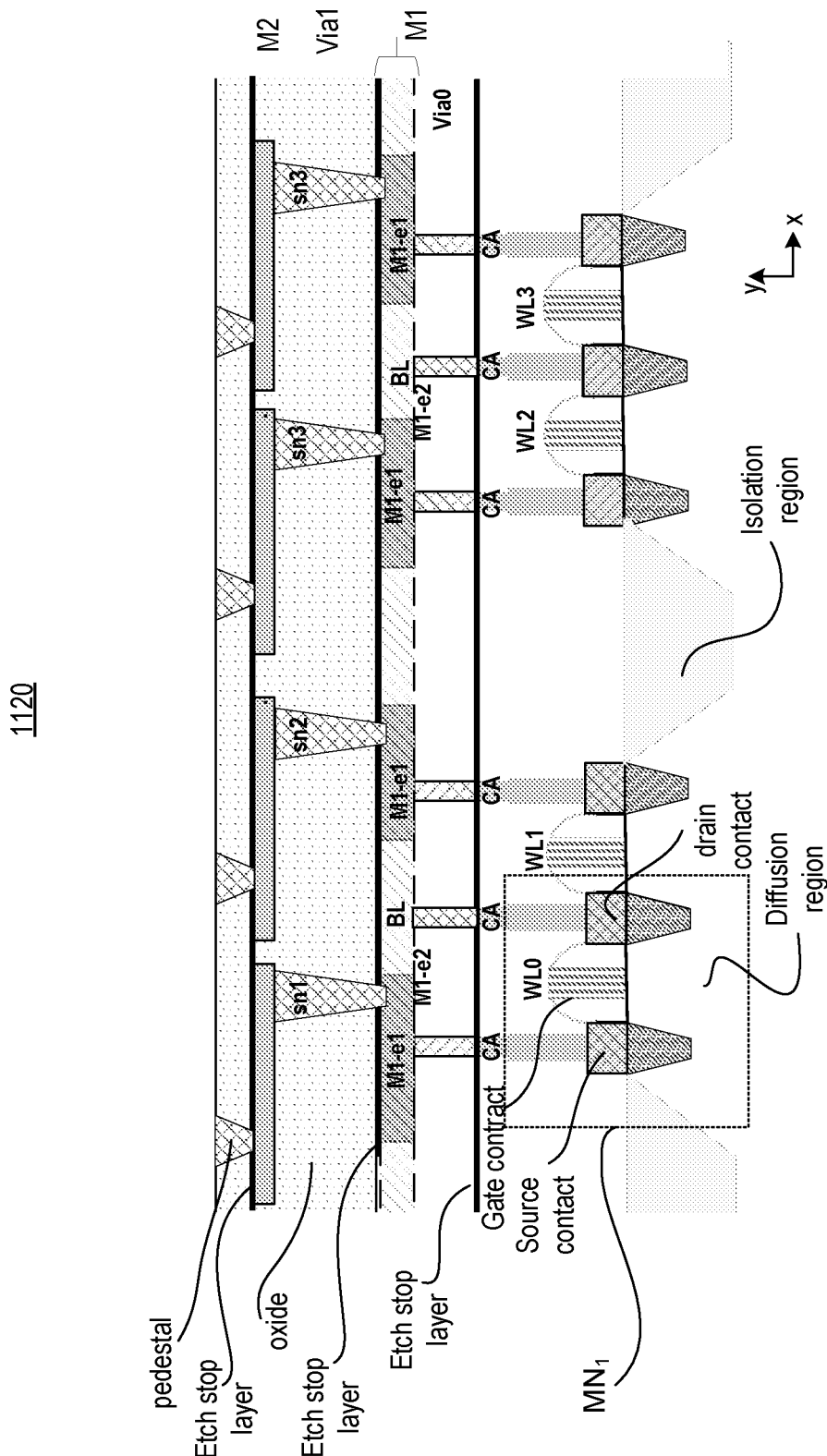
Figure 11C:
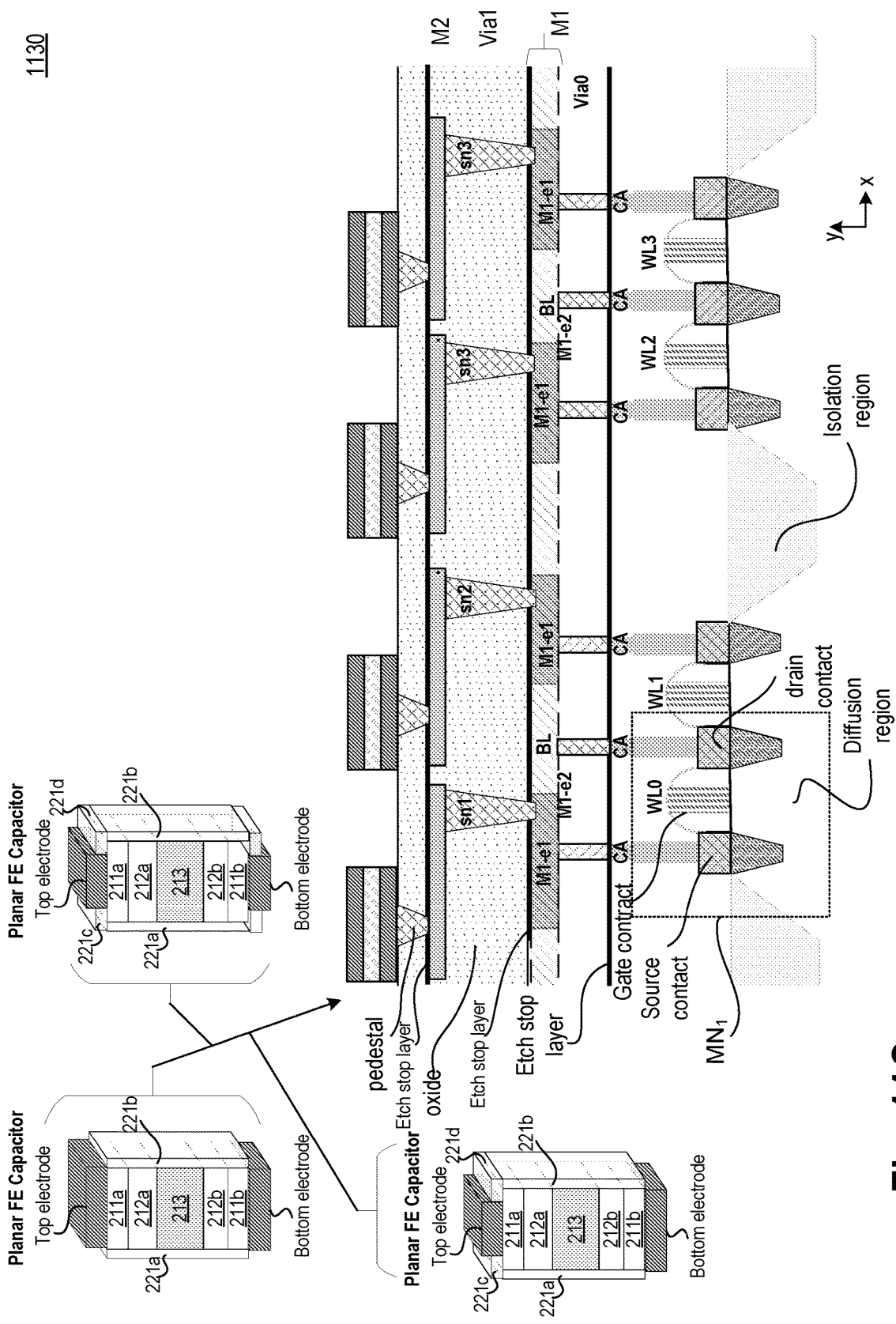
Figure 11D:
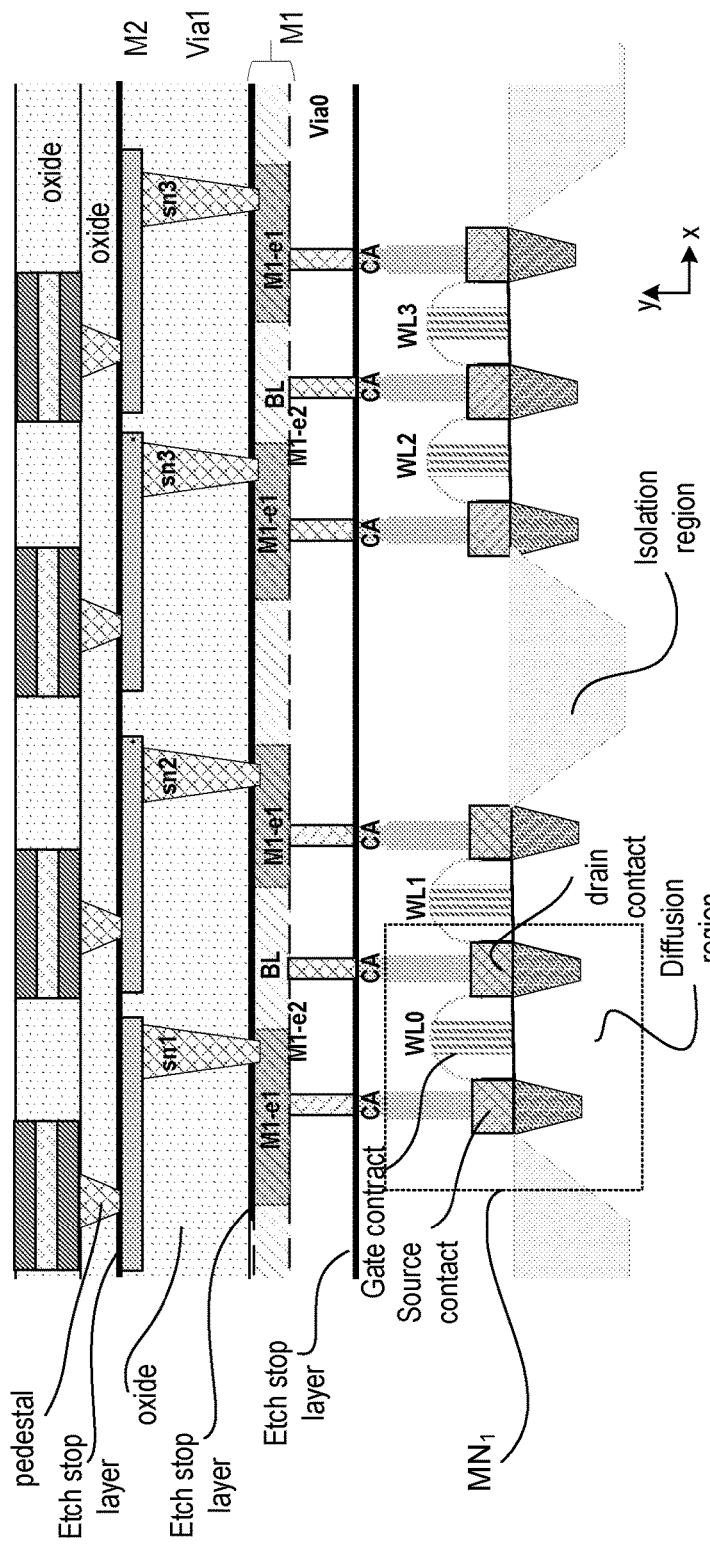
Figure 11E:
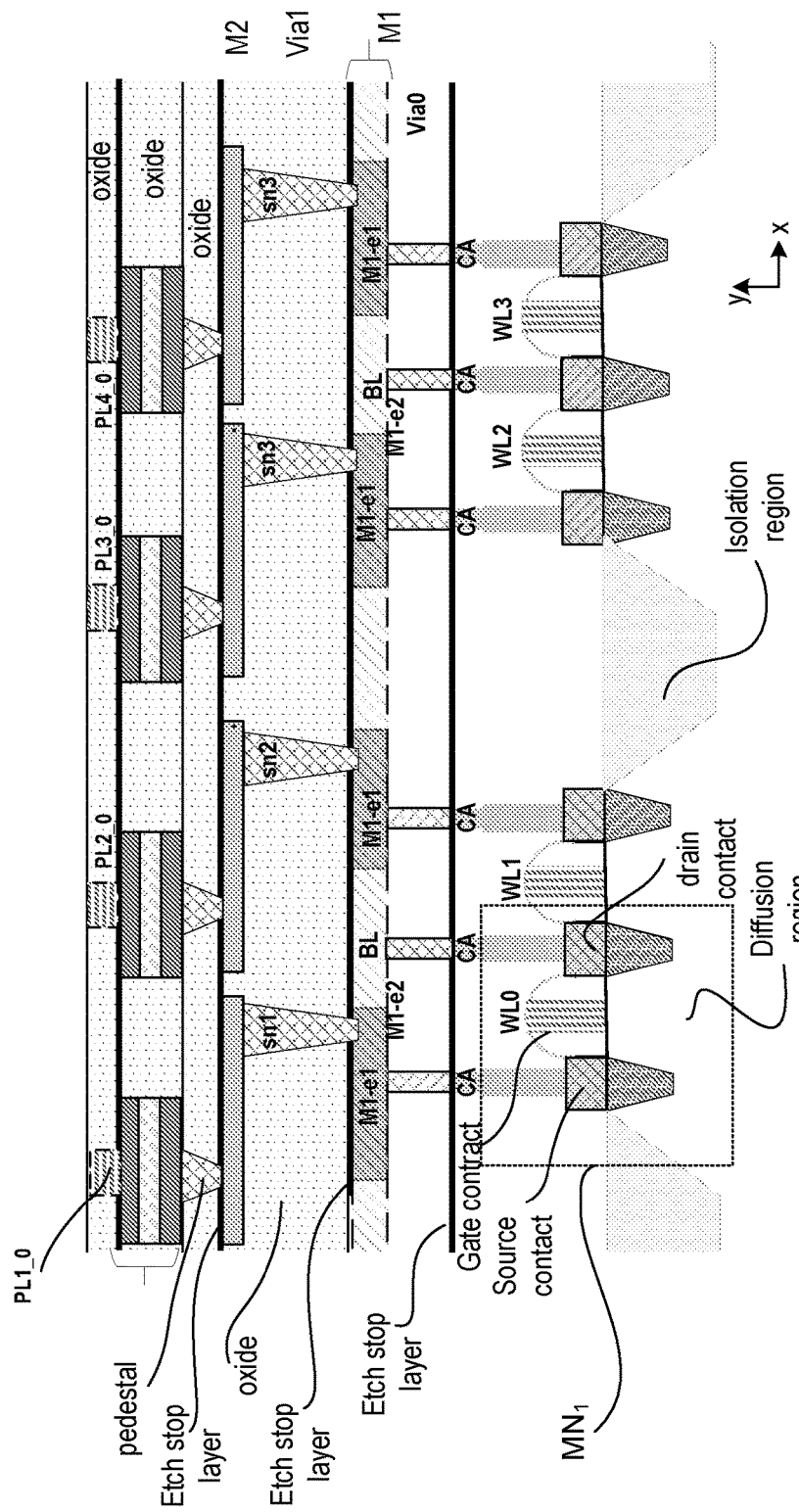
Figure 11F:
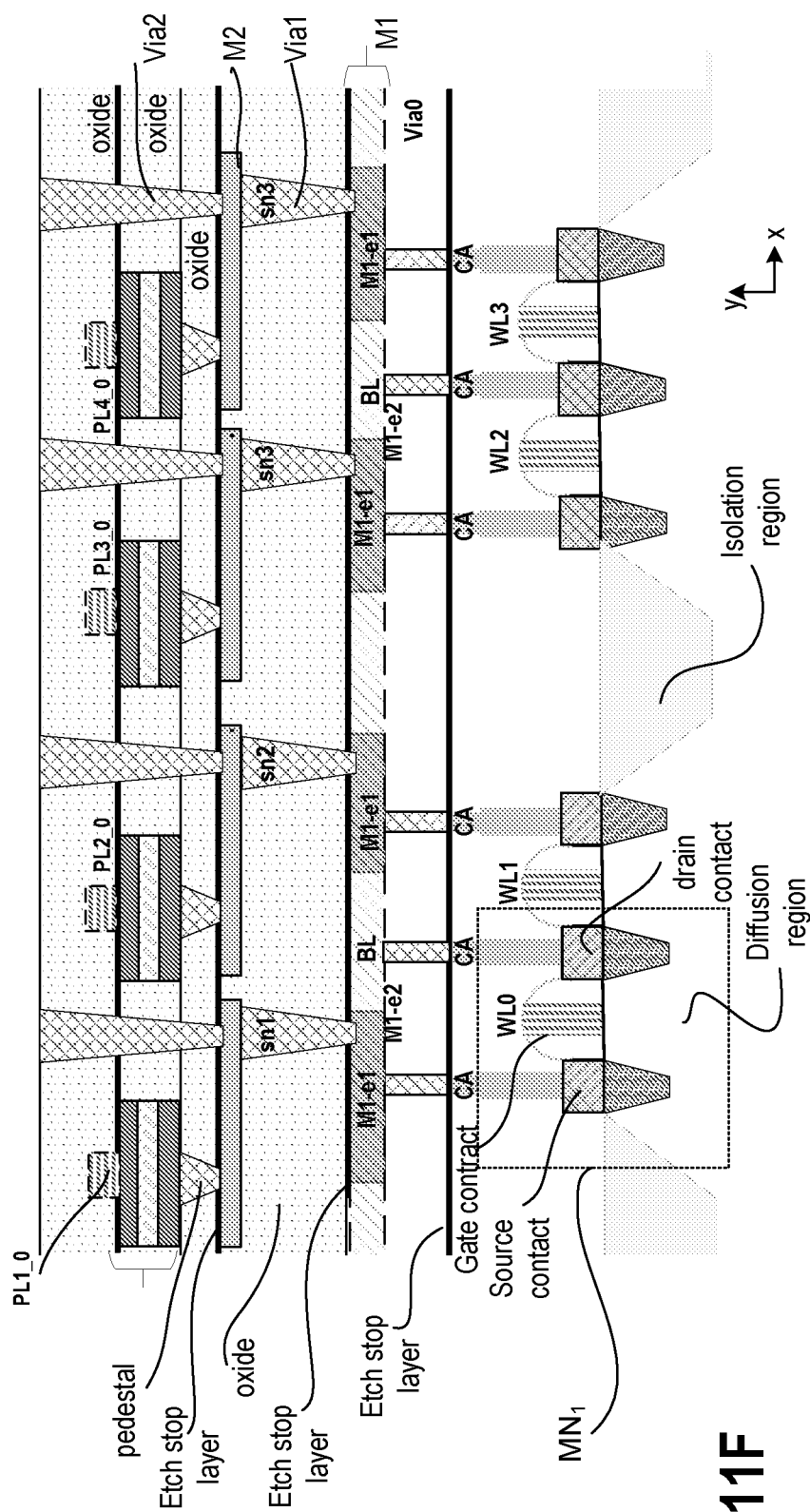
Figure 11G:
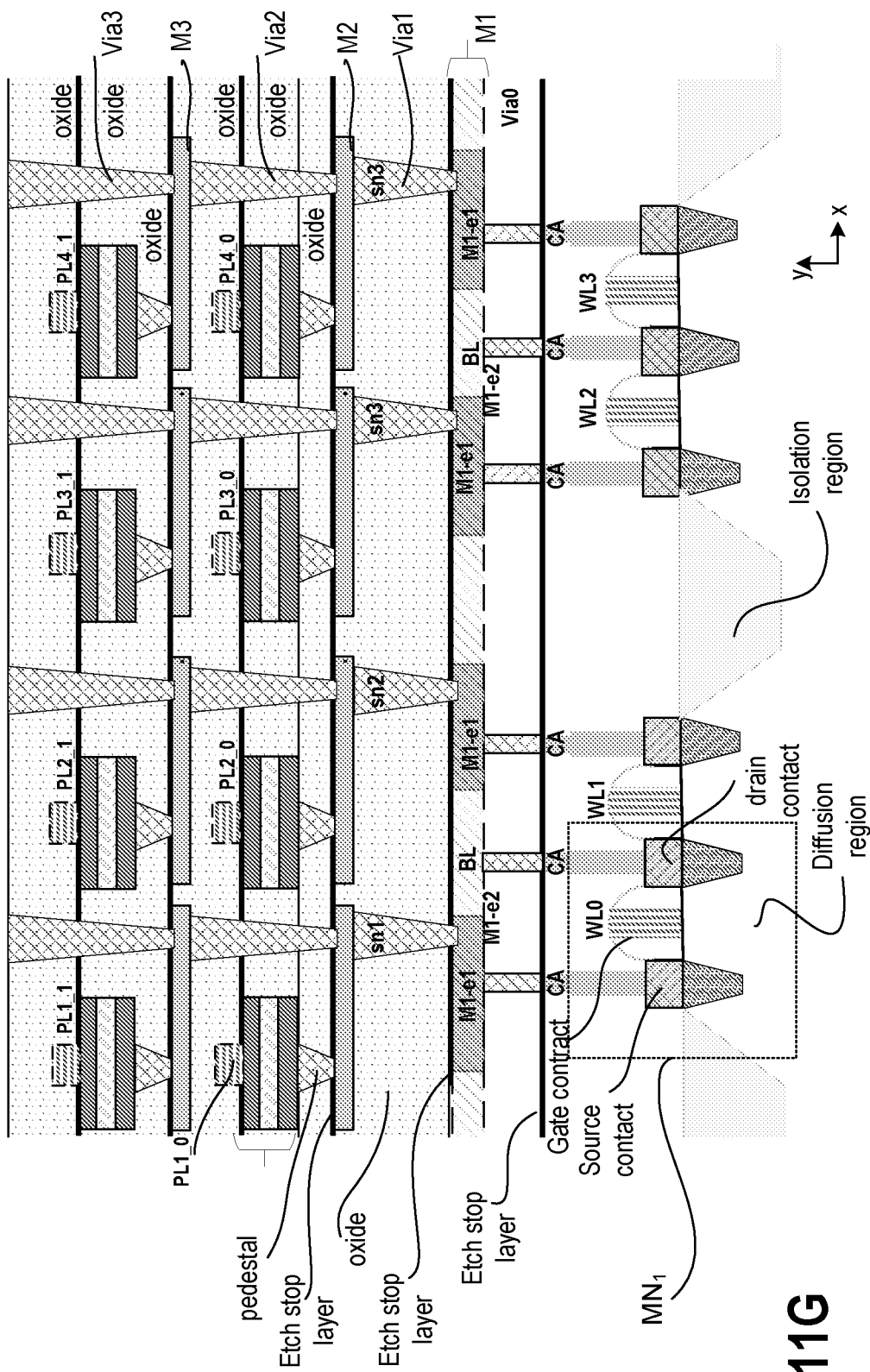
Figure 11H:
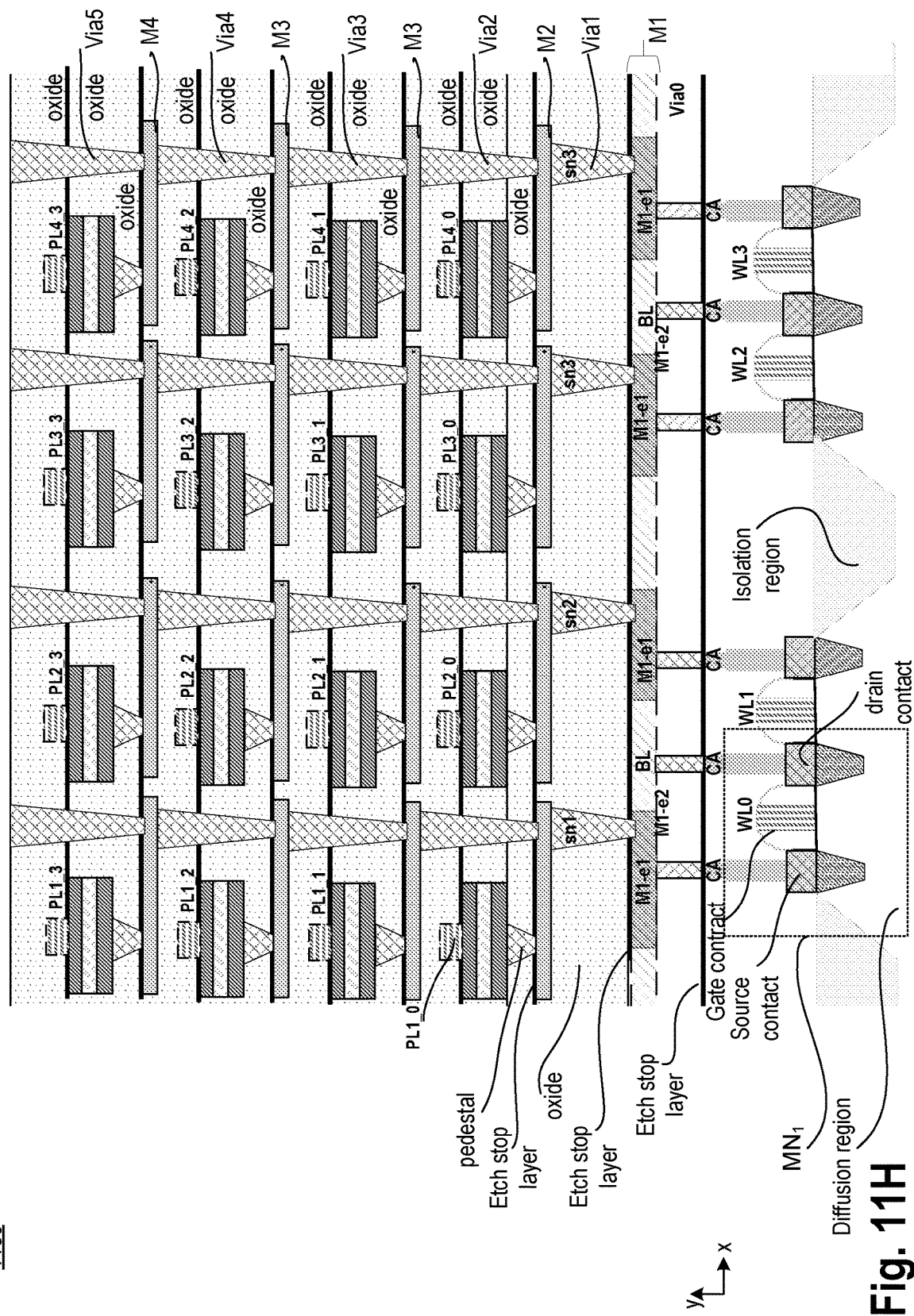
Figure 11I:
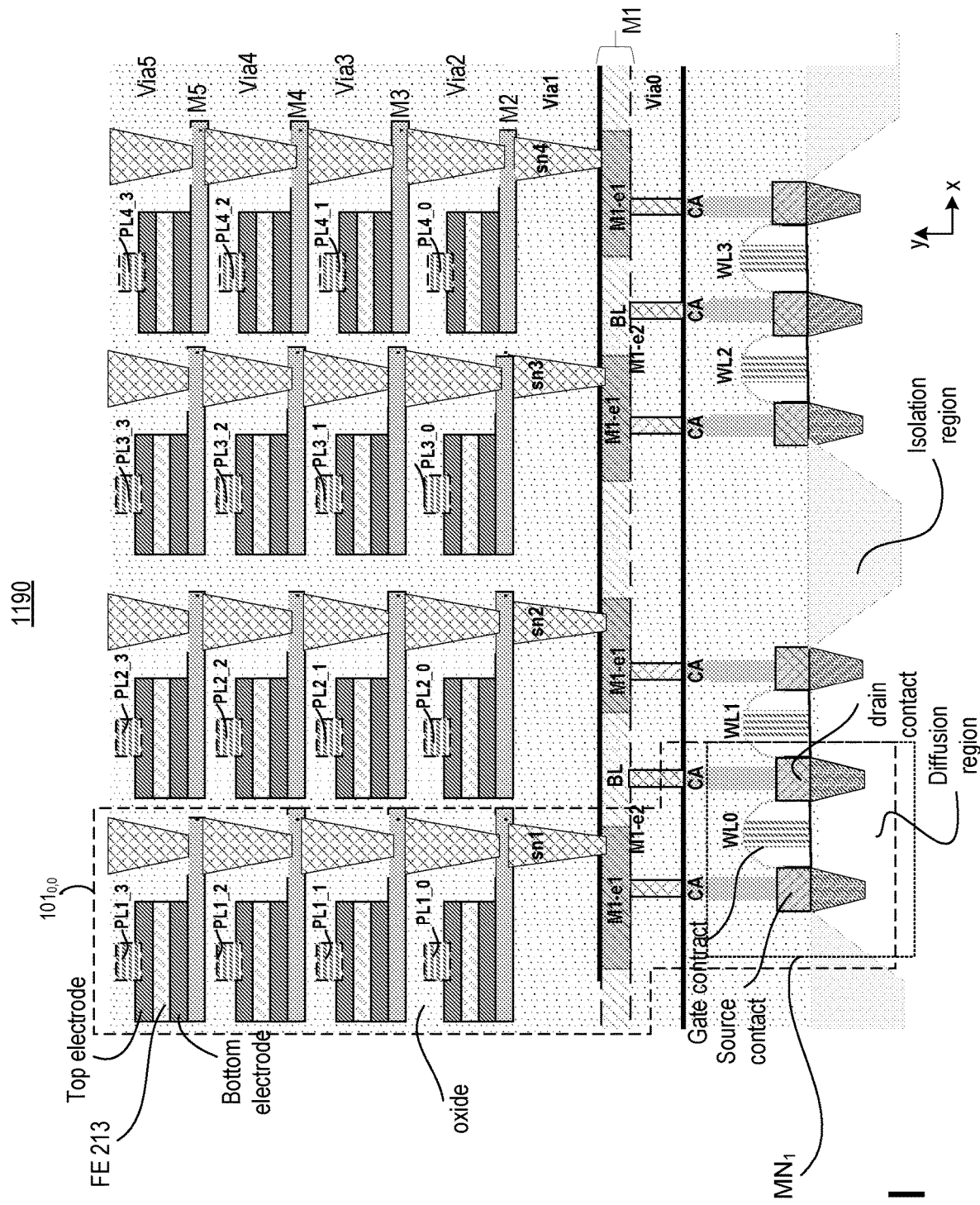
FIG. 11I illustrates a cross-section of 1TnC bit-cells where the FE capacitors are planar capacitors on respective metal layers, in accordance with some embodiments.

FIG. 11I illustrates cross-section 1190 of 1TnC bit-cells where the FE capacitors are planar capacitors on respective metal layers, in accordance with some embodiments. Compared to the fabrication processes discussed with reference to FIGS. 11A-H, pedestals are not formed. The bottom electrode of each capacitor is allowed to directly contact with the metal below. In this embodiment, the height of the stacked capacitors is lowered, and the fabrication process is simplified because the extra steps for forming the pedestals are removed.

Figure 11J:
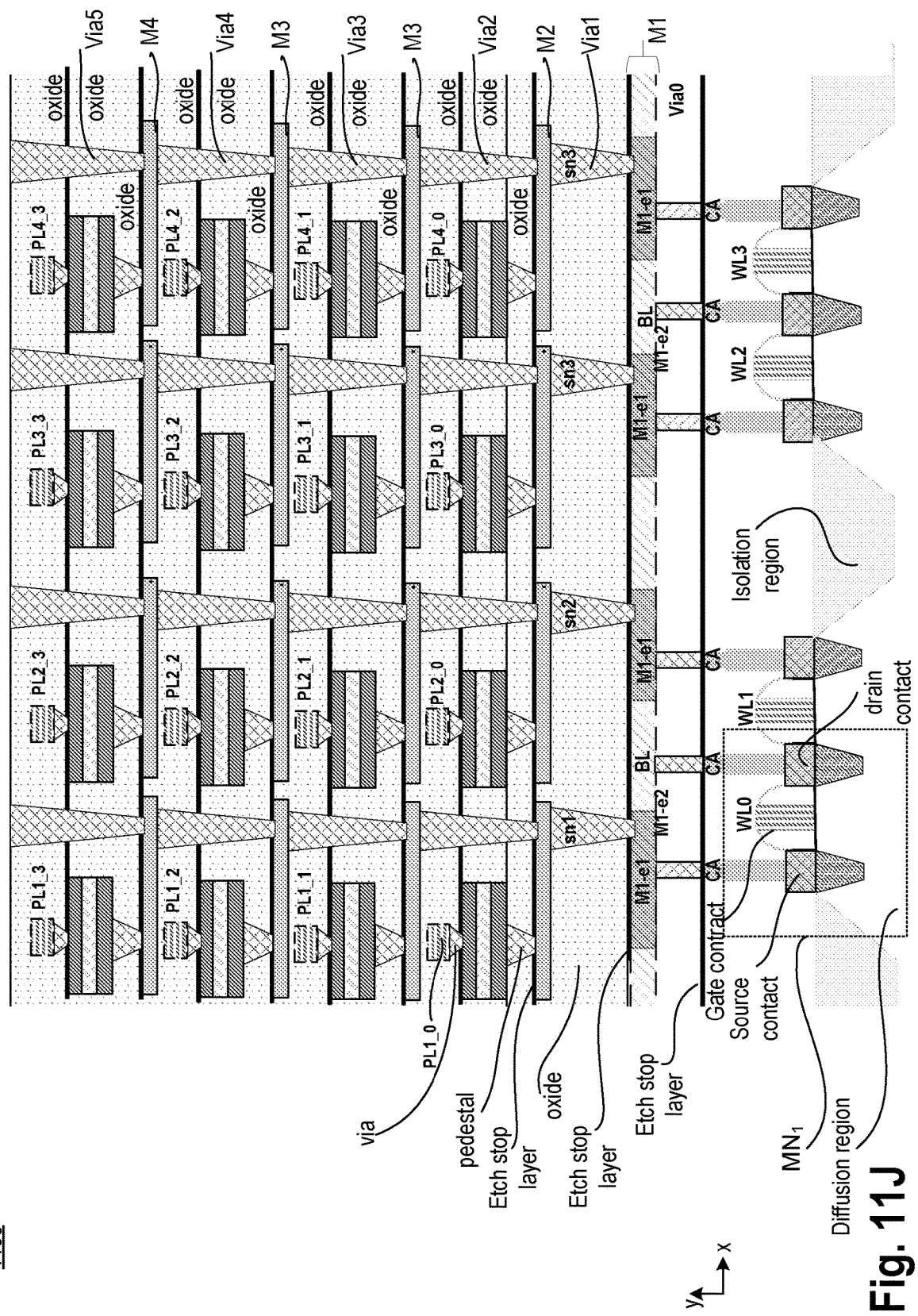
FIG. 11J illustrates cross-section of 1TnC bit-cells where the FE capacitors are planar capacitors on respective metal layers through vias or pedestals, in accordance with some embodiments.

FIG. 11J illustrates cross-section 1195 of 1TnC bit-cells where the FE capacitors are planar capacitors on respective metal layers through vias or pedestals, in accordance with some embodiments. Compared to the fabrication processes discussed with reference to FIGS. 11A-H, pedestals or vias are formed for both the top and bottom electrodes of the FE capacitor. In this embodiment, the height of the stacked capacitors is raised, and the fabrication process adds an additional step of forming a top pedestal or via which contacts with the plate-line (PL).

Figure 12:
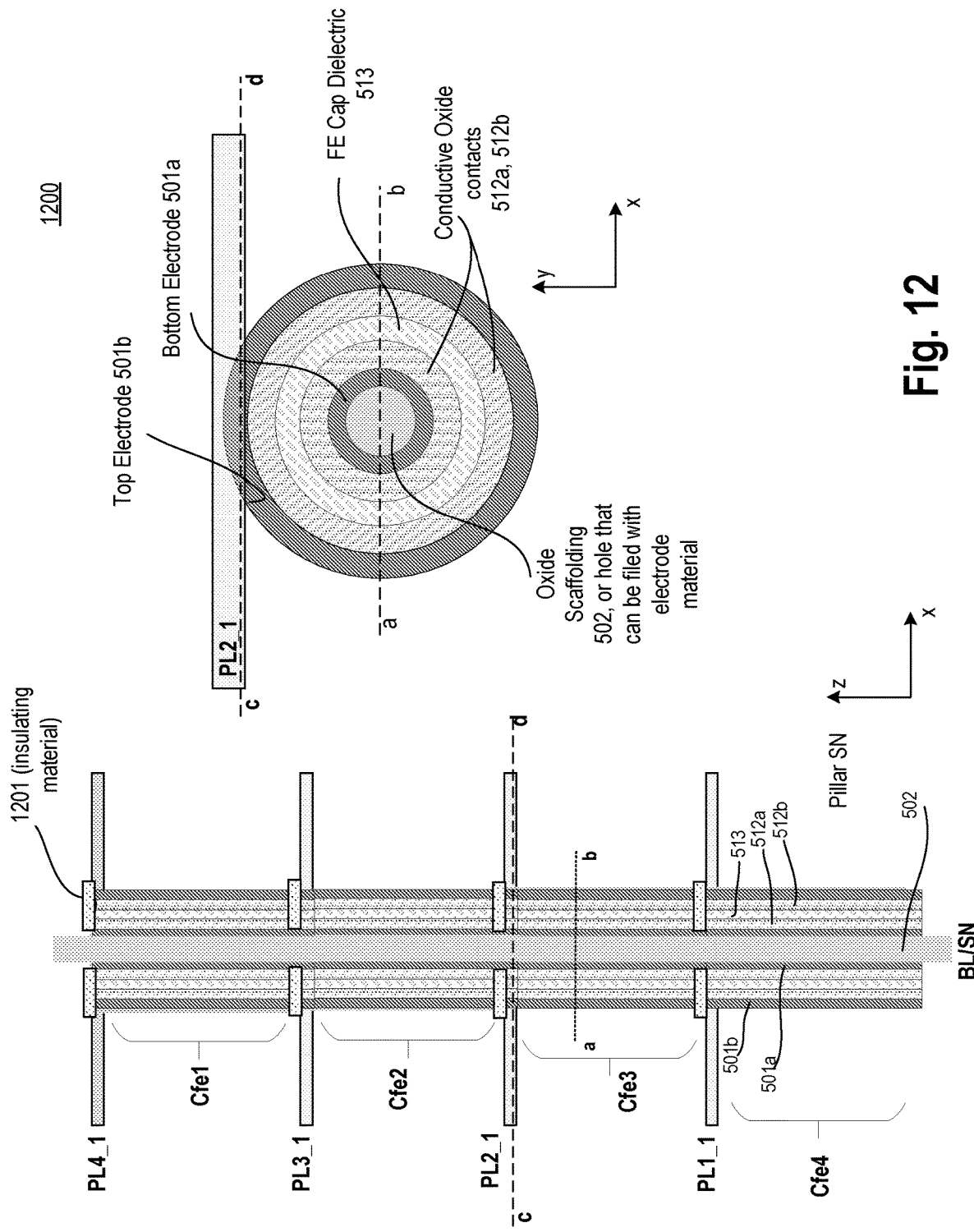
FIG. 12 illustrates a tower of pillar capacitors with shared bit-line or storage nodes, and separate plate-lines for each pillar capacitor, in accordance with some embodiments.

FIG. 12 illustrates tower 1200 of pillar capacitors with shared bit-line or storage node, and separate plate-lines for each pillar capacitor, in accordance with some embodiments. An example of pillar capacitor is discussed with reference to FIG. 5. As discussed with reference to FIG. 5, the top section of the pillar capacitor is chopped off (e.g., view etching) leaving circular layers around one another as shown in cross-section "ab". Each capacitor formed over the other capacitor is insulated by insulating material 1201. Any suitable non-conductive insulating material may be used. In this example, four capacitors Cfe1, Cfe2, Cfe3, and Cfe4 are shown in a vertical stack. However, any number of capacitors may be stacked. The center core (or oxide scaffolding) 502 of the capacitors is etched to remove the ILD and is filled with metal that directly connects to bottom electrode 501a via metal core 502. Plate-lines are extended over a section of top electrode 501b for each capacitor as shown in the cross-sectional view. The core metal passing through the center of the capacitors is coupled to BL or storage node SN, in accordance with some embodiments. While the embodiments are shown for a cylindrical pillar capacitor, the same concept can be applied to a square or square-like pillar capacitor.

Figure 13:
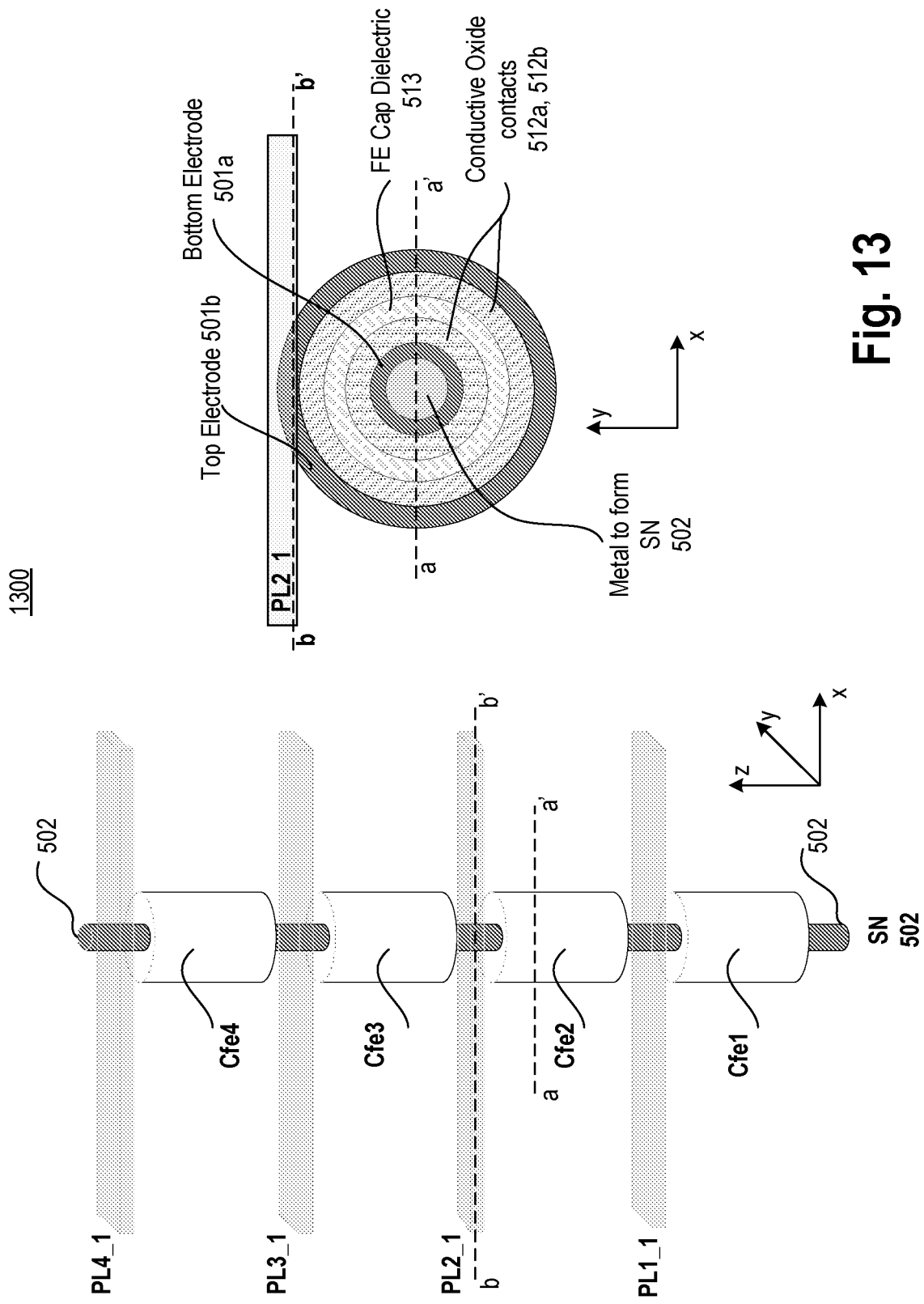
FIG. 13 illustrates a 3D view of a tower of pillar capacitors with shared bit-line or storage node, and separate plate-lines for each pillar capacitor, in accordance with some embodiments.

FIG. 13 illustrates 3D view 1300 of a tower of pillar capacitors of FIG. 12 with shared bit-line or storage node, and separate plate-lines for each pillar capacitor, in accordance with some embodiments.

Figure 14:
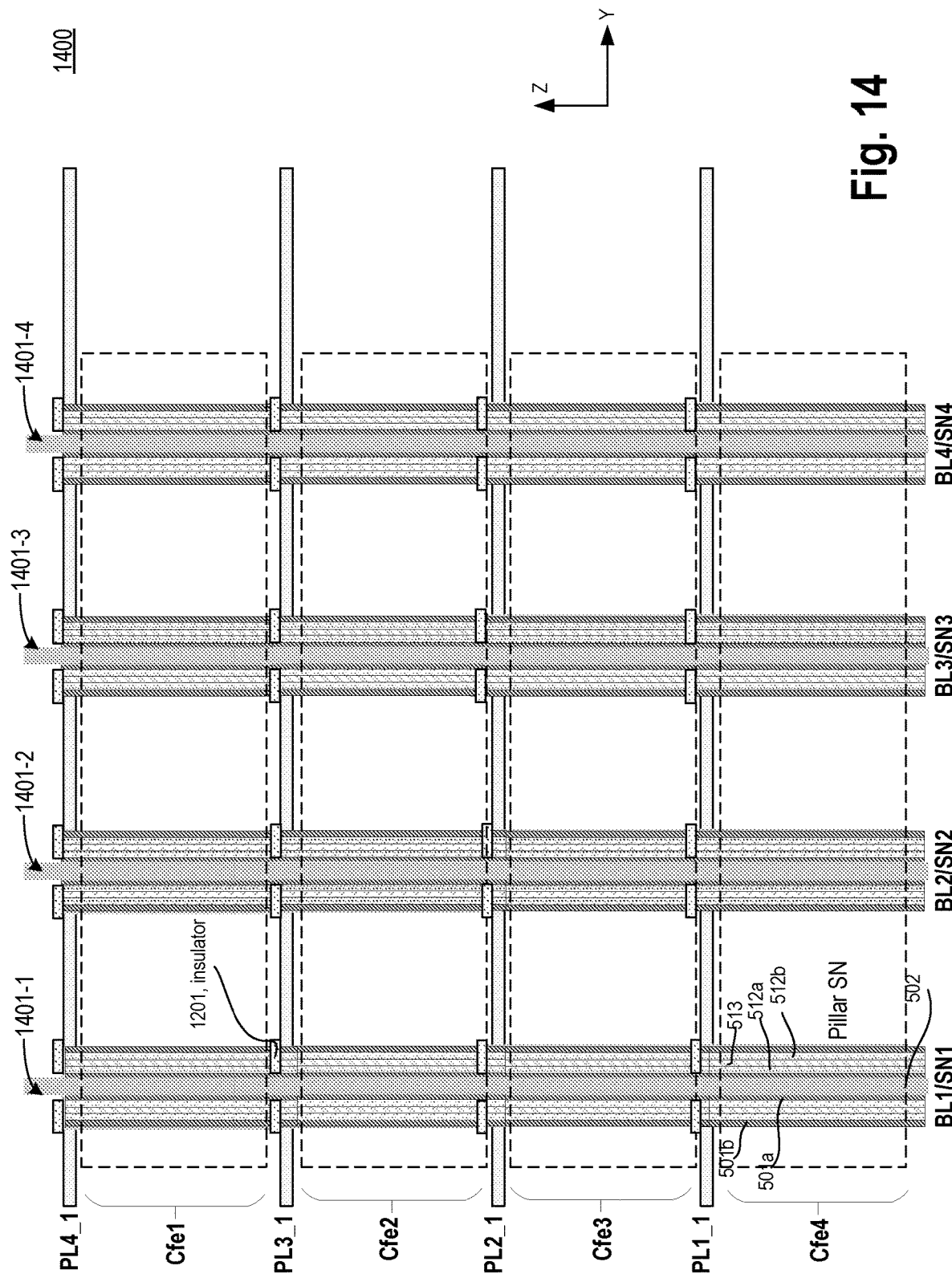
FIG. 14 illustrates multiple towers of pillar capacitors, each tower having a corresponding shared bit-line or storage node, and where pillar capacitor of a tower has corresponding plate-line shared with other pillar capacitors of other towers, in accordance with some embodiments.

FIG. 14 illustrates cross-section 1400 of multiple towers of pillar capacitors, each tower having a corresponding shared bit-line or storage node, and where pillar capacitor of a tower has corresponding plate-line shared with other pillar capacitors of other towers, in accordance with some embodiments. In this example, part of a first row of a memory array is shown with four bit-cells having four respective storage nodes (SN1, SN2, SN3, and SN4), four plate-lines (PL1_1, PL2_2, PL3_1, PL4_1), and four capacitors per storage node (or per bit-line). Each PL is extended to couple part of the top electrode of each capacitor. The capacitors are separated by insulating material 1201. Storage nodes 1401-1, 1401-2, 1401-3, and 1401-4 are connected to source or drain terminal of respective transistors. The drain or source terminals of the transistors are then coupled to the respective bit-line of the memory bit-cell.

Figure 15:
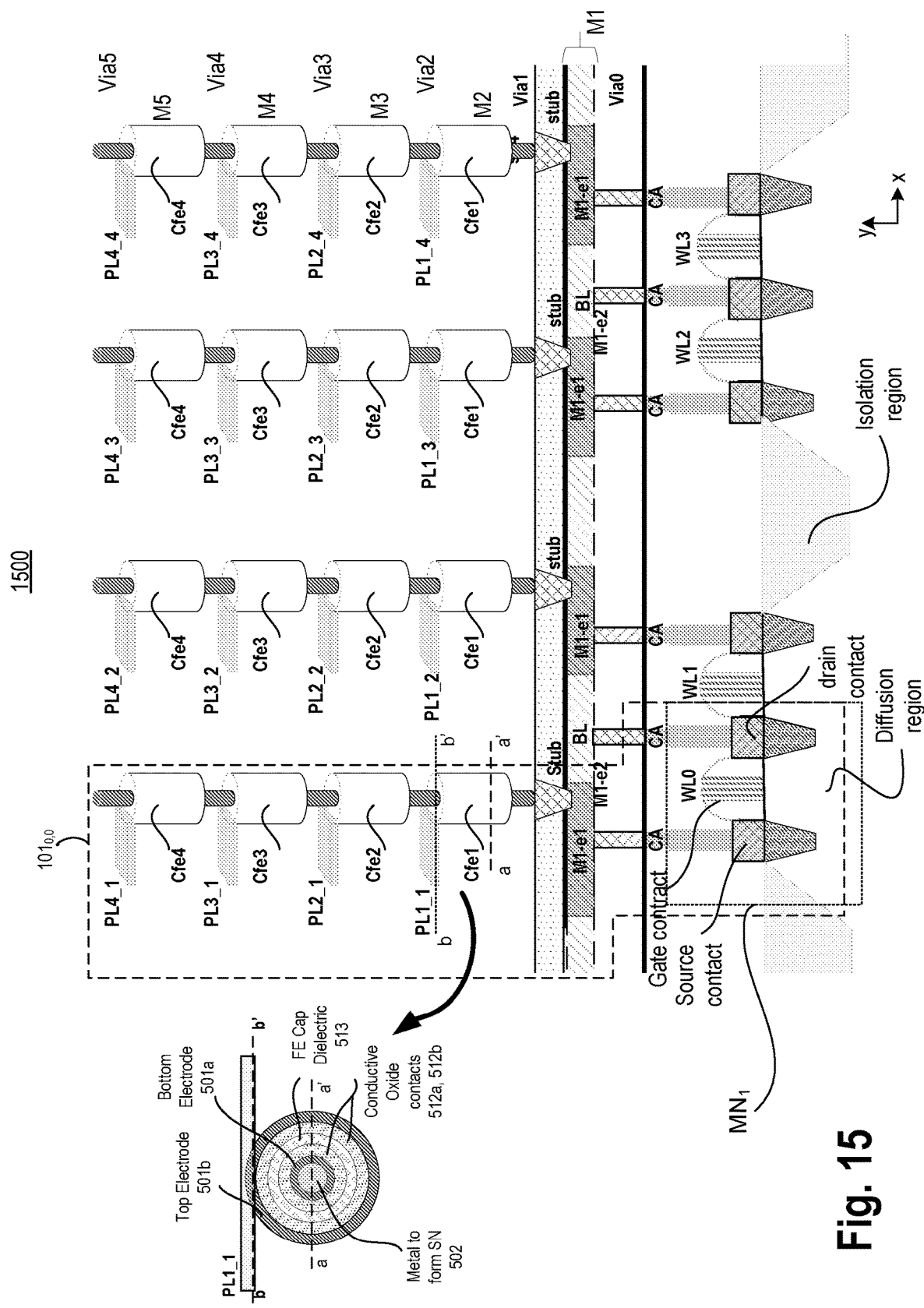
FIG. 15 illustrates a cross-section of 1TnC bit-cells where the FE capacitors are pillar capacitors, in accordance with some embodiments.

FIG. 15 illustrates cross-section 1500 of 1TnC bit-cells where the FE capacitors are pillar capacitors, in accordance with some embodiments. This example four 1TnC bit-cells are shown, where 'n' is four. Each group of capacitors for a bit-cell has a column of shared metal passing through the center of the capacitors, where the shared metal is the storage node which is coupled to the stub and then to the source or drain terminal. Top electrode of each of the capacitor is partially adjacent to a respective plate-line. In this example, the capacitors are formed between regions reserved for Vial through ViaS (e.g., between M1 through M6 layers).

Figure 16:
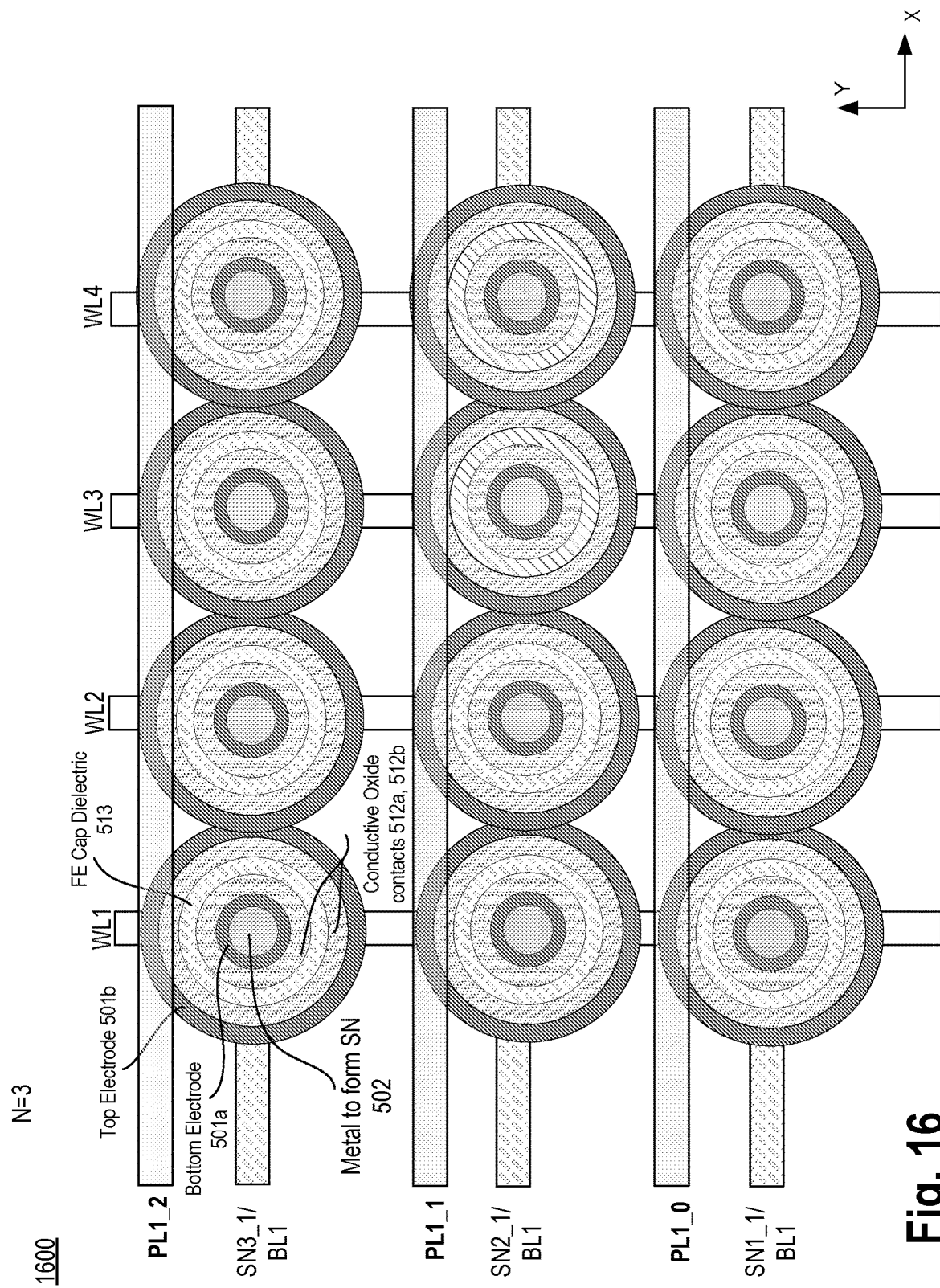
FIG. 16 illustrates a cross-section of a plurality of pillar capacitors of 1TnC bit-cells where plate-line is parallel to bit-line, in accordance with some embodiments.

FIG. 16 illustrates cross-section 1600 of a plurality of pillar capacitors of 1TnC bit-cells where plate-line is parallel to bit-line, in accordance with some embodiments. Cross-section 1600 shows a top-down view of an array of bit-cells where PL is parallel to the SN or BL, and orthogonal to the WL. This view shows the various capacitors of 3 bit-cells sharing their respective PL, which is coupled to part of the top electrodes 501b of each capacitor in a row.

Figure 17:
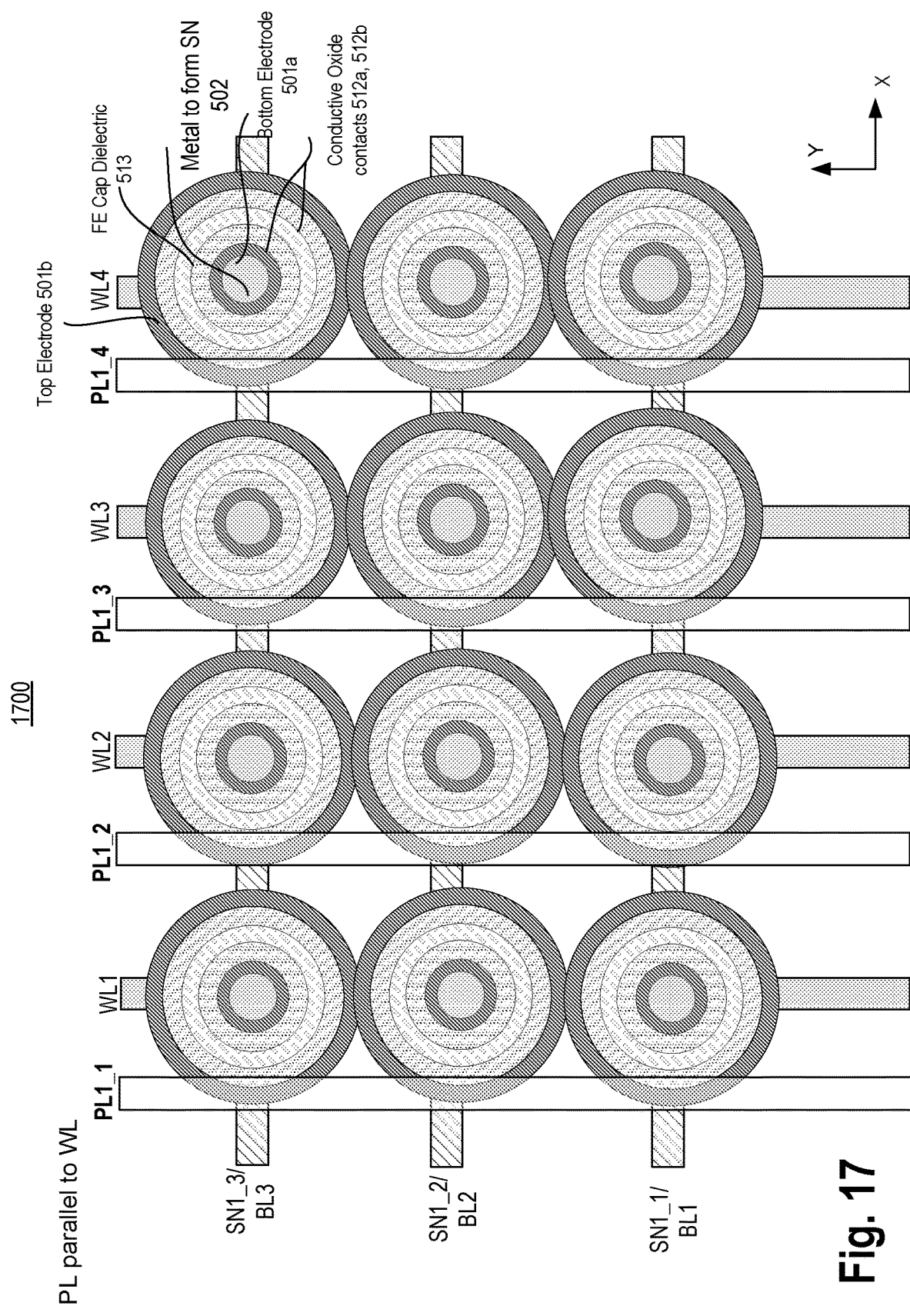
FIG. 17 illustrates a cross-section of a plurality of pillar capacitors of 1TnC bit-cells where plate-line is parallel to word-line, in accordance with some embodiments.

FIG. 17 illustrates cross-section 1700 of a plurality of pillar capacitors of 1TnC bit-cells where plate-line is parallel to word-line, in accordance with some embodiments. Compared to cross-section 1600, here PLs are parallel to WLs and orthogonal to the SNs.

Figure 18:
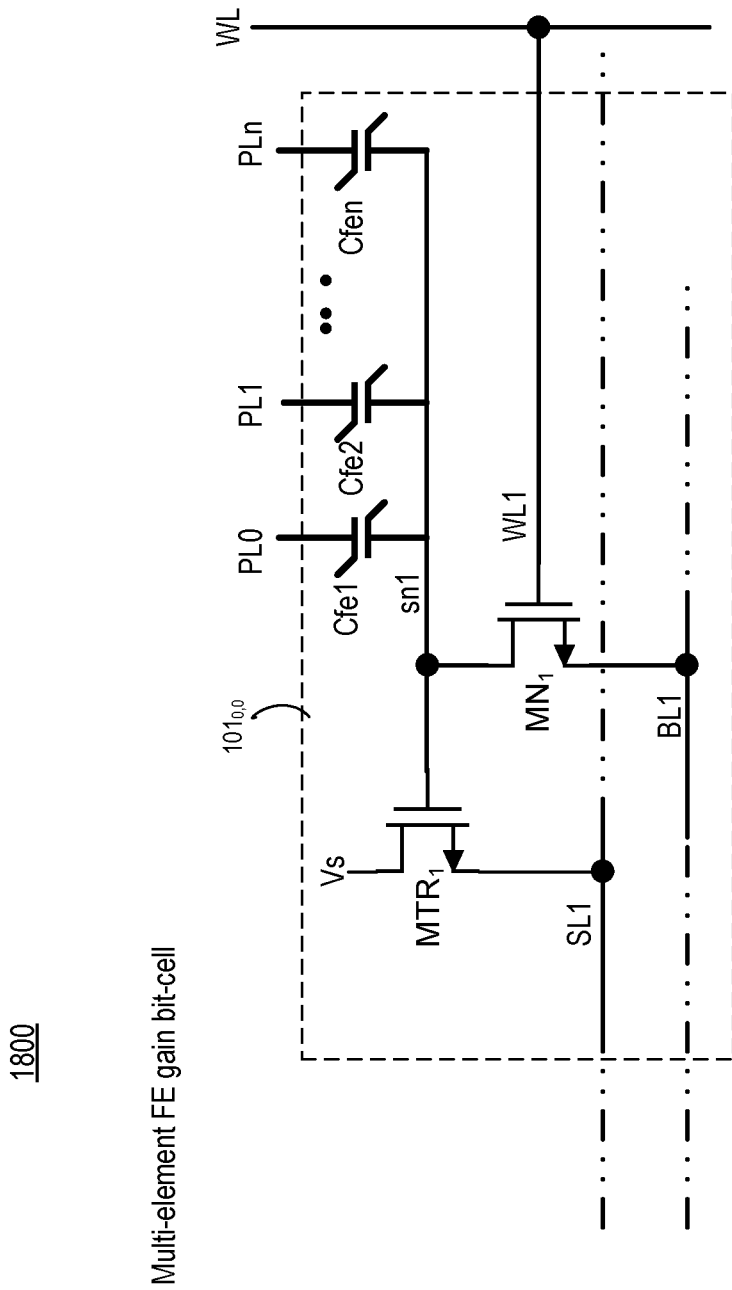
FIG. 18 illustrates a bit-cell comprising two transistors and 'n' FE capacitors (multi-element FE gain bit-cell), in accordance with some embodiments.

FIG. 18 illustrates bit-cell 1800 comprising two transistors and 'n' FE capacitors (multi-element FE gain bit-cell), in accordance with some embodiments. In some embodiments, bit-cell 1800 comprises n-type transistor $MN_1$, np-type transistor $MTR_1$, bit-line (BL), word-line (WL), select-line (SL), and 'n' number of ferroelectric (or paraelectric) capacitors Cfe1 through Cfen. In various embodiments, the gate terminal of n-type transistor $MN_1$ is coupled to WL (e.g., WL1). In some embodiments, the drain or source terminal of n-type transistor $MN_1$ is coupled to BL.

In various embodiments, first terminals of each of the capacitors Cfe1 through Cfen is coupled to a storage node sn1. The storage node sn1 is coupled to a source or drain terminal of n-type transistor $MN_1$ and to a gate of transistor $MTR_1$. In various embodiments, drain or source terminal of MTR1 is coupled to a bias voltage Vs. In some embodiments, Vs is a programmable voltage that can be generated by any suitable source. Vs voltage helps in biasing the gain transistor in conjunction with the sense-voltage that builds at sn1 node. In some embodiments, the source or drain terminal of transistor MTL1 is coupled to SL (e.g., SL1). In some embodiments, a p-type transistor can be used as well for gain.

In some embodiments, second terminals of each of the capacitors Cfe1 through Cfen is coupled to a corresponding plate-line (PL). For example, the second terminal of Cfe1 is coupled to PL1_1, the second terminal of Cfe2 is coupled to PL1_2, and so on. In some embodiments, ferroelectric (or paraelectric) capacitors Cfe1 through Cfen are planar capacitors such as those discussed with reference to FIG. 4. In some embodiments, ferroelectric (or paraelectric) capacitors Cfe1 through Cfen are pillar capacitors such as those discussed with reference to FIG. 5. In some embodiments, the ferroelectric (or paraelectric) capacitors Cfe1 through Cfen are vertically stacked allowing for tall bit-cells (e.g., higher in the z-direction) but with x-y footprint two transistors. By folding the capacitors, the diffusion capacitance on the BL reduces for a given array size, which improves reading speed. Further, folding the capacitors lowers the effective routing capacitance on the BL. The larger footprint in the x-y direction of multi-element 1th gain bit-cell compared to the footprint in the x-y direction of 1TnC bit-cell, vertical h3eight of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn is decoupled from the BL. The multi-element 1th gain bit-cell reduces the thickness scaling requirement for the pillar capacitor. The polarization density requirements are reduced for multi-element FE gain bit-cell compared to 1TnC bit-cell.

In this example, the x-y footprint is determined by the size of transistor $MN_1$ and its connections to BL, WL, and storage node sn1. In some embodiments, the footprint can still be decided by other factors such as: a number of capacitors that connect to the node, and how the capacitors are arranged, e.g., more folding on the same node versus stacking, effective size constraints on those capacitors, and number of capacitors that share the same bit-cell. In some embodiments, PL (e.g., PL0, PL1, . . . PLn) controls which cell within the same access transistor gets programmed, and the value of programming In some embodiments, BL acts as a sense-line. The voltage on BL (e.g. sense voltage) can create disturbance on other bit-lines during read operation. To mitigate such disturbances, in some embodiments, multi-element FE gain bit-cell 1800 is periodically refreshed (e.g., every 1 second). In some embodiments, periodic refresh is minimized by refreshing in active mode of operation that can be coupled with advance schemes for wear leveling. In standby mode (e.g., low power mode), multi-element FE gain bit-cell 1800 is not refreshed as there is no disturb mechanism during standby. In some embodiments, multi-element FE gain bit-cell 1800 relies on isolating the read mode from BL or SL capacitance by isolating through access transistor $MN_1$, where $MN_1$ transistor facilitates pre-charging the SN1 node, prior to read operation.

In some embodiments, there is a possibility of disturbance at the storage node sn1 during read operation. In some embodiments, PL is toggled for other capacitors to the average value of the disturbance that will be seen on the sn1 node. i.e. when a read pulse of some polarity is applied at PL line of the capacitor to be read, a non-zero voltage is applied on other PLs of multi-element FE gain bit-cell 1800, that matches the expected disturbance seen on the shared node.

In one such example, PL line driver is configured to support driving different voltage levels on different PLs.

Figure 19:
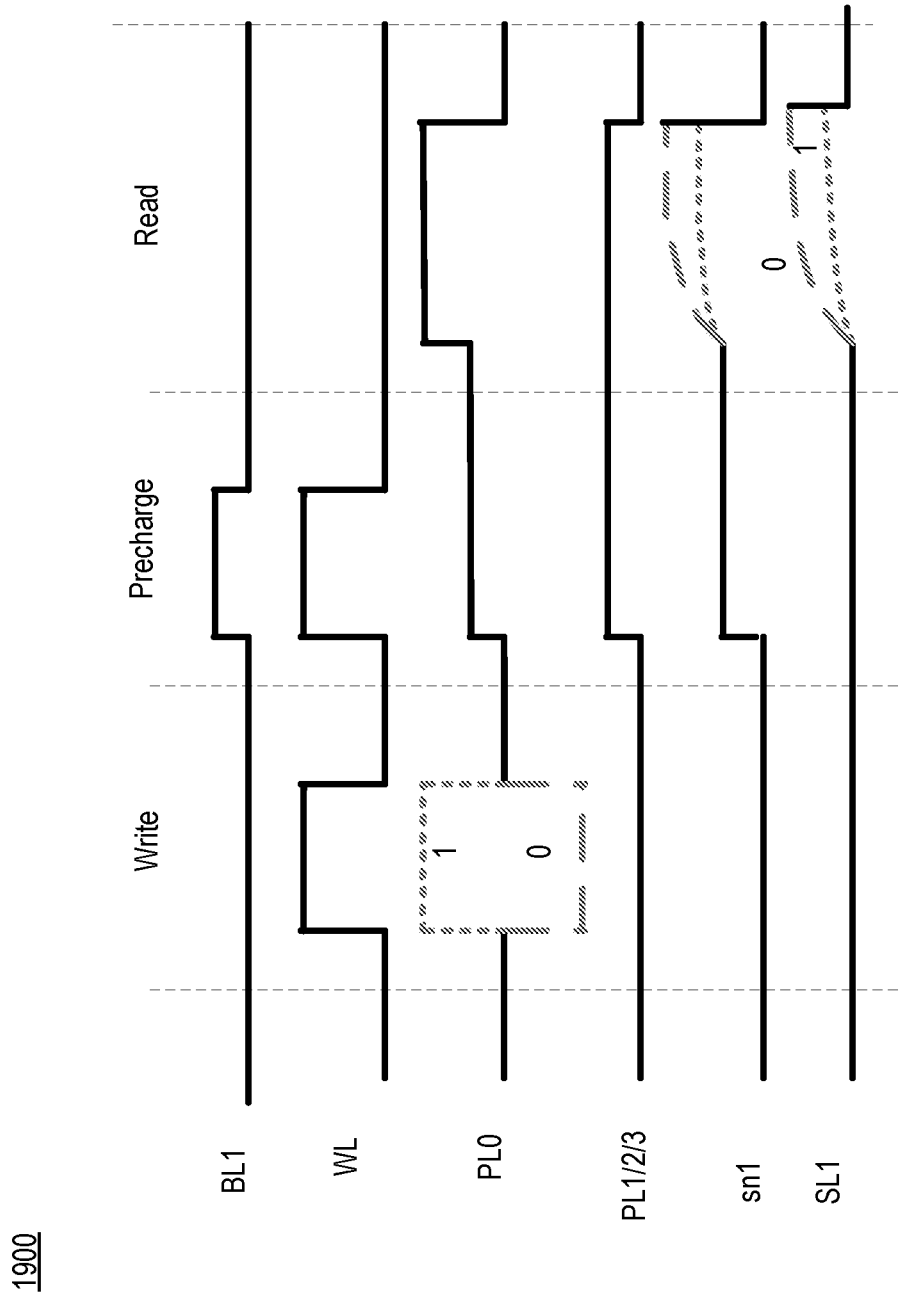
FIG. 19 illustrates a timing diagram showing read and write operations of the bit-cell of FIG. 18, in accordance with some embodiments.

FIG. 19 illustrates timing diagram 1900 showing read and write operations of the bit-cell of FIG. 18, in accordance with some embodiments. To write to a capacitor of multi-element FE gain bit-cell, WL is turned on (e.g., a WL pulse is asserted) followed by activating one of the PLs for the capacitor to be written to. In this example, PL0 is activated. To write a logic 1 to capacitor Cfe1, PT determines the stage for different capacitor. To write to Cfe1, PL0 is asserted (e.g., PL0 pulse is asserted) while WL pulse is asserted. In some embodiments, to write a logic 0 to capacitor Cfe1, PL0 is negatively pulsed (e.g., −Vdd) while WL pulse is asserted. The write operation is disturb free operation because transistor $MN_1$ holds storage node n1 to ground, in accordance with some embodiments. In some embodiments, all capacitors in stack of multi-element FE gain bit-cell can be written in parallel or simultaneously.

In some embodiments, prior to reading the contents of a capacitor (e.g., Cfe1), storage node Sn1 is pre-charged in a pre-charge phase. BL pre-charge helps transistor MTR1 to be biased at a voltage level by Vs where it provides larger current difference for read of 1 versus read of 0. In some embodiments, polarization dependent current from MTR1 helps amplify signal with time-integration window as control on SL.

In the pre-charge phase, WL and BL are asserted, all the PLs are raised to a voltage level between ground and Vdd (supply) or alternatively between +Vdd and −Vss. For example, the PLs are raised to 0.5 Vdd or mid-rails of PL line drive. That causes sn1 to pre-charge to about mid-rail (e.g., half of Vdd) or mid-rail of PL line. The exact nature of signaling are only illustrative, where this 0.5Vdd can be a zero voltage, with PL signaling requirement of +/−Vdd. To read from capacitor Cfe1, PL0 is then asserted from its pre-charged level. During the time PL0 is asserted, other PLs are kept at mid-rail. At this point, voltage begins to develop on node sn1. At least two levels of voltages are possible on sn1 after pre-charge during read operation. The voltage on sn1 in conjunction with the gain transistor will then create different current on SL line. This current delta can either be then checked against reference value to determine a 1 signal or a 0 signal using either a current mode sense amplifier or with a current to voltage conversion and a voltage based sense amplifier.

Figure 20:
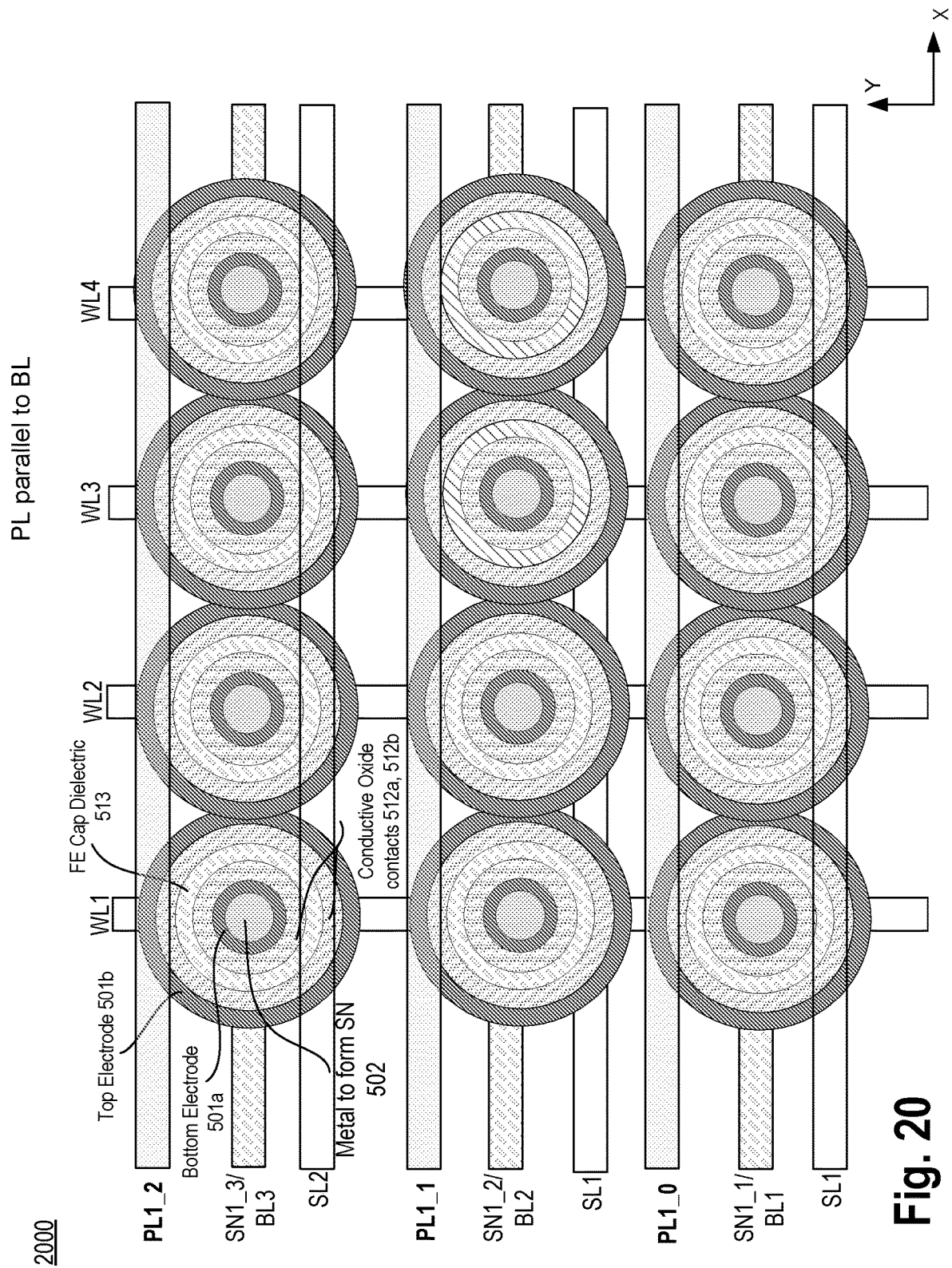
FIG. 20 illustrates a cross-section of a plurality of pillar capacitors of multi-element FE gain bit-cells where plate-line is parallel to bit-line, in accordance with some embodiments.

FIG. 20 illustrates cross-section 2000 of a plurality of pillar capacitors of multi-element FE gain bit-cells where plate-line is parallel to bit-line, in accordance with some embodiments. Cross-section 2000 is similar to cross-section 1600 but for addition of extra interconnect SL.

Table 1 summarizes a comparison of 1T1C, 1TnC, and multi-element FE gain memory bit-cells.

TABLE 1

|  | 1T1C | 1TnC | multi-element FE gain bit-cell |
| --- | --- | --- | --- |
| Stackability of Capacitor | No | Medium | High |
| Polarization density requirement | High | Medium | Low |
| Relative cell density | 3x (planar) relative to DRAM | Approx. 4x to 8x of DRAM | Greater than 8x relative to DRAM (has speed vs. density tradeoff) |
| Speed | fast | medium | Slow (has speed vs. density tradeoff) |

TABLE 1-continued

|  | 1T1C | 1TnC | multi-element FE gain bit-cell |
| --- | --- | --- | --- |
| Refresh during operation | No | Yes | Yes |
| Refresh during standby | No | No | No |
| Write disturb | No | No | No |
| Read disturb | No | Yes | Yes |
| Array size limitation to power | Planar transistor (high) Non-planar (medium) | Medium | Low |
| Planar footprint of the cell | 1T (low) | 1T (low) | 2T (medium) |
| Array size limitation to functionality | high | medium | low |

In some embodiments, the 1T1C, 1TnC, and multi-element FE gain bit-cells are multi-level bit-cells. To realize multi-level bit-cells, the ferroelectric (or paraelectric) capacitor is placed in a partially switched polarization state. Partial polarization state can be achieved by applying either different voltage levels to the capacitor, or different time pulse widths at the same or constant voltage level. By using stacked capacitor in combination of multi-level programming of the bit-cells, higher storage density per bit-cell can be achieved, in accordance with various embodiments.

Table 2 illustrates multi-level storage in 1T1C bit-cell using different voltage levels applied to the ferroelectric or paraelectric capacitor.

TABLE 2

| Write | | | | |
| --- | --- | --- | --- | --- |
|  | PL = +V1 | PL = +1.5 * V1 | PL = −V1 | PL = −1.5 * V1 |
| Remnant polarization state | +pr1 (10 state) | +pr2 (11 state) | −pr1 (01 state) | −pr2 (00 state) |
| Read (apply PL = +1.5 * V1) | | | | |
|  | delta polarization (dp) dp (10 state) | dp (11) | dp (01 state) | dp (00 state) |
| Sense charge | pr2 − pr2 | 0 | pr2 + pr1 | 2 * pr2 |

Table 3 illustrates multi-level storage in 1T1C bit-cell using different time pulse width (PW) at the same voltage level applied to the ferroelectric or paraelectric capacitor.

TABLE 3

| Write | | | | |
| --- | --- | --- | --- | --- |
|  | PL = +V, PW = T0 | PL = +V, PW = 2 * T0 | PL = −V, PW = T0 | PL = −V, PW = 2 * T0 |
| Remnant polarization state | +pr1 (10 state) | +pr2 (11 state) | −pr1 (01 state) | −pr2 (00 state) |
| Read (apply PL = +V, PW = 2 * T0) | | | | |
|  | dp (10 state) | dp (11) | dp (01 state) | dp (00 state) |

TABLE 3-continued

| Sense charge | pr2 − pr1 | 0 | pr2 + pr1 | 2 * pr2 |
|---|---|---|---|---|

Figure 21:
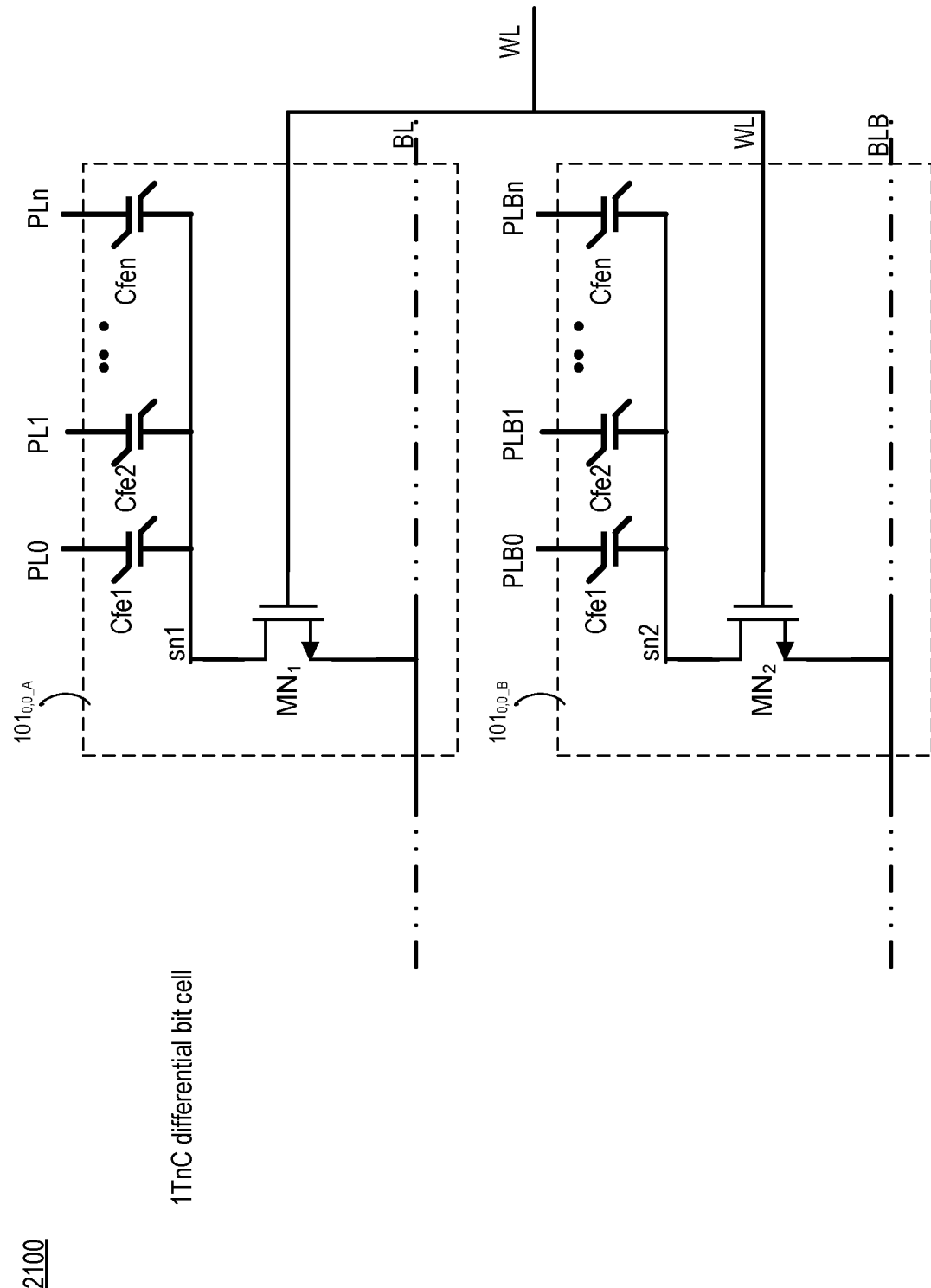
FIG. 21 illustrates 1TnC FE memory differential bit-cell, in accordance with some embodiments.

FIG. 21 illustrates 1TnC FE memory differential bit-cell 2100, in accordance with some embodiments. Bit-cell 2100 comprises two copies of bit-cell 800, where one bit-cell is complementary to the other. Here, two bit-cells are shown $101_{0,0\_A}$ and $101_{0,0\_B}$, that together form 1TnC differential bit-cell 2100. Both bit-cells share a common WL, and each bit-cell has its own transistor. The plate-lines (e.g., PLB0, PLB1, through PLBn) for bit-cell $101_{0,0\_B}$ are inverse or complementary of the plate-lines (e.g., PL0, PL2, through PLn) for bit-cell $101_{0,0\_A}$. The same is true for bit-lines. For example, the bit-line (BLB) for bit-cell $101_{0,0\_B}$ is an inverse or complementary of the bit-line (BL) for bit-cell $101_{0,0\_A}$.

Figure 22:
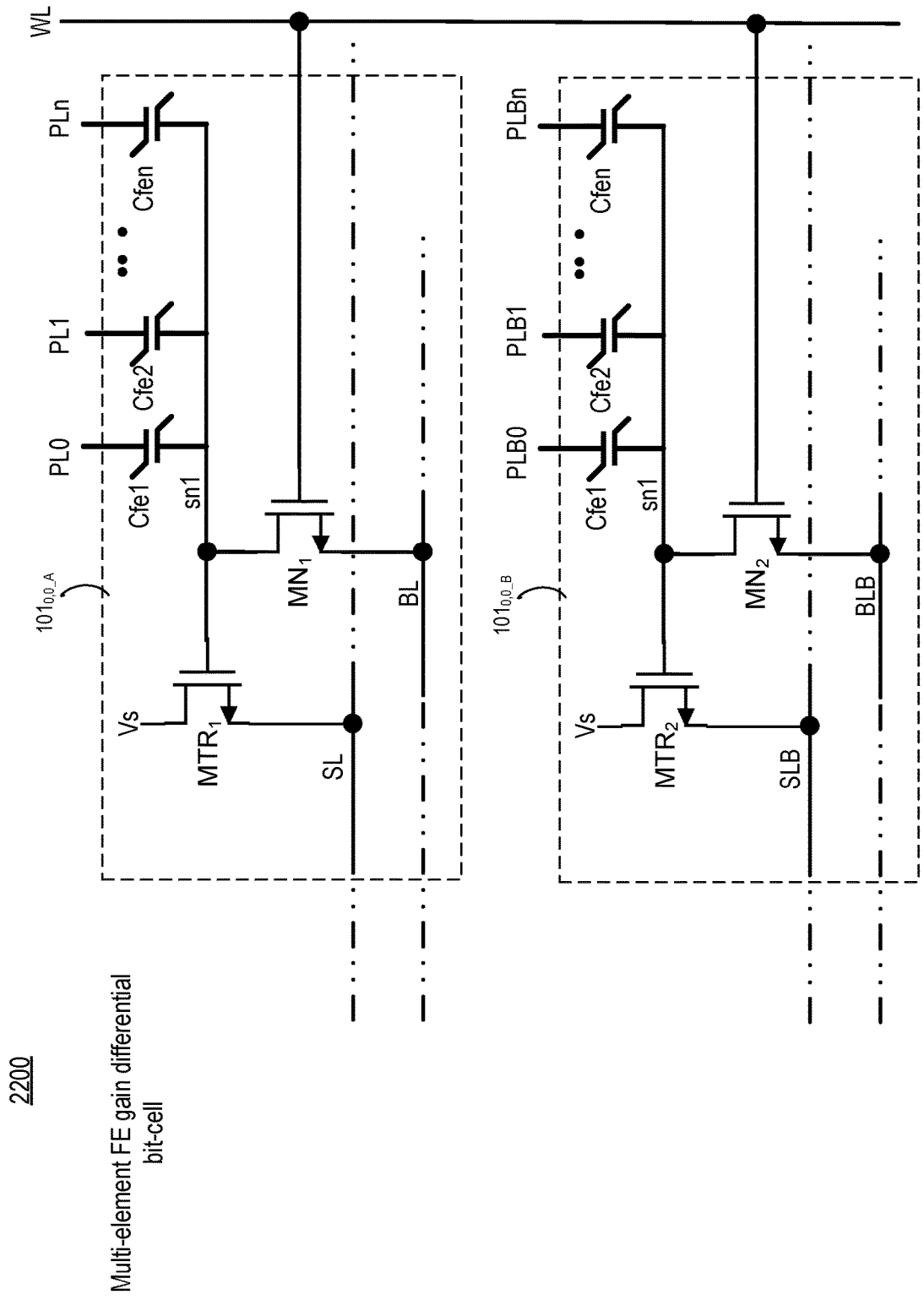
FIG. 22 illustrates multi-element FE gain differential bit-cell, in accordance with some embodiments.

FIG. 22 illustrates multi-element FE gain differential bit-cell 2200, in accordance with some embodiments. Bit-cell 2200 comprises two copies of bit-cell 1800, where one bit-cell is complementary to the other. Here, two bit-cells are shown $101_{0,0\_A}$ and $101_{0,0\_B}$, that together form multi-element FE gain differential bit-cell 2200. Both bit-cells share a common WL, and each bit-cell has its own transistors. The plate-lines (e.g., PLB0, PLB1, through PLBn) for bit-cell $101_{0,0\_B}$ are inverse or complementary of the plate-lines (e.g., PL0, PL2, through PLn) for bit-cell $101_{0,0\_A}$. The same is true for bit-lines and source or select lines. For example, the bit-line (BLB) for bit-cell $101_{0,0\_B}$ is an inverse or complementary of the bit-line (BL) for bit-cell $101_{0,0\_A}$, and the select-line (SLB) for bit-cell $101_{0,0\_B}$ is inverse or complementary of the select-line (SL) for bit-cell $101_{0,0\_A}$.

Figure 23:
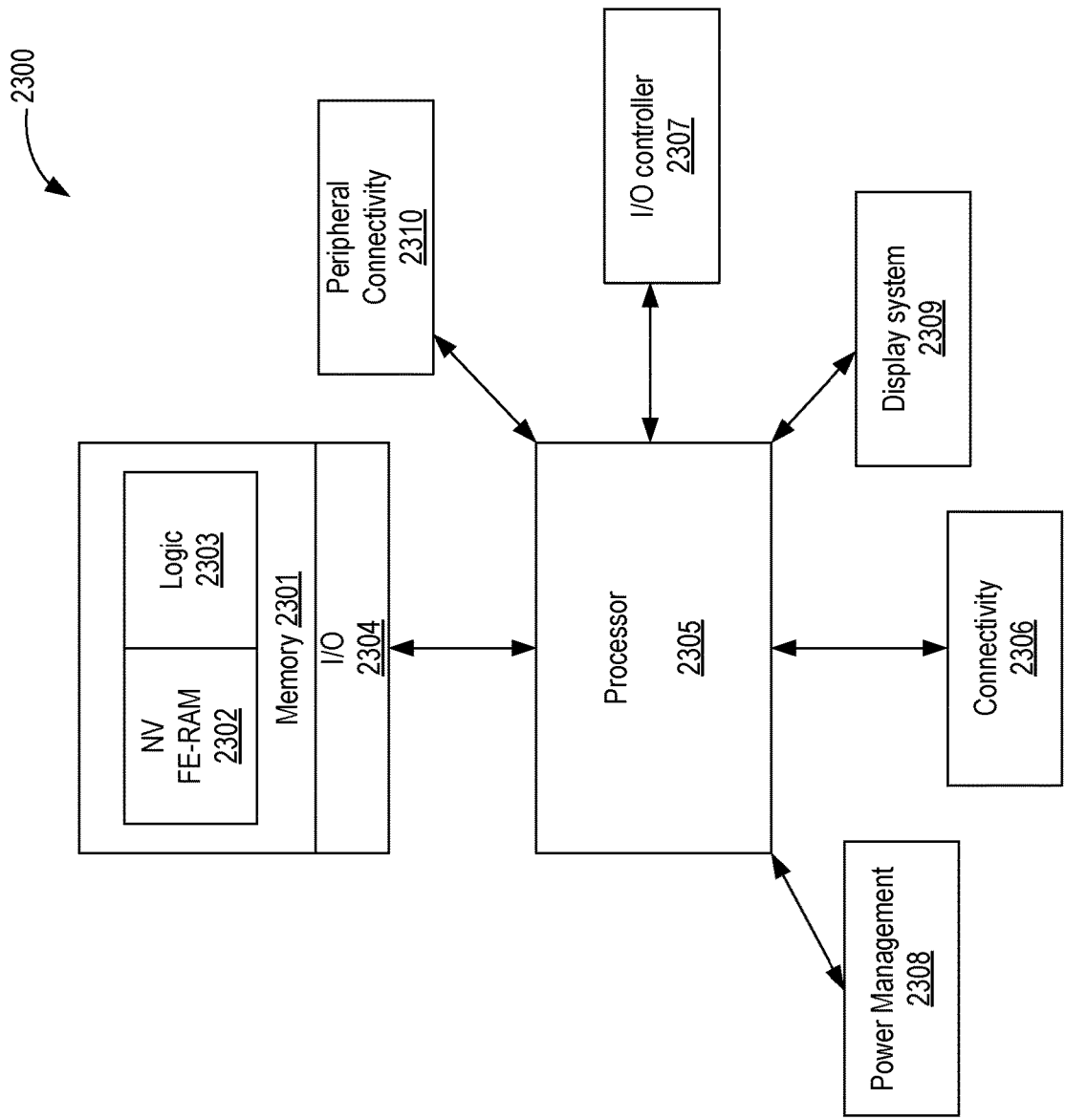
FIG. 23 illustrates a smart memory chip having FE memory bit-cells and artificial intelligence (AI) processor, in accordance with some embodiments.

FIG. 23 illustrates smart memory chip 2300 having FE memory bit-cells and artificial intelligence (AI) processor, in accordance with some embodiments. SOC 2300 comprises memory 2301 having static random-access memory (SRAM) or FE based random access memory FE-RAM, or any other suitable memory. The memory can be non-volatile (NV) or volatile memory. Memory 2301 may also comprise logic 2303 to control memory 2302. For example, write and read drivers are part of logic 2303. These drivers and other logic are implemented using the majority or threshold gates of various embodiments. The logic can comprise majority or threshold gates and traditional logic (e.g., CMOS based NAND, NOR etc.). In some embodiments, any of the blocks described herein can include the various kinds of bit-cells described herein.

SOC further comprises a memory I/O (input-output) interface 2304. The interface may be double-data rate (DDR) compliant interface or any other suitable interface to communicate with a processor. Processor 2305 of SOC 2300 can be a single core or multiple core processor. Processor 2305 can be a general-purpose processor (CPU), a digital signal processor (DSP), or an Application Specific Integrated Circuit (ASIC) processor. In some embodiments, processor 2305 is an artificial intelligence (AI) processor (e.g., a dedicated AI processor, a graphics processor configured as an AI processor). In various embodiments, processor 2305 is a processor circuitry which is to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 2305 may be coupled to a number of other chip-lets that can be on the same die as SOC 2300 or on separate dies. These chip-lets include connectivity circuitry 2306, I/O controller 2307, power management 2308, and display system 2309, and peripheral connectivity 2310.

Connectivity 2306 represents hardware devices and software components for communicating with other devices. Connectivity 2306 may support various connectivity circuitries and standards. For example, connectivity 2306 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 2306 may support non-cellular standards such as WiFi.

I/O controller 2307 represents hardware devices and software components related to interaction with a user. I/O controller 2307 is operable to manage hardware that is part of an audio subsystem and/or display subsystem. For example, input through a microphone or other audio device can provide input or commands for one or more applications or functions of SOC 2300. In some embodiments, I/O controller 2307 illustrates a connection point for additional devices that connect to SOC 2300 through which a user might interact with the system. For example, devices that can be attached to the SOC 2300 might include microphone devices, speaker or stereo systems, video systems or other display devices, keyboard or keypad devices, or other I/O devices for use with specific applications such as card readers or other devices.

Power management 2308 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2308 may accordingly put such logic into low power state without the worry of losing data. Power management may select a power state according to Advanced Configuration and Power Interface (ACPI) specification for one or all components of SOC 2300.

Display system 2309 represents hardware (e.g., display devices) and software (e.g., drivers) components that provide a visual and/or tactile display for a user to interact with the processor 2305. In some embodiments, display system 2309 includes a touch screen (or touch pad) device that provides both output and input to a user. Display system 2309 may include a display interface, which includes the particular screen or hardware device used to provide a display to a user. In some embodiments, the display interface includes logic separate from processor 2305 to perform at least some processing related to the display.

Peripheral connectivity 2310 may represent hardware devices and/or software devices for connecting to peripheral devices such as printers, chargers, cameras, etc. Peripheral connectivity 2310 may support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples illustrates the various embodiments. Any one example can be combined with other examples described herein.

Example 1: A bit cell apparatus comprising: a node; a first capacitor comprising non-linear polar material, the first capacitor having a first terminal coupled to the node and a second terminal coupled to a first plate-line; a second capacitor comprising the non-linear polar material, the second capacitor having a first terminal coupled to the node and a second terminal coupled to a second plate-line; and a transistor coupled to the node and a bit-line, wherein the transistor is controllable by a word-line.

Example 2: The apparatus of example 1, wherein the first capacitor and the second capacitor are vertically stacked over one another.

Example 3: The apparatus of example 1, wherein the first capacitor and the second capacitor are pillar capacitors that are cylindrical in shape, wherein the first capacitor and the second capacitor stacked one over another such that the first terminals of the first capacitor and the second capacitor is a conducting electrode that passes through centers of the first capacitor and the second capacitor.

Example 4: The apparatus of example 3, wherein the first capacitor or the second capacitor comprises: a first layer comprising a first conducting material, wherein the first layer is coupled to the first terminal of the first capacitor; a second layer comprising a first conducting material, wherein the second material is around the first layer; a third layer comprising the non-linear polar material, wherein the third layer is around the second layer; a fourth layer comprising a second conducting material, wherein the fourth material is around the third layer; and a fifth layer comprising a second conducting material, wherein the first plate-line is partially coupled to the fifth layer.

Example 5: The apparatus of example 4, wherein the first layer has a first circumference, wherein the second layer has a second circumference, wherein the third layer has a third circumference, wherein the fourth layer has a fourth circumference, and wherein the fifth layer has a fifth circumference, wherein the fourth circumference is larger than the third circumference, wherein the third circumference is larger than the second circumference, wherein the second circumference is larger than the first circumference.

Example 6: The apparatus of example 1 comprising logic to refresh a first charge on the first capacitor, and to refresh a second charge on the second capacitor during an active mode.

Example 7: The apparatus of example 6, wherein the logic is to refresh periodically.

Example 8: The apparatus of example 1, wherein the first plate-line, the second plate-line, and the word-line are parallel relative to one another.

Example 9: The apparatus of example 1, wherein the first plate-line, the second plate-line, and the bit-line are parallel relative to one another.

Example 10: The apparatus of example 1, wherein the first capacitor and the second capacitor are planar capacitors, wherein the first capacitor and the second capacitor are stacked one over another such that the first terminals of the first capacitor and the second capacitor are coupled through a via.

Example 11: The apparatus of example 1, wherein the non-linear polar material includes one of: ferroelectric material, paraelectric material, or non-linear dielectric.

Example 12: The apparatus of example 1, wherein the non-linear polar material of the first capacitor is partially polarized to store multiple data values.

Example 13: The apparatus of example 1, wherein the first plate-line is applied with different voltages at different times to create partially polarized states in the non-linear polar material of the first capacitor.

Example 14: The apparatus of example 1, wherein the first plate-line is applied with a constant voltage via a time pulse having different widths to create partially polarized states in the non-linear polar material of the first capacitor.

Example 15: The apparatus of example 11, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 16: A system comprising: a memory to store instructions; a processor circuitry to execute instructions; and a wireless interface to allow the processor circuitry to communicate with another device, wherein the memory includes: a node; a first capacitor comprising non-linear polar material, the first capacitor having a first terminal coupled to the node and a second terminal coupled to a first plate-line; a second capacitor comprising the non-linear polar material, the second capacitor having a first terminal coupled to the node and a second terminal coupled to a second plate-line; and a transistor coupled to the node and a bit-line, wherein the transistor is controllable by a word-line.

Example 17: The system of example 16, wherein the first capacitor and the second capacitor are vertically stacked over one another.

Example 18: The system of example 16, wherein the first capacitor and the second capacitor are pillar capacitors that are cylindrical in shape, wherein the first capacitor and the second capacitor stacked one over another such that the first terminals of the first capacitor and the second capacitor is a conducting electrode that passes through centers of the first capacitor and the second capacitor.

Example 19: An apparatus comprising: a node; a first capacitor comprising non-linear polar material, the first capacitor having a first terminal coupled to the node and a second terminal coupled to a first plate-line; a second capacitor comprising the non-linear polar material, the second capacitor having a first terminal coupled to the node and a second terminal coupled to a second plate-line; and a transistor coupled to the node and a bit-line, wherein the transistor is controllable by a word-line, wherein the non-linear polar material is partially polarized to store multi-level states in the first capacitor or the second capacitor.

Example 20: The apparatus of example 19, wherein the first plate-line is applied with different voltages at different times to create partially polarized states in the non-linear polar material of the first capacitor, or wherein the first plate-line is applied with a constant voltage via a time pulse having different widths to create partially polarized states in the non-linear polar material of the first capacitor.

Example 21: A method comprising: forming a node; forming a first capacitor comprising non-linear polar material, the first capacitor having a first terminal coupled to the node and a second terminal coupled to a first plate-line; forming a second capacitor comprising the non-linear polar material, the second capacitor having a first terminal coupled to the node and a second terminal coupled to a second plate-line; and forming a transistor coupled to the node and a bit-line, wherein the transistor is controllable by a word-line.

Example 22: The method of example 21 comprising vertically stacking the first capacitor and the second capacitor over one another.

Example 23: The method of example 21, wherein the first capacitor and the second capacitor are pillar capacitors that are cylindrical in shape.

Example 24: The method of example 21, wherein vertically stacking the first capacitor and the second capacitor over one another is performed such that the first terminals of the first capacitor and the second capacitor is a conducting electrode that passes through centers of the first capacitor and the second capacitor.

Example 1b: A bit cell apparatus comprising: a first node; a second node; a first capacitor comprising non-linear polar material, the first capacitor having a first terminal coupled to the first node and a second terminal coupled to a first plate-line; a second capacitor comprising the non-linear polar material, the second capacitor having a first terminal coupled to the first node and a second terminal coupled to a second plate-line; a first transistor coupled to the first node and a bit-line, wherein the transistor is controllable by a word-line; and a second transistor having a gate terminal coupled to the first node, and a source terminal coupled to a source-line and a drain terminal coupled to the second node.

Example 2b: The apparatus of example 1b, wherein the first capacitor and the second capacitor are vertically stacked over one another.

Example 3b: The apparatus of example 1b, wherein the first capacitor and the second capacitor are pillar capacitors that are cylindrical in shape, wherein the first capacitor and the second capacitor stacked one over another such that the first terminals of the first capacitor and the second capacitor is a conducting electrode that passes through centers of the first capacitor and the second capacitor.

Example 4b: The apparatus of example 3b, wherein the first capacitor or the second capacitor comprises: a first layer comprising a first conducting material, wherein the first layer is coupled to the first terminal of the first capacitor; a second layer comprising a first conducting material, wherein the second material is around the first layer; a third layer comprising the non-linear polar material, wherein the third layer is around the second layer; a fourth layer comprising a second conducting material, wherein the fourth material is around the third layer; and a fifth layer comprising a second conducting material, wherein the first plate-line is partially coupled to the fifth layer.

Example 5b: The apparatus of example 4b, wherein the first layer has a first circumference, wherein the second layer has a second circumference, wherein the third layer has a third circumference, wherein the fourth layer has a fourth circumference, and wherein the fifth layer has a fifth circumference, wherein the fourth circumference is larger than the third circumference, wherein the third circumference is larger than the second circumference, wherein the second circumference is larger than the first circumference.

Example 6b: The apparatus of example 1b comprising logic to refresh a first charge on the first capacitor, and to refresh a second charge on the second capacitor during an active mode.

Example 7b: The apparatus of example 6b, wherein the logic is to refresh periodically.

Example 8b: The apparatus of example 1b, wherein the first plate-line, the second plate-line, and the word-line are parallel relative to one another.

Example 9b: The apparatus of example 1b, wherein the first plate-line, the second plate-line, and the bit-line are parallel relative to one another.

Example 10b: The apparatus of example 1b, wherein the bit-line and the source-line are parallel to one another.

Example 11b: The apparatus of example 1b, wherein the first capacitor and the second capacitor are planar capacitors, wherein the first capacitor and the second capacitor are stacked one over another such that the first terminals of the first capacitor and the second capacitor are coupled through a via.

Example 12b: The apparatus of example 1b, wherein the non-linear polar material includes one of: ferroelectric material, para-electric material, or non-linear dielectric.

Example 13b: The apparatus of example 1b, wherein the non-linear polar material of the first capacitor is partially polarized to store multiple data values.

Example 14b: The apparatus of example 1b, wherein the first plate-line is applied with different voltages at different times to create partially polarized states in the non-linear polar material of the first capacitor.

Example 15b: The apparatus of example 1b, wherein the first transistor and the second transistor are of a same conductivity type.

Example 16b: The apparatus of example 1b, wherein the first transistor and the second transistor are one of planar transistors or non-planar transistors.

Example 17b: The apparatus of example 1b, wherein the first plate-line is applied with a constant voltage via a time pulse having different widths to create partially polarized states in the non-linear polar material of the first capacitor.

Example 18b: The apparatus of example 17b, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 1c: An apparatus comprising: a node; a capacitor comprising non-linear polar material, the first capacitor having a first terminal coupled to the node and a second terminal coupled to a plate-line; a transistor coupled to the node and a bit-line, wherein the transistor is controllable by a word-line; and circuitry to apply the plate-line with different voltages at different times to create partially polarized states in the non-linear polar material of the capacitor.

Example 2c: The apparatus of example 1c, wherein the capacitor comprises: a first layer comprising a first conducting material, wherein the first layer is coupled to the first terminal of the capacitor; a second layer comprising a first conducting material, wherein the second material is around the first layer; a third layer comprising the non-linear polar material, wherein the third layer is around the second layer; a fourth layer comprising a second conducting material, wherein the fourth material is around the third layer; and a fifth layer comprising a second conducting material, wherein the plate-line is partially coupled to the fifth layer.

Example 3c: The apparatus of example 2c, wherein the first layer has a first circumference, wherein the second layer has a second circumference, wherein the third layer has a third circumference, wherein the fourth layer has a fourth circumference, and wherein the fifth layer has a fifth circumference, wherein the fourth circumference is larger than the third circumference, wherein the third circumference is larger than the second circumference, wherein the second circumference is larger than the first circumference.

Example 4c: The apparatus of example 1c comprising logic to refresh a charge on the capacitor during an active mode.

Example 5c: The apparatus of example 4c, wherein the logic is to refresh periodically.

Example 6c: The apparatus of example 1c, wherein the plate-line and the word-line are parallel relative to one another.

Example 7c: The apparatus of example 1c, wherein the plate-line and the bit-line are parallel relative to one another.

Example 8c: The apparatus of example 1c, wherein the capacitor is a planar capacitor.

Example 9c: The apparatus of example 1c, wherein the non-linear polar material includes one of: ferroelectric material, para-electric material, or non-linear dielectric.

Example 10c: The apparatus of example 1c, wherein the non-linear polar material of the first capacitor is partially polarized to store multiple data values.

Example 11c: The apparatus of example 1c, wherein the transistor is one of a planar transistor or a non-planar transistor.

Example 12c: The apparatus of example 11c, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hfl-x Ex Oy, where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y) Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 13c: An apparatus comprising: a node; a capacitor comprising non-linear polar material, the first capacitor having a first terminal coupled to the node and a second terminal coupled to a plate-line; a transistor coupled to the node and a bit-line, wherein the transistor is controllable by a word-line; and circuitry to apply the plate-line with a constant voltage via a time pulse having different widths to create partially polarized states in the non-linear polar material of the capacitor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a node;
   a capacitor comprising non-linear polar material, the capacitor having a first terminal coupled to the node and a second terminal coupled to a plate-line;
   a transistor coupled to the node and a bit-line, wherein the transistor is controllable by a word-line; and
   a write circuitry to apply the plate-line with different voltages at different times to create partially polarized states in the non-linear polar material of the capacitor.

2. The apparatus of claim 1, wherein the capacitor is to store more than one level of charge at a time.

3. The apparatus of claim 1, wherein the write circuitry is to apply a first voltage at a first time on the plate-line, and wherein application of the first voltage results in a first remnant polarization state in the capacitor.

4. The apparatus of claim 3, wherein the write circuitry is to apply a second voltage at a second time on the plate-line, wherein the second voltage is higher than the first voltage, and wherein application of the second voltage results in a second remnant polarization state in the capacitor.

5. The apparatus of claim 4, wherein the write circuitry is to apply a third voltage at a third time on the plate-line, wherein the third voltage is lower than the first voltage, wherein application of the third voltage results in a third remnant polarization state in the capacitor, and wherein the third remnant polarization state is a negative version of the first remnant polarization state.

6. The apparatus of claim 5, wherein the write circuitry is to apply a fourth voltage at a fourth time on the plate-line, wherein the fourth voltage is lower than the third voltage, and wherein application of the fourth voltage results in a fourth remnant polarization state in the capacitor, wherein the fourth remnant polarization state is a negative version of the second remnant polarization state.

7. The apparatus of claim 6 comprises a read circuitry to:
   apply a voltage on the plate-line which is a largest or smallest voltage from among the first voltage, the second voltage, the third voltage, or the fourth voltage; and
   sense a charge on the bit-line coupled to the capacitor, wherein the charge is a difference between a current remnant polarization state in the capacitor and a prior remnant polarization state in the capacitor, wherein the current remnant polarization state is associated with the applied voltage, and wherein the prior remnant polarization state is a previously written polarization state in the capacitor.

8. The apparatus of claim 1, wherein the capacitor is a non-planar capacitor which includes:
   a first layer coupled to the first terminal, wherein the first layer comprises metal;
   a second layer around the first layer, wherein the second layer comprises a first conductive oxide;
   a third layer comprising the non-linear polar material, wherein the third layer is around the second layer;
   a fourth layer around the third layer, wherein the fourth layer comprises a second conductive oxide, wherein the fourth layer is around the third layer, wherein the first conductive oxide and the second conductive oxide include one or more of: Ir, In, Fe, Ru, Pd, Os, or Re; and
   a fifth layer around the fourth layer, wherein the fifth layer comprises metal, wherein the plate-line is adjacent to part of the fifth layer.

9. The apparatus of claim 8, wherein:
   the first layer has a first circumference;
   the second layer has a second circumference,
   the third layer has a third circumference; and
   the fourth layer has a fourth circumference, wherein the fifth layer has a fifth circumference, wherein the fourth circumference is larger than the third circumference, wherein the third circumference is larger than the second circumference, and wherein the second circumference is larger than the first circumference.

10. The apparatus of claim 1, wherein the capacitor is a planar capacitor which includes:
    a first layer coupled to the first terminal, wherein the first layer comprises a first refractive inter-metallic material, wherein the first layer is along an x-plane;
    a second layer on the first layer, wherein the second layer comprises a first conductive oxide, wherein the second layer extends along the x-plane;
    a third layer comprising the non-linear polar material, wherein the third layer is on the second layer;

a fourth layer on the third layer, wherein the fourth layer comprises a second conductive oxide; and a fifth layer on the fourth layer, wherein the fifth layer comprises a second refractive inter-metallic material, wherein the plate-line is coupled to a portion of the fifth layer, wherein the first refractive inter-metallic material and the second refractive inter-metallic material include one or more of Ta, Ti, Al, W, Ni, Ga, Mn, Fe, B, C, N, or Co; and wherein the first conductive oxide and the second conductive oxide include one or more of: Ir, In, Fe, Ru, Pd, Os, or Re.

11. The apparatus of claim 10, wherein the planar capacitor includes:

a sixth layer that extends along a y-plane, wherein the y-plane is orthogonal to the x-plane, wherein the sixth layer is adjacent to side walls of the first layer, the second layer, the third layer, and the fourth layer, and wherein the sixth layer includes one of: Ti—Al—O, Al2O3, or MgO.

12. The apparatus of claim 1, wherein the capacitor is a planar capacitor which includes:

a first layer coupled to the first terminal, wherein the first layer comprises a first conductive oxide, wherein the first layer extends along an x-plane;

a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the plate-line is coupled to a portion of the third layer, and wherein the first conductive oxide and the second conductive oxide include one or more of: Ir, In, Fe, Ru, Pd, Os, or Re.

13. The apparatus of claim 12, wherein the planar capacitor includes a fourth layer that extends along a y-plane which is orthogonal to the x-plane, wherein the fourth layer is adjacent to side walls of the first layer, the second layer, and the third layer, and wherein the fourth layer includes one of: Ti—Al—O, Al2O3, or MgO.

14. The apparatus of claim 1, wherein the non-linear polar material includes one of: ferroelectric material, paraelectric material, or non-linear dielectric.

15. The apparatus of claim 14, wherein the ferroelectric material includes one of:

Bismuth ferrite (BFO) with a doping material, wherein the doping material is one of Lanthanum, or elements from lanthanide series of periodic table;

Lead zirconium titanate (PZT), or PZT with a doping material, wherein the doping material is one of La or Nb;

relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);

a perovskite which includes one of: BaTiO3, PbTiO3, KNbO3 or NaTaO3;

hexagonal ferroelectric which includes one of: YMnO3 or LuFeO3;

hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

Hafnium (Hf), Zirconium (Zr), Aluminum (Al), Silicon (Si), their oxides or their alloyed oxides;

Hafnium oxides as Hf1-x Ex Oy, where E can be Al, Ca, Ce, Dy, Er, Gd, Ge, La, Sc, Si, Sr, Sn or Y;

Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction;

Niobate type compounds LiNbO3, LiTaO3, Lithium iron Tantalum Oxy Fluoride, Barium Strontium Niobate, Sodium Barium Niobate or Potassium strontium niobate; or an improper ferroelectric which includes one of: [PTO/STO]n or [LAO/STO]n, where 'n' is between 1 to 100.

16. The apparatus of claim 14, wherein the paraelectric material includes: SrTiO3, Ba(x)Sr(y)TiO3, HfZrO2, Hf—Si—O, La-substituted PbTiO3 or PMN-PT based relaxor ferroelectrics.

17. An apparatus comprising:

a node;

a capacitor comprising non-linear polar material, the capacitor having a first terminal coupled to the node and a second terminal coupled to a plate-line, wherein the capacitor is a planar capacitor or a non-planar capacitor, wherein the capacitor is to store more than one level of charge at a time;

a transistor coupled to the node and a bit-line, wherein the transistor is controllable by a word-line;

a write circuitry to apply the plate-line with different voltages at different times to create partially polarized states in the non-linear polar material of the capacitor; and a read circuitry to sense discrete levels of charges on the capacitor, wherein the discrete levels of charges are a function of remnant polarization states on the capacitor caused by the write circuitry.

18. The apparatus of claim 17, wherein the write circuitry is to:

apply a first voltage at a first time on the plate-line, wherein application of the first voltage results in a first remnant polarization state in the capacitor;

apply a second voltage at a second time on the plate-line, wherein the second voltage is higher than the first voltage, wherein application of the second voltage results in a second remnant polarization state in the capacitor;

apply a third voltage at a third time on the plate-line, wherein the third voltage is lower than the first voltage, wherein application of the third voltage results in a third remnant polarization state in the capacitor, wherein the third remnant polarization state is a negative version of the first remnant polarization state; and apply a fourth voltage at a fourth time on the plate-line, wherein the fourth voltage is lower than the third voltage, wherein the fourth voltage results in a fourth remnant polarization state in the capacitor, and wherein application of the fourth remnant polarization state is a negative version of the second remnant polarization state.

19. The apparatus of claim 18, wherein the read circuitry is to:

apply a voltage on the plate-line which is a largest or smallest voltage from among the first voltage, second voltage, third voltage, or the fourth voltage; and sense a charge on the bit-line coupled to the capacitor, wherein the charge is a difference between a current remnant polarization state in the capacitor and a prior remnant polarization state in the capacitor, wherein the current remnant polarization state is associated with the applied voltage, and wherein the prior remnant polarization state is a previously written polarization state in the capacitor.

20. A system comprising:

a processor circuitry to execute one or more instructions;

a memory coupled to the processor circuitry, wherein the memory is to store the one or more instructions;

memory control circuitry coupled to the memory; and a communication interface to allow the processor circuitry to communicate with another device, wherein the memory includes:

a node;

a capacitor comprising non-linear polar material, the capacitor having a first terminal coupled to the node and a second terminal coupled to a plate-line, wherein the capacitor is a planar capacitor or a non-planar capacitor; and a transistor coupled to the node and a bit-line, wherein the transistor is controllable by a word-line, wherein the memory control circuitry comprises:

a write circuitry to apply the plate-line with different voltages at different times to create partially polarized states in the non-linear polar material of the capacitor; and a read circuitry to sense discrete levels of charges on the capacitor, wherein the discrete levels of charges are a function of remnant polarization states on the capacitor caused by the write circuitry.

* * * * *